(12) United States Patent
Yamazaki et al.

(10) Patent No.: US 9,935,202 B2
(45) Date of Patent: Apr. 3, 2018

(54) TRANSISTOR AND DISPLAY DEVICE COMPRISING OXIDE SEMICONDUCTOR LAYER

(75) Inventors: Shunpei Yamazaki, Setagaya (JP); Masayuki Sakakura, Tochigi (JP); Ryosuke Watanabe, Ebina (JP); Junichiro Sakata, Atsugi (JP); Kengo Akimoto, Atsugi (JP); Akiharu Miyanaga, Hadano (JP); Takuya Hirohashi, Atsugi (JP); Hideyuki Kishida, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 710 days.

(21) Appl. No.: 13/528,009

(22) Filed: Jun. 20, 2012

(65) Prior Publication Data

US 2012/0256179 A1     Oct. 11, 2012

Related U.S. Application Data

(62) Division of application No. 12/880,343, filed on Sep. 13, 2010, now abandoned.

(30) Foreign Application Priority Data

Sep. 16, 2009   (JP) .................. 2009-215084

(51) Int. Cl.
*H01L 29/10* (2006.01)
*H01L 29/786* (2006.01)
(Continued)

(52) U.S. Cl.
CPC ...... *H01L 29/7869* (2013.01); *H01L 27/1225* (2013.01); *H01L 29/04* (2013.01);
(Continued)

(58) Field of Classification Search
CPC ... H01L 27/1225; H01L 29/04; H01L 29/045; H01L 29/7869; H01L 29/78693; H01L 29/78696
(Continued)

(56) References Cited

U.S. PATENT DOCUMENTS 4,390,890 A   6/1983   Bergeron et al.
5,731,856 A   3/1998   Kim et al.
(Continued)

FOREIGN PATENT DOCUMENTS

CN   001806322 A   7/2006
CN   001941299 A   4/2007
(Continued)

OTHER PUBLICATIONS

Yoshino et al., "Effects of interface micro structure in crystallization of ZnO thin films prepared by radio frequency sputtering", Vacuum 51 (1998) pp. 601-607.*
(Continued)

*Primary Examiner* — Jay C Kim
(74) *Attorney, Agent, or Firm* — Robinson Intellectual Property Law Office; Eric J. Robinson

(57) ABSTRACT

To provide a transistor having a favorable electric characteristics and high reliability and a display device including the transistor. The transistor is a bottom-gate transistor formed using an oxide semiconductor for a channel region. An oxide semiconductor layer subjected to dehydration or dehydrogenation through heat treatment is used as an active layer. The active layer includes a first region of a superficial portion microcrystallized and a second region of the rest portion. By using the oxide semiconductor layer having such a structure, a change to an n-type, which is attributed to entry of moisture to the superficial portion or elimination of oxygen from the superficial portion, and generation of a
(Continued)

parasitic channel can be suppressed. In addition, contact resistance between the oxide semiconductor layer and source and drain electrodes can be reduced.

29 Claims, 39 Drawing Sheets

(51) Int. Cl.
H01L 27/12 (2006.01)
H01L 29/04 (2006.01)

(52) U.S. Cl.
CPC ...... *H01L 29/045* (2013.01); *H01L 29/78618* (2013.01); *H01L 29/78693* (2013.01); *H01L 29/78696* (2013.01)

(58) Field of Classification Search
USPC .......................................... 257/43, E29.273
See application file for complete search history.

(56) References Cited

U.S. PATENT DOCUMENTS

| | | | |
|---|---|---|---|
| 5,744,864 | A | 4/1998 | Cillessen et al. |
| 6,198,113 | B1 | 3/2001 | Grupp |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,838,308 | B2 | 1/2005 | Haga |
| 6,914,643 | B1 | 7/2005 | Nagase et al. |
| 7,049,190 | B2 | 5/2006 | Takeda et al. |
| 7,061,014 | B2 * | 6/2006 | Hosono ................ C30B 23/02 257/15 |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,298,084 | B2 | 11/2007 | Baude et al. |
| 7,323,356 | B2 | 1/2008 | Hosono et al. |
| 7,339,187 | B2 * | 3/2008 | Wager et al. ................ 257/43 |
| 7,342,617 | B2 | 3/2008 | Tanaka et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,511,343 | B2 | 3/2009 | Li et al. |
| 7,598,520 | B2 | 10/2009 | Hirao et al. |
| 7,601,984 | B2 | 10/2009 | Sano et al. |
| 7,674,650 | B2 | 3/2010 | Akimoto et al. |
| 7,719,185 | B2 | 5/2010 | Jin et al. |
| 7,732,819 | B2 | 6/2010 | Akimoto et al. |
| 7,741,643 | B2 | 6/2010 | Miyazaki et al. |
| 7,745,798 | B2 | 6/2010 | Takahashi |
| 7,767,505 | B2 | 8/2010 | Son et al. |
| 7,838,328 | B2 | 11/2010 | Isa |
| 7,893,495 | B2 | 2/2011 | Li et al. |
| 7,910,490 | B2 | 3/2011 | Akimoto et al. |
| 7,932,521 | B2 | 4/2011 | Akimoto et al. |
| 7,935,964 | B2 | 5/2011 | Kim et al. |
| 7,977,169 | B2 | 7/2011 | Hirao et al. |
| 7,993,964 | B2 | 8/2011 | Hirao et al. |
| 7,994,500 | B2 | 8/2011 | Kim et al. |
| 7,998,372 | B2 | 8/2011 | Yano et al. |
| 8,013,331 | B2 | 9/2011 | Wakita |
| 8,058,645 | B2 | 11/2011 | Jeong et al. |
| 8,093,589 | B2 | 1/2012 | Sugihara et al. |
| 8,148,779 | B2 | 4/2012 | Jeong et al. |
| 8,168,544 | B2 | 5/2012 | Chang |
| 8,188,480 | B2 | 5/2012 | Itai |
| 8,193,045 | B2 | 6/2012 | Omura et al. |
| 8,202,365 | B2 | 6/2012 | Umeda et al. |
| 8,203,143 | B2 | 6/2012 | Imai |
| 8,207,756 | B2 | 6/2012 | Shionoiri et al. |
| 8,236,635 | B2 | 8/2012 | Suzawa et al. |
| 8,242,494 | B2 | 8/2012 | Suzawa et al. |
| 8,274,077 | B2 | 9/2012 | Akimoto et al. |
| 8,274,078 | B2 | 9/2012 | Itagaki et al. |
| 8,304,765 | B2 | 11/2012 | Yamazaki et al. |
| 8,309,961 | B2 | 11/2012 | Yamazaki et al. |
| 8,319,215 | B2 | 11/2012 | Yamazaki et al. |
| 8,343,799 | B2 | 1/2013 | Ito et al. |
| 8,466,463 | B2 | 6/2013 | Akimoto et al. |
| 8,502,217 | B2 | 8/2013 | Sato et al. |
| 8,629,069 | B2 | 1/2014 | Akimoto et al. |
| 8,669,550 | B2 | 3/2014 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0023432 | A1 * | 2/2004 | Haga ............................ 438/104 |
| 2004/0038446 | A1 | 2/2004 | Takeda et al. |
| 2004/0051109 | A1 | 3/2004 | Ishizaki et al. |
| 2004/0127038 | A1 | 7/2004 | Garcia et al. |
| 2005/0002590 | A1 | 1/2005 | Kawamura |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 * | 11/2006 | Sugihara et al. ............ 257/646 |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0057261 | A1 | 3/2007 | Jeong et al. |
| 2007/0072439 | A1 * | 3/2007 | Akimoto et al. ............ 438/795 |
| 2007/0090365 | A1 | 4/2007 | Hayashi et al. |
| 2007/0108446 | A1 | 5/2007 | Akimoto |
| 2007/0115219 | A1 | 5/2007 | Inoue |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287221 | A1 * | 12/2007 | Ong ................ H01L 21/02554 438/104 |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0099803 | A1 | 5/2008 | Li et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |

(56) References Cited

U.S. PATENT DOCUMENTS

| | | |
|---|---|---|
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2009/0002590 A1 | 1/2009 | Kimura |
| 2009/0008638 A1 | 1/2009 | Kang et al. |
| 2009/0068773 A1 | 3/2009 | Lai et al. |
| 2009/0072232 A1 | 3/2009 | Hayashi et al. |
| 2009/0073325 A1 | 3/2009 | Kuwabara et al. |
| 2009/0114910 A1 | 5/2009 | Chang |
| 2009/0127552 A1 | 5/2009 | Li et al. |
| 2009/0134399 A1 | 5/2009 | Sakakura et al. |
| 2009/0140438 A1 | 6/2009 | Yamazaki et al. |
| 2009/0152506 A1* | 6/2009 | Umeda .................. C30B 1/02 252/500 |
| 2009/0152541 A1 | 6/2009 | Maekawa et al. |
| 2009/0179199 A1 | 7/2009 | Sano et al. |
| 2009/0189155 A1 | 7/2009 | Akimoto |
| 2009/0189156 A1 | 7/2009 | Akimoto |
| 2009/0237000 A1 | 9/2009 | Inoue |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0305461 A1 | 12/2009 | Akimoto et al. |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0084648 A1 | 4/2010 | Watanabe |
| 2010/0084650 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0105163 A1 | 4/2010 | Ito et al. |
| 2010/0109002 A1 | 5/2010 | Itagaki et al. |
| 2010/0117075 A1 | 5/2010 | Akimoto et al. |
| 2010/0117999 A1 | 5/2010 | Matsunaga et al. |
| 2010/0123130 A1 | 5/2010 | Akimoto et al. |
| 2010/0123136 A1 | 5/2010 | Lee |
| 2010/0136743 A1 | 6/2010 | Akimoto et al. |
| 2010/0155717 A1 | 6/2010 | Yano et al. |
| 2010/0163860 A1 | 7/2010 | Yano et al. |
| 2010/0193782 A1 | 8/2010 | Sakata |
| 2010/0295042 A1 | 11/2010 | Yano et al. |
| 2010/0301329 A1 | 12/2010 | Asano et al. |
| 2010/0320458 A1 | 12/2010 | Umeda et al. |
| 2010/0320459 A1 | 12/2010 | Umeda et al. |
| 2011/0031497 A1 | 2/2011 | Yamazaki et al. |
| 2011/0032444 A1 | 2/2011 | Yamazaki et al. |
| 2011/0050733 A1 | 3/2011 | Yano et al. |
| 2011/0062433 A1 | 3/2011 | Yamazaki |
| 2011/0062436 A1 | 3/2011 | Yamazaki et al. |
| 2011/0068335 A1 | 3/2011 | Yamazaki et al. |
| 2011/0104851 A1 | 5/2011 | Akimoto et al. |
| 2011/0117697 A1 | 5/2011 | Akimoto et al. |
| 2011/0117698 A1 | 5/2011 | Suzawa et al. |
| 2011/0121290 A1 | 5/2011 | Akimoto et al. |
| 2011/0175090 A1 | 7/2011 | Sugihara et al. |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |
| 2012/0132908 A1 | 5/2012 | Sugihara et al. |
| 2013/0277672 A1 | 10/2013 | Sano et al. |

FOREIGN PATENT DOCUMENTS

| | | |
|---|---|---|
| CN | 101162737 A | 4/2008 |
| CN | 101310371 A | 11/2008 |
| CN | 101478005 A | 7/2009 |
| EP | 1313134 A | 5/2003 |
| EP | 1349217 A | 10/2003 |
| EP | 1 737 044 A | 12/2006 |
| EP | 1770788 A | 4/2007 |
| EP | 1921681 A | 5/2008 |
| EP | 1995787 A | 11/2008 |
| EP | 1998373 A | 12/2008 |
| EP | 1998374 A | 12/2008 |
| EP | 1998375 A | 12/2008 |
| EP | 2068367 A | 6/2009 |
| EP | 2 226 847 A | 9/2010 |
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-035019 A | 2/1992 |
| JP | 05-251705 | 9/1993 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 | 5/2000 |
| JP | 2002-076356 A | 3/2002 |
| JP | 2002-170993 A | 6/2002 |
| JP | 2002-289859 A | 10/2002 |
| JP | 2003-029293 | 1/2003 |
| JP | 2003-037268 A | 2/2003 |
| JP | 2003-041362 | 2/2003 |
| JP | 2003-086000 A | 3/2003 |
| JP | 2003-086808 | 3/2003 |
| JP | 2004-103957 | 4/2004 |
| JP | 2004-273614 A | 9/2004 |
| JP | 2004-273732 A | 9/2004 |
| JP | 2006-165529 A | 6/2006 |
| JP | 2007-081362 | 3/2007 |
| JP | 2007-096055 | 4/2007 |
| JP | 2007-121788 A | 5/2007 |
| JP | 2007-123861 | 5/2007 |
| JP | 2007-142195 A | 6/2007 |
| JP | 2007-163467 | 6/2007 |
| JP | 2007-171932 | 7/2007 |
| JP | 2007-220820 | 8/2007 |
| JP | 2007-220820 A | 8/2007 |
| JP | 2007-529117 | 10/2007 |
| JP | 2008-098447 A | 4/2008 |
| JP | 2008-098637 A | 4/2008 |
| JP | 2008-533693 | 8/2008 |
| JP | 2008-270723 A | 11/2008 |
| JP | 2008-277665 A | 11/2008 |
| JP | 2008-281988 A | 11/2008 |
| JP | 2009-010362 A | 1/2009 |
| JP | 2009-016844 A | 1/2009 |
| JP | 2009-021480 A | 1/2009 |
| JP | 2009-076877 A | 4/2009 |
| JP | 2009-099847 A | 5/2009 |
| JP | 2009-141002 A | 6/2009 |
| JP | 2009-158940 A | 7/2009 |
| JP | 2009-167087 A | 7/2009 |
| JP | 2009-187029 A | 8/2009 |
| JP | 2009-188213 A | 8/2009 |
| JP | 2009-528670 | 8/2009 |
| JP | 2009-231613 | 10/2009 |
| JP | 2009-265271 | 11/2009 |
| JP | 2010-016347 | 1/2010 |
| JP | 4415062 | 2/2010 |
| JP | 2010-067954 | 3/2010 |
| JP | 2010-098280 | 4/2010 |
| JP | 2010-177431 | 8/2010 |
| JP | 4571221 | 10/2010 |
| JP | 2012-160679 | 8/2012 |
| KR | 2007-0110320 A | 11/2007 |
| KR | 2008-0033127 A | 4/2008 |

(56) References Cited

FOREIGN PATENT DOCUMENTS

| | | |
|---|---|---|
| KR | 2008-0066678 A | 7/2008 |
| KR | 2009-0057690 A | 6/2009 |
| TW | 505946 | 10/2002 |
| TW | 200802889 | 1/2008 |
| WO | WO 2004/114391 | 12/2004 |
| WO | WO-2005/093847 | 10/2005 |
| WO | WO-2006/051993 | 5/2006 |
| WO | WO 2007/058231 | 5/2007 |
| WO | WO-2007/094501 | 8/2007 |
| WO | WO 2007/108293 | 9/2007 |
| WO | WO-2007/142167 | 12/2007 |
| WO | WO-2007/148601 | 12/2007 |
| WO | WO-2008/096768 | 8/2008 |
| WO | WO 2008/117810 | 10/2008 |
| WO | WO 2008/126879 | 10/2008 |
| WO | WO 2008/126884 | 10/2008 |
| WO | WO2008/133345 | 11/2008 |
| WO | WO-2008/149873 | 12/2008 |
| WO | WO-2009/034953 | 3/2009 |
| WO | WO2009/034953 | 3/2009 |
| WO | WO-2009/072532 | 6/2009 |
| WO | WO-2009/093625 | 7/2009 |

OTHER PUBLICATIONS

Kim et al., "Effect of indium composition ratio on solution-processed nanocrystalline InGaZnO thin film transistors", Applied Physics Letters 94 (2009) 233501.*

Kim et al., "High-Performance Solution-Processed Amorphous Zinc-Indium-Tin Oxide Thin-Film Transistors", Journal of American Chemical Society 132 (2010) pp. 10352-10364.*

Nomura et al., "Thin-Film Transistor Fabricated in Single-Crystalline Transparent Oxide Semiconductor", Science 300 (2003) pp. 1269-1272.*

Inoue et al., "The properties of transparent conductive In—Ga—Zn oxide films produced by pulsed laser deposition", Vacuum 83 (2009) pp. 552-556.*

Kim et al., Formation Mechanism of Solution-Processed Nanocrystalline InGaZnO Thin Film as Active Channel Layer in Thin-Film Transistor 156 (2009) pp. H7-H9.*

Kim et al., Effect of indium composition ratio on solution-processed nanocrystalline InGaZnO thin film transistors 94 (2009) 233501.*

Nomura et al., "Growth mechanism for single-crystalline thin film of InGaO3(ZnO)5 by reactive solid-phase epitaxy", Journal of Applied Physics 95 (2004) pp. 5532-5539.*

Oh et al., "Effects of the channel thickness on the structural and electrical characteristics of room-temperature fabricated ZnO thin-film transistors", Semiconductor Science and Technology 22 (2007) pp. 608-612.*

Sahu et al., "Enhanced conductivity of pulsed laser deposited n-InGaZn6O9 films and its rectifying characteristics with p-SiC", Thin Solid Films 517 (2009) pp. 1829-1832.*

Kim et al. (Growth of Transparent nc-InGaO3(ZnO)2 Thin Films with Indium mol Ratios Using Solution Process), Journal of the Electrochemical Society 155 (2008) H848-H851.*

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C" Journal of Solid State Chemistry, 1985, vol. 60, pp. 382-384.

Kimizuka et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$—$ZnGa_2O_4$—ZnO System," Journal of Solid State Chemistry, Apr. 1, 1995, vol. 116, No. 1, pp. 170-178.

Nakamura et al., "The Phase Relations in the $In_2O$—$Ga_2ZnO_4$—ZnO System at 1350° C," Journal of Solid State Chemistry, Aug. 1, 1991, vol. 93, No. 2, pp. 298-315.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Lee et al., "Current Status of, Challenges to, and Perspective View of AM-OLED," IDW '06: Proceedings of the 13th International Display Workshops, Dec. 7, 2006, pp. 663-666.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Tsuda et al., "Ultra Low Power Consumption Technologies for Mobile TFT-LCDs," IDW '02: Proceedings of the 9th International Display Workshops, Dec. 4, 2002, pp. 295-298.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Ikeda et al., "Full-Functional System Liquid Crystal Display Using CG-Silicon Technology," SID Digest '04: SID International Symposium Digest of Technical Papers, 2004, vol. 35, pp. 860-863.

Kurokawa et al., "UHF RFCPUS on Flexible and Glass Substrates for Secure RFID Systems," Journal of Solid-State Circuits, 2008, vol. 43, No. 1, pp. 292-299.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hirao et al., "Novel Top-Gate Zinc Oxide Thin-Film Transistors (ZnO TFTs) for AMLCDs," Journal of the SID, 2007, vol. 15, No. 1, pp. 17-22.

Lee et al., "World's Largest (15-inch) XGA AMLCD Panel using IGZO oxide TFT," SID Digest '08: SID International Symposium Digest of Technical Papers, May 20, 2008, vol. 39, pp. 625-628.

Park et al., "Challenge to Future Displays: Transparent AM-OLED Driven by PEALD Grown ZnO TFT," IMID '07 Digest, 2007, pp. 1249-1252.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Coates et al., "Optical Studies of the Amorphous Liquid-Cholesteric Liquid-Cholesteric Liquid Crystal Transition: The "Blue Phase"," Physics Letters, Sep. 10, 1973, vol. 45A, No. 2, pp. 115-116.

(56) References Cited

OTHER PUBLICATIONS

Meiboom et al., "Theory of the Blue Phase of Cholesteric Liquid Crystals," Phys. Rev. Lett. (Physical Review Letters), May 4, 1981, vol. 46, No. 18, pp. 1216-1219.
Costello et al., "Electron Microscopy of a Cholesteric Liquid Crystal and Its Blue Phase," Phys. Rev. A (Physical Review. A), May 1, 1984, vol. 29, No. 5, pp. 2957-2959.
Kitzerow et al., "Observation of Blue Phases in Chiral Networks," Liquid Crystals, 1993, vol. 14, No. 3, pp. 911-916.
Kikuchi et al., "Polymer-Stabilized Liquid Crystal Blue Phases," Nature Materials, Sep. 2, 2002, vol. 1, pp. 64-68.
Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.
Park et al., "High performance amorphous oxide thin film transistors with self-aligned top-gate structure," IEDM 09: Technical Digest of International Electron Devices Meeting, Dec. 7, 2009, pp. 191-194.
Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Miyasaka, "58.2: Invited Paper: Suftla Flexible Microelectronics on their Way to Business," SID Digest '07: SID International Symposium Digest of Technical Papers, 2007, vol. 38, pp. 1673-1676.
Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.
Prins et al., "A Ferroelectric Transparent Thin-Film Transistor," Appl. Phys. Lett. (Applied Physics Letters), Jun. 17, 1996, vol. 68, No. 25, pp. 3650-3652.
Takahashi et al., "Theoretical Analysis of IGZO Transparent Amorphous Oxide Semiconductor," IDW '08: Proceedigs of the 15$^{th}$ International Display Workshops, Dec. 3, 2008, pp. 1637-1640.
Osada et al., "15.2: Development of Driver-Integrated Panel using Amorphous In—Ga—Zn-Oxide TFT," SID Digest '09: SID International Symposium Digest of Technical Papers, May 31, 2009, pp. 184-187.
Ohara et al., "21.3: 4.0 In. QVGA AMOLED Display Using In—Ga—Zn-Oxide TFTs with a Novel Passivation Layer," SID Digest '09: SID International Symposium Digest of Technical Papers, May 31, 2009, pp. 284-287.
Godo et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.
Osada et al., "Development of Driver-Integrated Panel using Amorphous In—Ga—Zn-Oxide TFT," AM-FPD '09 Digest of Technical Papers, Jul. 1, 2009, pp. 33-36.
Godo et al., "Temperature Dependence of Characteristics and Electronic Structure for Amorphous In—Ga—Zn-Oxide TFT," AM-FPD '09 Digest of Technical Papers, Jul. 1, 2009, pp. 41-44.
Ohara et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Sakata et al., "Development of 4.0-In. AMOLED Display with Driver Circuit Using Amorphous In—Ga—Zn-Oxide TFTS," IDW '09: Proceedings of the 16$^{th}$ International Display Workshops, 2009, pp. 689-692.
Invitation to pay additional fees (Application Serial No. PCT/JP2010/064973), International Searching Authority, dated Oct. 5, 2010.
Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.
Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Asakuma et al., "Cyrstallization and Reduction of Sol-Gel-Derived Zinc Oxide Films by Irradiation with Ultraviolet Lamp," Journal of Sol-Gel Science and Technology, 2003, vol. 26, pp. 181-184.
Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.
Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.
Van de Walle, "Hydrogen as a Cause of Doping i Zinc Oxide," Phys. Rev. Lett. (Physical Review Letters), Jul. 31, 2000, vol. 85, No. 5, pp. 1012-1015.
Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Nakamura, "Synthesis of Homologous Compound with New Long-Period Structure," Nirim Newsletter, Mar. 1, 1995, vol. 150, pp. 1-4.
Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.
Orita et al., "Mechanism of Electrical Conductivity of Transparent $InGaZnO_4$," Phys. Rev. B (Physical Review B), Jan. 15, 2000, vol. 61, No. 3, pp. 1811-1816.
Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.
Janotti et al., "Native Point Defects in ZnO," Phys. Rev. B (Physical Review. B), Oct. 4, 2007, vol. 76, No. 16, pp. 165202-1-165202-22.
Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.
Hsieh et al., "P-29: Modeling of Amorphous Oxide Semiconductor Thin Film Transistors and Subgap Denisty of States," SID Digest '08: SID International Symposium Digest of Technical Papers, 2008, vol. 39, pp. 1277-1280.
Janotti et al., "Oxygen Vacancies in ZnO," Appl. Phys. Lett. (Applied Physics Letters), 2005, vol. 87, pp. 122102-1-122102-3.
Oba et al., "Defect energetics in ZnO: A hybrid Hartree-Fock density functional study," Phys. Rev. B (Physical Review B), 2008, vol. 77, pp. 245202-1-245202-6.
Orita et al., "Amorphous transparent conductive oxide $InGaO_3(ZnO)_m$ (M<4): a Zn 4s conductor," Philosophical Magazine, 2001, vol. 81, No. 5, pp. 501-515.
Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Mo et al., "Amorphous Oxide TFT Backplanes for Large Size AMOLED Displays," IDW '08: Proceedings of the 6$^{th}$ International Display Workshops, Dec. 3, 2008, pp. 581-584.

(56) References Cited

OTHER PUBLICATIONS

Kim et al., "High-Performance oxide thin film transistors passivated by various gas plasmas," 214th ECS Meeting, 2008, No. 2317.
Clark et al., "First Principles Methods Using CASTEP," Zeitschrift fur Kristallographie, 2005, vol. 220, pp. 567-570.
Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.
Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.
Korean Office Action (Application No. 2012-7017293) dated Oct. 14, 2013.
Chinese Office Action (Application No. 201080041232.1) dated Mar. 27, 2014.
European Search Report (Application No. 10817049.9) dated Mar. 28, 2014.
European Search Report (Application No. 12181246.5) dated Apr. 28, 2015.
Chinese Office Action (Application No. 201080041232.1) dated May 12, 2015.
Chinese Office Action (Application No. 201610041989.X) dated Mar. 13, 2017.
Korean Office Action (Application No. 2012-7009412) dated Apr. 14, 2017.
Chinese Office Action (Application No. 201610041989.X) dated Oct. 17, 2016.
Taiwanese Office Action (Application No. 105103565) dated Dec. 13, 2016.
Chinese Office Action (Application No. 201610041758.9) dated Dec. 14, 2016.

* cited by examiner

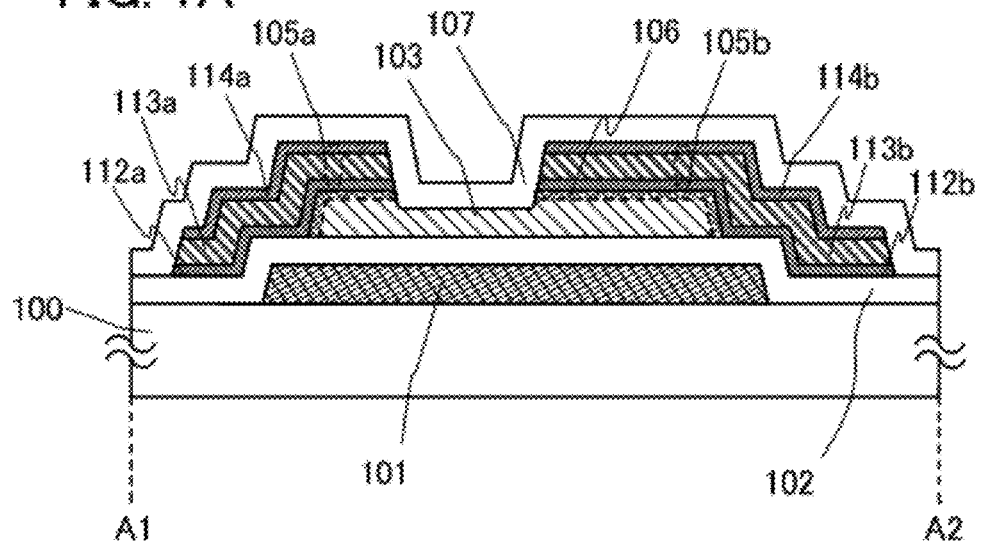
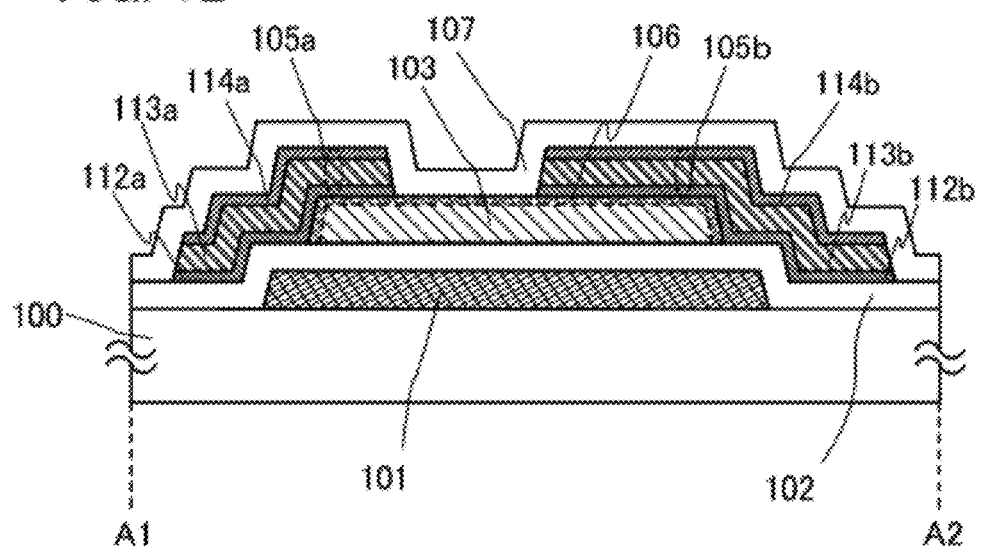

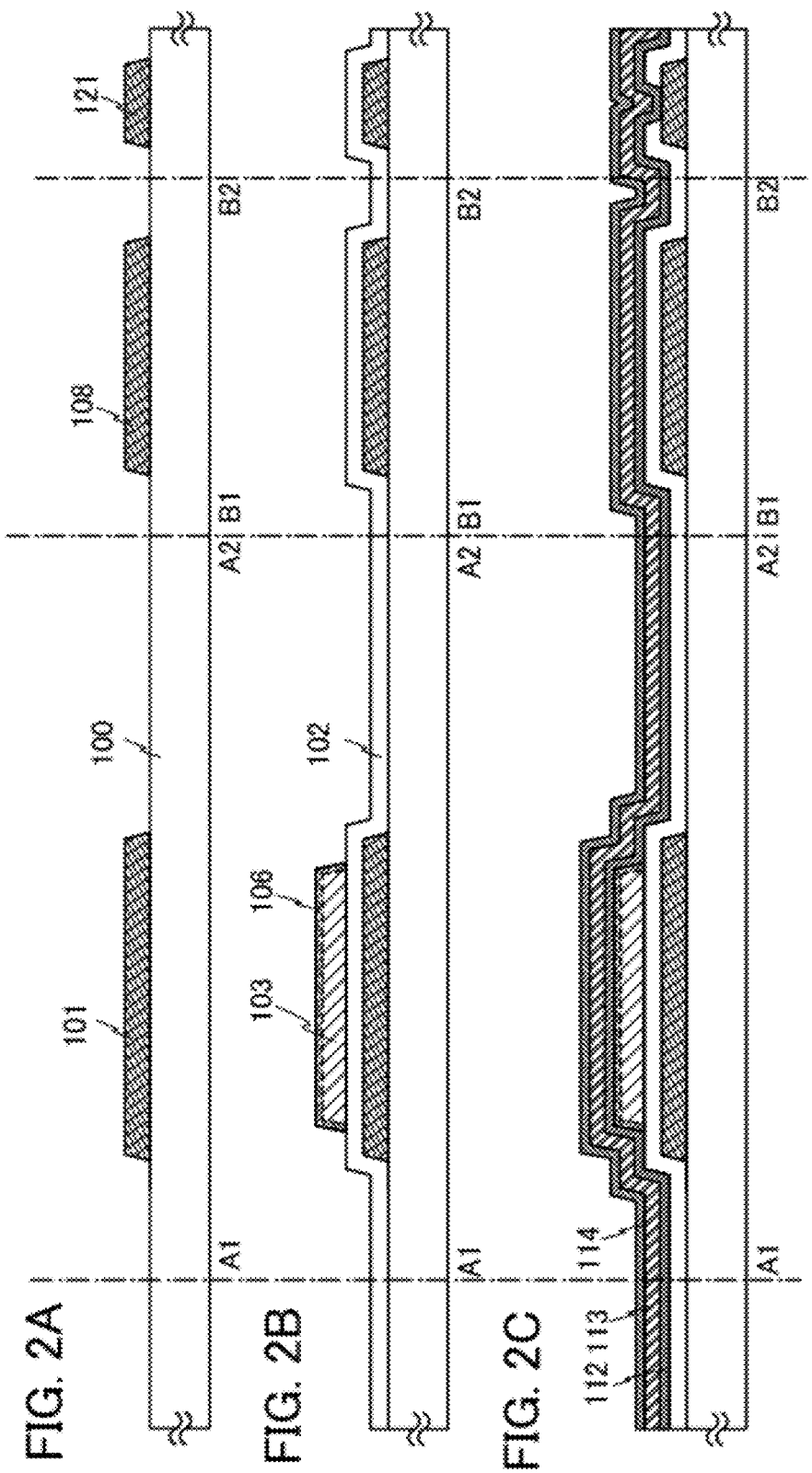

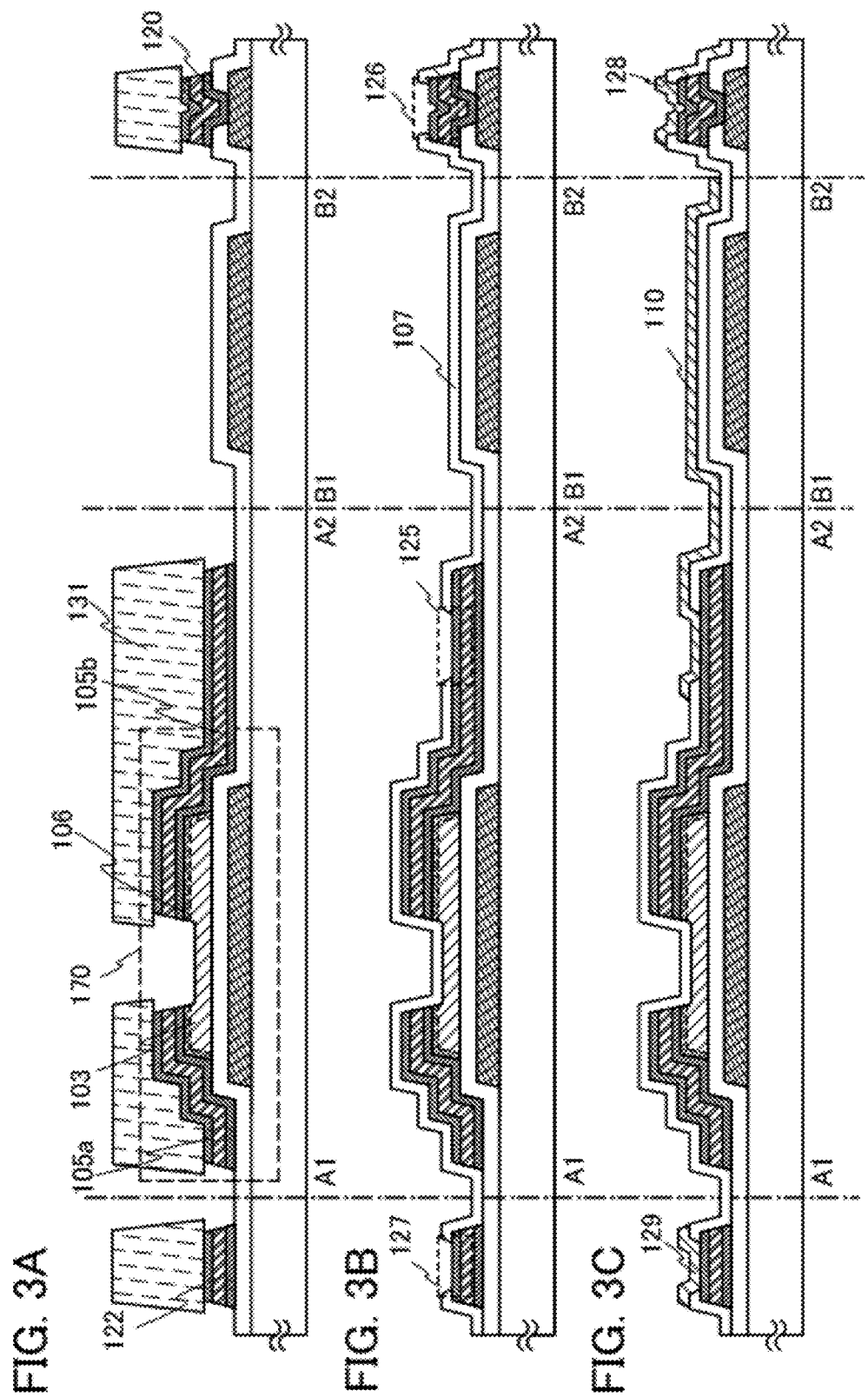

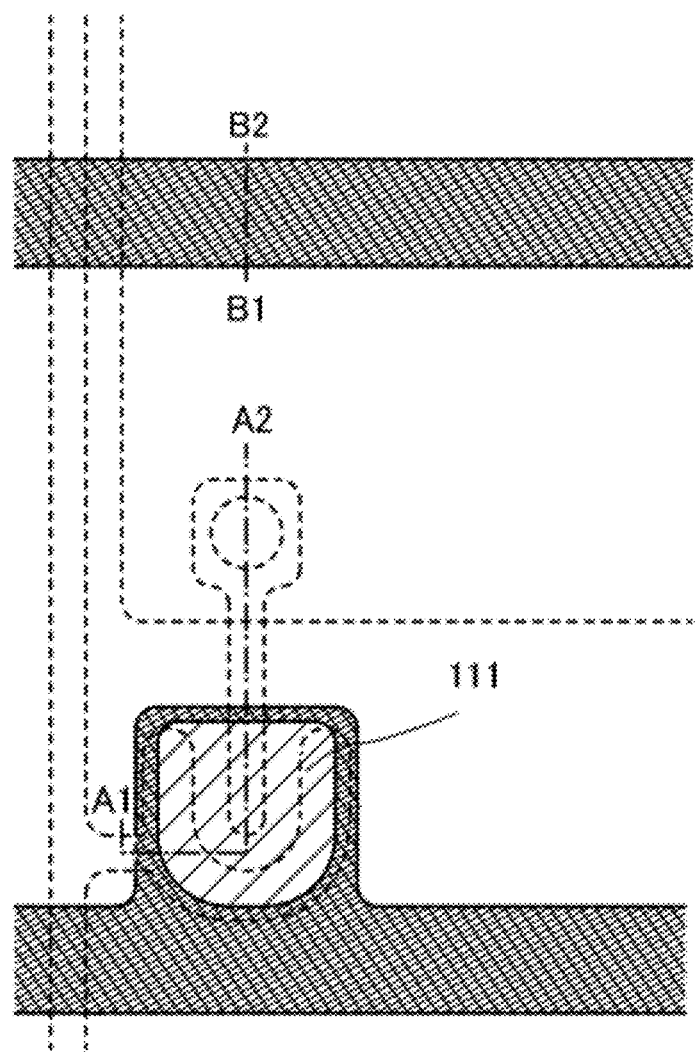

FIG. 8A1
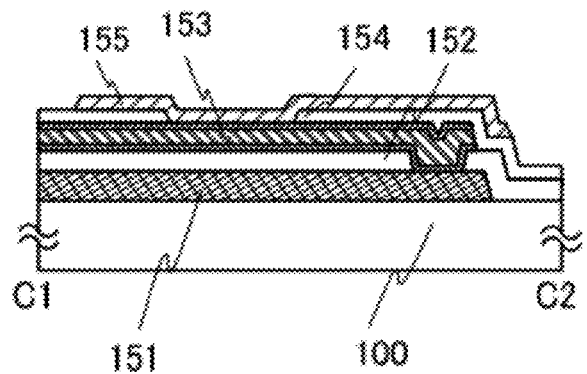
FIG. 8A2
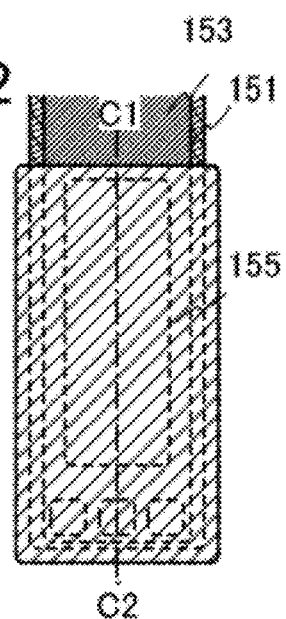
FIG. 8B1
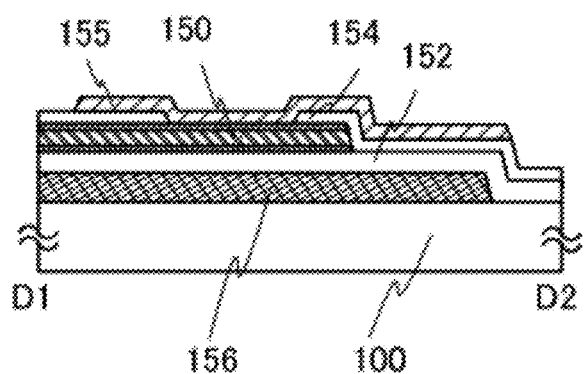
FIG. 8B2
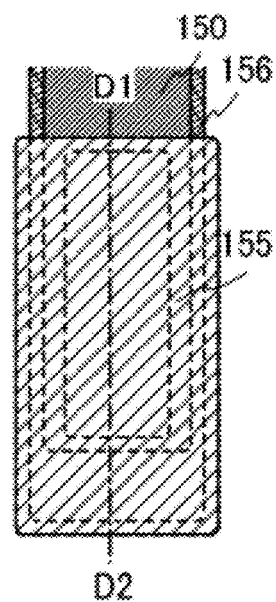

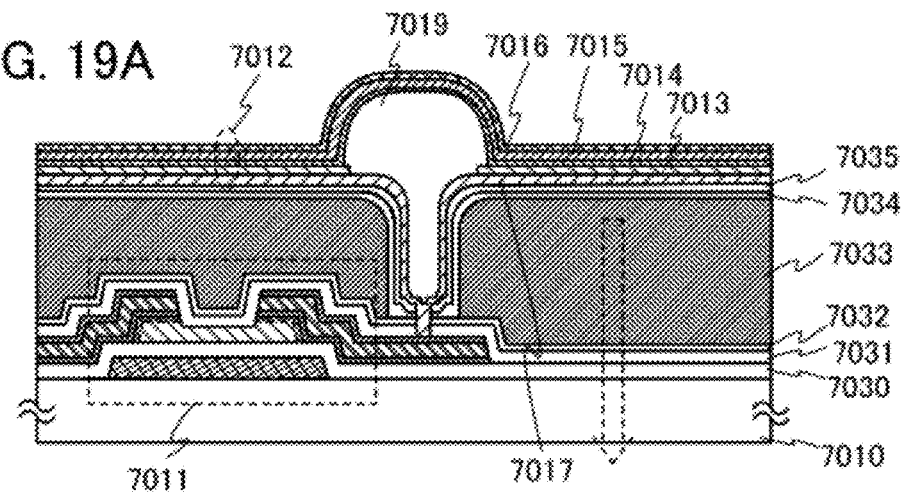
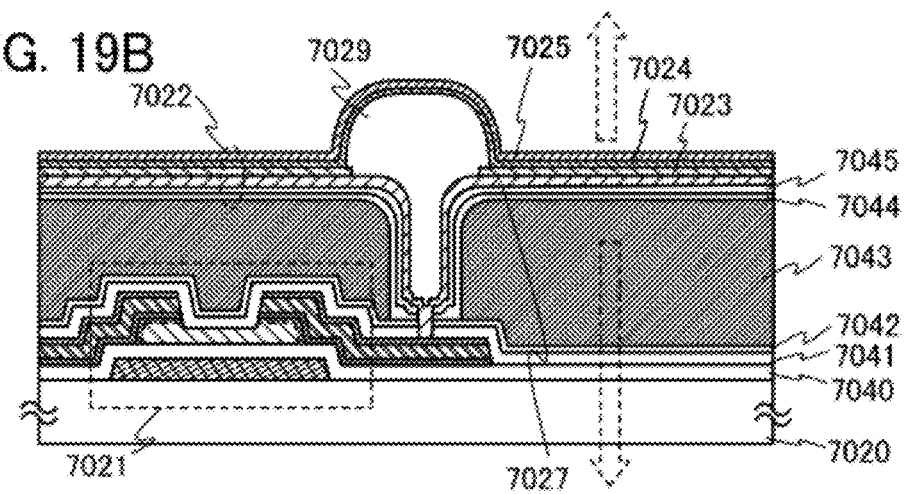
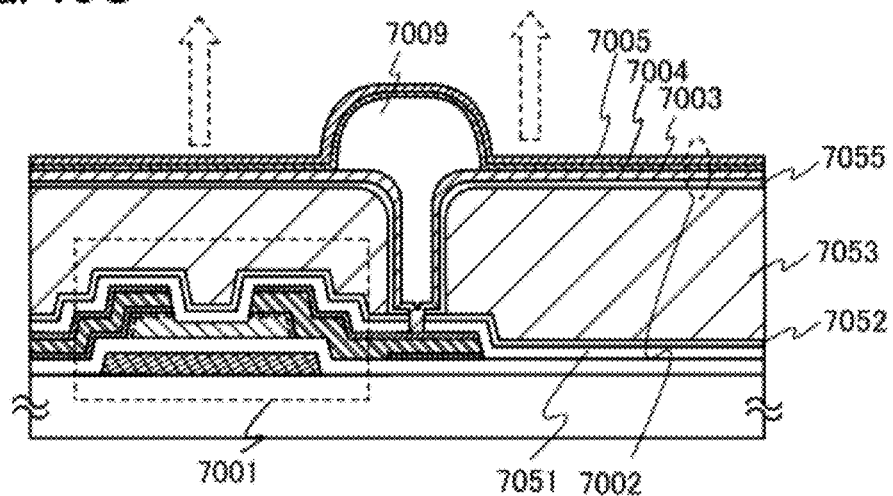

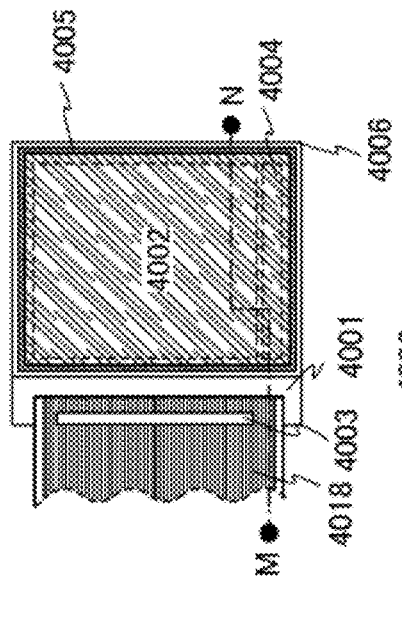
FIG. 20A1
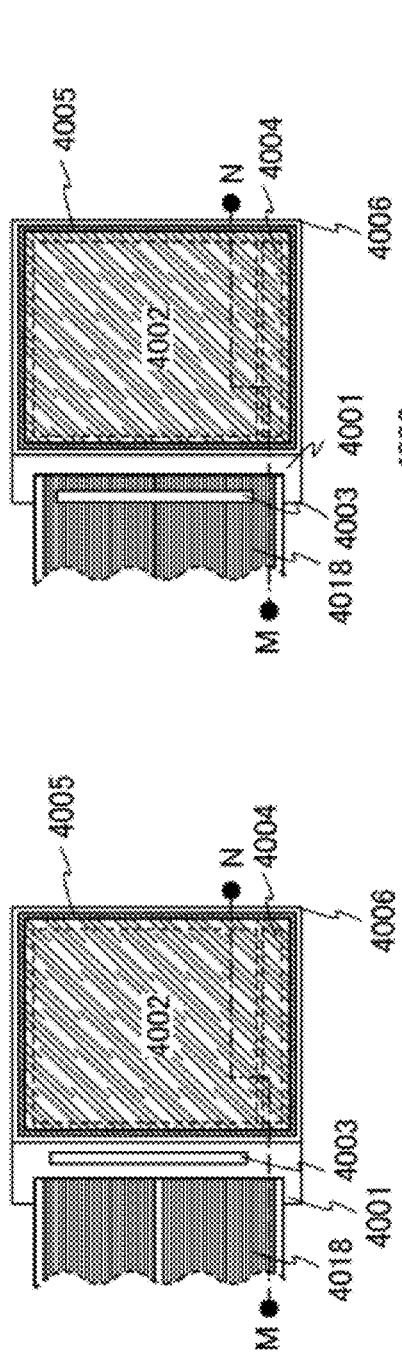
FIG. 20A2
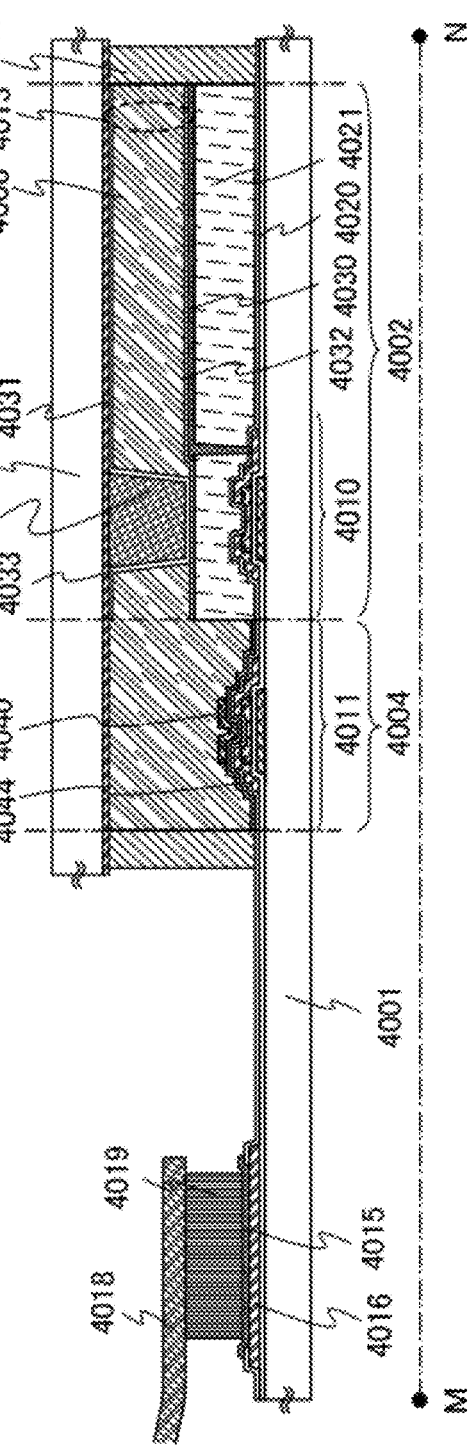
FIG. 20B

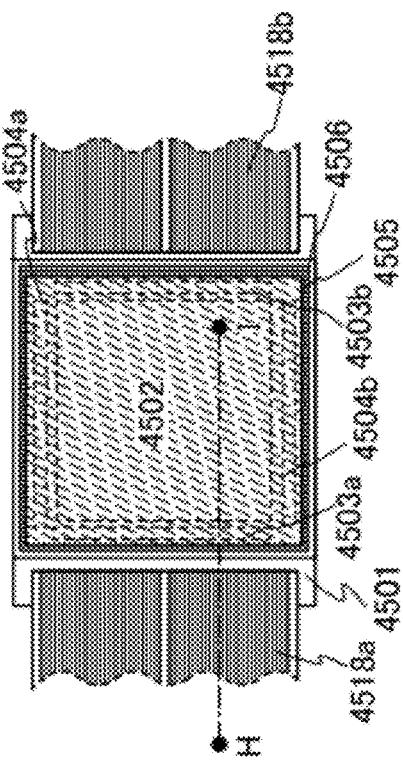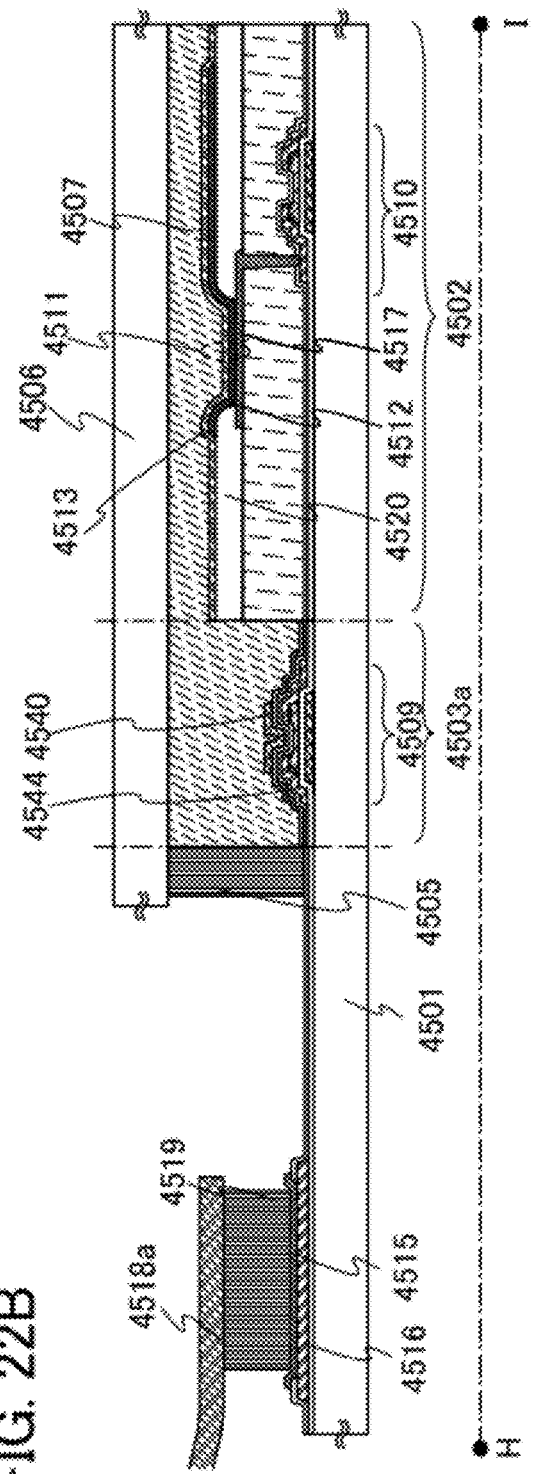
FIG. 22A
FIG. 22B

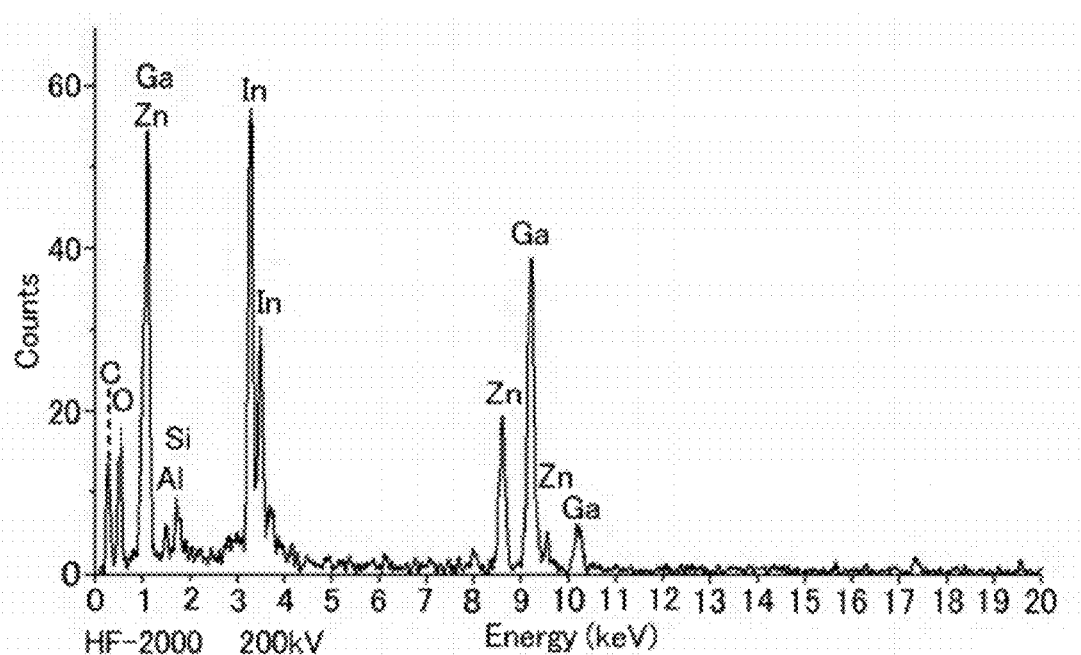

Crystal structure of In$_2$Ga$_2$ZnO$_7$

TRANSISTOR AND DISPLAY DEVICE COMPRISING OXIDE SEMICONDUCTOR LAYER

TECHNICAL FIELD

The present invention relates to a transistor formed using an oxide semiconductor and a display device including the transistor.

BACKGROUND ART

In recent years, techniques to form transistors using a semiconductor thin film (with a thickness of approximately several nanometers to several hundreds of nanometers) which is formed over a substrate having an insulating surface have attracted attention. Transistors are widely applied to electronic devices such as ICs and electro-optic devices and are particularly expected to be rapidly developed as switching elements of image display devices. Various metal oxides are used for a variety of applications. Indium oxide is a well-known material and is used as a light-transmitting electrode material which is necessary for liquid crystal displays and the like.

Some metal oxides have semiconductor characteristics. Examples of such metal oxides having semiconductor characteristics include tungsten oxide, tin oxide, indium oxide, and zinc oxide. Transistors in each of which a channel formation region is formed using such metal oxide having semiconductor characteristics have been known (Patent Documents 1 and 2).

Transistors to which oxide semiconductors are applied have relatively high field effect mobility among amorphous transistors. Therefore, driver circuits of display devices and the like can also be formed using the transistors.

REFERENCE

[Patent Document 1] Japanese Published Patent Application No. 2007-123861
[Patent Document 2] Japanese Published Patent Application No. 2007-096055

DISCLOSURE OF INVENTION

In the case of forming a pixel portion (also referred to as a pixel circuit) and a driver circuit portion over one substrate in a display device or the like, excellent switching characteristics such as a high on-off ratio are needed for a transistor used for the pixel portion, while high operation speed is needed for a transistor used for the driver circuit.

In particular, a transistor used for the driver circuit preferably operates at high speed, since writing time of a display image is reduced as the pixel density of a display device is increased.

An embodiment of the present invention, which is disclosed in this specification, relates to a transistor and a display device that achieve the above object.

An embodiment of the present invention, which is disclosed in this specification, is a transistor in which an oxide semiconductor layer that forms a channel region is amorphous or is formed of a mixture of amorphousness and microcrystals, where an amorphous region is dotted with microcrystals, or is formed of a microcrystal group, except a superficial portion including a crystal region formed of a microcrystalline layer. Further, an embodiment of the present invention, which is disclosed in this specification, is a display device obtained by forming over one substrate a driver circuit portion and a pixel portion that are constituted by such transistors.

An embodiment of the present invention, which is disclosed in this specification, is a transistor including a gate electrode layer, a gate insulating layer over the gate electrode layer, an oxide semiconductor layer over the gate insulating layer, a source electrode layer and a drain electrode layer over the gate insulating layer, which overlap with part of the oxide semiconductor layer, and an oxide insulating layer in contact with the oxide semiconductor layer. The oxide semiconductor layer includes a first region of a superficial portion and a second region of the rest portion.

Note that the ordinal numbers such as "first" and "second" in this specification are used for convenience and do not denote the order of steps and the stacking order of layers. In addition, the ordinal numbers in this specification do not denote particular names which specify the present invention.

An embodiment of the present invention, which is disclosed in this specification, is a transistor including a gate electrode layer, a gate insulating layer over the gate electrode layer, a source electrode layer and a drain electrode layer over the gate insulating layer, an oxide semiconductor layer over the gate insulating layer, which overlaps with part of the source electrode layer and the drain electrode layer, and an oxide insulating layer in contact with the oxide semiconductor layer. The oxide semiconductor layer includes a first region of a superficial portion and a second region of the rest portion.

The first region of the oxide semiconductor layer is formed of microcrystals c-axis-oriented in a direction perpendicular to a surface of the layer.

The second region of the oxide semiconductor layer is amorphous or is formed of a mixture of amorphousness and microcrystals, where an amorphous region is dotted with microcrystals, or is formed of microcrystals.

As the oxide semiconductor layer, the one on which dehydration or dehydrogenation is performed with an RTA method or the like at high temperature for a short time is used. Through this heating step, the superficial portion of the oxide semiconductor layer comes to include a crystal region formed of microcrystals and the rest portion comes to be amorphous or be formed of a mixture of amorphousness and microcrystals, where an amorphous region is dotted with microcrystals, or be formed of a microcrystal group.

By using the oxide semiconductor layer having such a structure, degradation of electric characteristics due to a change to an n-type, which is attributed to entry of moisture to the superficial portion or elimination of oxygen from the superficial portion, can be prevented. Further, since the superficial portion of the oxide semiconductor layer is on the back channel side and has a crystal region including microcrystals, generation of a parasitic channel can be suppressed. Furthermore, in a channel-etched structure, contact resistance between the superficial portion where conductance is increased owing to the existence of the crystal region and source and drain electrodes can be reduced.

Further, by forming a driver circuit portion and a pixel portion over one substrate with the use of transistors according to an embodiment of the present invention and using a liquid crystal element, a light-emitting element, or an electrophoretic element, or the like, a display device can be manufactured.

An embodiment of the present invention, which is disclosed in this specification, is a display device including a pixel portion and a driver circuit portion that include transistors, over one substrate. The transistors each include a gate electrode layer, a gate insulating layer over the gate electrode layer, an oxide semiconductor layer over the gate insulating layer, a source electrode layer and a drain electrode layer over the gate insulating layer, which overlap with part of the oxide semiconductor layer, and an oxide insulating layer in contact with the oxide semiconductor layer. The oxide semiconductor layer includes a first region of a superficial portion and a second region of the rest portion.

An embodiment of the present invention, which is disclosed in this specification, is a display device including a pixel portion and a driver circuit portion that include transistors, over one substrate. The transistors each include a gate electrode layer, a gate insulating layer over the gate electrode layer, a source electrode layer and a drain electrode layer over the gate insulating layer, an oxide semiconductor layer over the gate insulating layer, which overlaps with part of the source electrode layer and the drain electrode layer, and an oxide insulating layer in contact with the oxide semiconductor layer. The oxide semiconductor layer includes a first region of a superficial portion and a second region of the rest portion.

The first region of the oxide semiconductor layer is formed of microcrystals c-axis-oriented in a direction perpendicular to a surface of the layer. The second region is amorphous or is formed of a mixture of amorphousness and microcrystals, where an amorphous region is dotted with microcrystals, or is formed of microcrystals.

In a transistor including an oxide semiconductor layer, a superficial portion of the oxide semiconductor layer includes a crystal region and the rest portion is amorphous or is formed of a mixture of amorphousness and microcrystals, or is formed of microcrystals, whereby the transistor can have favorable electric characteristics and high reliability and a display device having favorable electric characteristics and high reliability can be manufactured.

BRIEF DESCRIPTION OF DRAWINGS

FIGS. 1A and 1B are cross-sectional views each illustrating a transistor.
FIGS. 2A to 2C are cross-sectional process views of a transistor.
FIGS. 3A to 3C are cross-sectional process views of a transistor.
FIG. 5 is a plan view illustrating a transistor.
FIGS. 8A1, 8A2, 8B1, and 8B2 are plan views and cross-sectional views illustrating gate wiring terminal portions.
FIGS. 19A to 19C are cross-sectional views each illustrating a display device.
FIGS. 20A1, 20A2, 20B are plan views and a cross-sectional view illustrating display devices.
FIGS. 22A and 22B are a plan view and a cross-sectional view illustrating a display device, respectively.
FIG. 30 is an EDX analysis spectrum of an oxide semiconductor layer.

BEST MODE FOR CARRYING OUT THE INVENTION

Figure 4A:
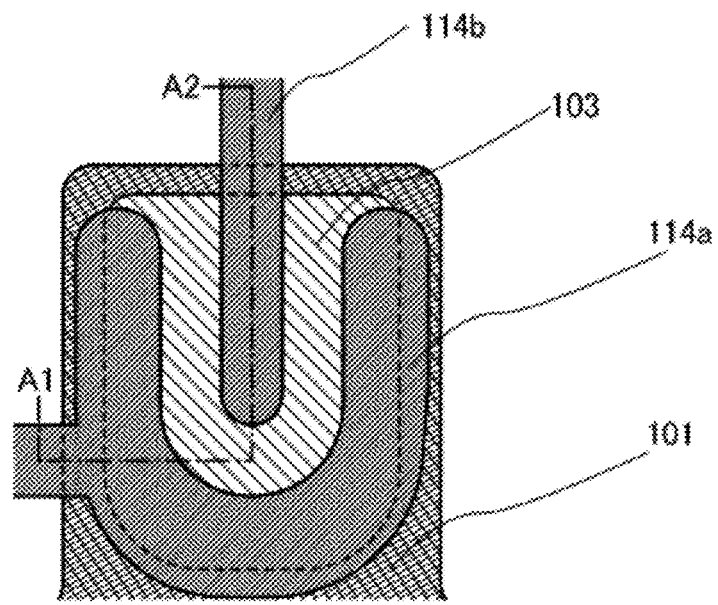
FIGS. 4A and 4B are plan views illustrating a transistor.

Embodiments and examples will be described with reference to drawings. Note that the present invention is not limited to the following description, and it will be easily understood by those skilled in the art that the modes and details of the present invention can be modified in various ways without departing from the spirit and scope of the present invention. Therefore, the present invention should not be construed as being limited to the following description of the embodiments and examples. Note that in structures of the present invention described below, the same portions or portions having similar functions are denoted by the same reference numerals in different drawings, and description thereof is omitted.

Embodiment 1

In this embodiment, structures of transistors will be described with reference to FIGS. 1A and 1B.

FIG. 1A is a cross-sectional view of a channel-etched transistor and FIG. 4A is a plan view thereof. FIG. 1A is a cross-sectional view taken along line A1-A2 of FIG. 4A.

The transistors illustrated in FIGS. 1A and 1B each includes, over a substrate 100, a gate electrode layer 101, a gate insulating layer 102, an oxide semiconductor layer 103 including a crystal region 106 in a superficial portion, a source electrode layer 105a, and a drain electrode layer 105b. An oxide insulating layer 107 is provided over the oxide semiconductor layer 103 including the crystal region 106 in a superficial portion, the source electrode layer 105a, and the drain electrode layer 105b.

Note that FIG. 1A illustrates a structure of a normal channel-etched transistor, in which part of the oxide semiconductor layer is etched between the source electrode layer 105a and the drain electrode layer 105b; however, a structure in which the oxide semiconductor layer is not etched so that the crystal region in the superficial portion is left as illustrated in FIG. 1B may alternatively be employed.

The gate electrode layer 101 can be formed with a single-layer structure or a layered structure using any of metal materials such as aluminum, copper, molybdenum, titanium, chromium, tantalum, tungsten, neodymium, and scandium; an alloy material containing any of these metal materials as its main component; or a nitride containing any of these metal materials. In the case where a low-resistance metal material such as aluminum or copper is used for an electrode layer, the low-resistance metal material is preferably used in combination with a refractory metal material because it has disadvantages such as low heat resistance and a tendency to be corroded. As the refractory metal material, molybdenum, titanium, chromium, tantalum, tungsten, neodymium, scandium, or the like can be used.

Further, in order to increase the aperture ratio of a pixel portion, a light-transmitting oxide conductive layer of indium oxide, an alloy of indium oxide and tin oxide, an alloy of indium oxide and zinc oxide, zinc oxide, zinc aluminum oxide, zinc aluminum oxynitride, zinc gallium oxide, or the like may be used as the gate electrode layer 101.

As the gate insulating layer 102, a single-layer film or a laminate film of any of silicon oxide, silicon oxynitride, silicon nitride oxide, silicon nitride, aluminum oxide, tantalum oxide, and the like can be used. Such a film can be formed with a CVD method, a sputtering method, or the like.

As an oxide semiconductor film, a thin film expressed by $InMO_3(ZnO)_m$ (m>0) can be used. Here, M represents one or more metal elements selected from Ga, Al, Mn, and Co. For example, M may be Ga, Ga and Al, Ga and Mn, Ga and Co, or the like. Among the oxide semiconductor films expressed by $InMO_3 (ZnO)_m$ (m>0), an oxide semiconductor which includes Ga as M is referred to as an In—Ga—Zn—O-based oxide semiconductor, and a thin film of the In—Ga—Zn—O-based oxide semiconductor is also referred to as an In—Ga—Zn—O-based film.

The oxide semiconductor layer 103 is formed with a sputtering method to a thickness of from 10 nm to 300 nm, preferably from 20 nm to 100 nm. It is to be noted that in the case where part of the oxide semiconductor layer 103 is etched as illustrated in FIG. 1A, the oxide semiconductor layer 103 has a region whose thickness is smaller than the above thickness when a device is completed.

As the oxide semiconductor layer 103, the one on which dehydration or dehydrogenation is performed with an RTA method or the like at high temperature for a short time is used. Dehydration or dehydrogenation can be performed through rapid thermal anneal (RTA) treatment with a high-temperature gas (an inert gas such as nitrogen or a rare gas) or light at from 500° C. to 750° C. (or a temperature lower than or equal to the strain point of a glass substrate) for approximately one minute to ten minutes, preferably at 650° C. for approximately three minutes to six minutes. With an RTA method, dehydration or dehydrogenation can be performed in a short time; therefore, treatment can be performed even at a temperature higher than the strain point of a glass substrate.

The oxide semiconductor layer 103 is an amorphous layer having many dangling bonds at the stage where the oxide semiconductor layer 103 is formed. Through a heating step for the dehydration or dehydrogenation, dangling bonds within a short distance are bonded to each other, so that the oxide semiconductor layer 103 can have an ordered amorphous structure. As ordering proceeds, the oxide semiconductor layer 103 comes to be formed of a mixture of amorphousness and microcrystals, where an amorphous region is dotted with microcrystals, or be formed of a microcrystal group. Here, a microcrystal is a so-called nanocrystal with a particle size of from 1 nm to 20 nm, which is smaller than that of a microcrystalline particle generally called a microcrystal.

In the superficial portion of the oxide semiconductor layer 103, which is the crystal region 106, a microcrystalline layer in which microcrystals are c-axis-oriented in a direction perpendicular to a surface of the layer is preferably formed. In that case, the long axis of the crystal is in the c-axis direction and the crystal in the short-axis direction is from 1 nm to 20 nm.

In the superficial portion of the oxide semiconductor layer, which has such a structure, a dense crystal region including microcrystals exists, and thus, degradation of electric characteristics due to a change to an n-type, which is attributed to entry of moisture to the superficial portion or elimination of oxygen from the superficial portion, can be prevented. Further, since the superficial portion of the oxide semiconductor layer is on the back channel side, preventing the oxide semiconductor layer from being changed to an n-type is also effective for suppression of generation of a parasitic channel. Furthermore, contact resistance between the superficial portion where conductance is increased owing to the existence of the crystal region and the source electrode layer 105a or the drain electrode layer 105b can be reduced.

Here, a crystal structure of an In—Ga—Zn—O-based film, which is likely to grow, depends on a target used for deposition of an oxide semiconductor. For example, in the case where an In—Ga—Zn—O-based film is formed using a target for deposition of an oxide semiconductor, which contains In, Ga, and Zn so that the ratio of $In_2O_3$ to $Ga_2O_3$ to ZnO is 1:1:1 in molar ratio, and crystallization is performed through a heating step, a hexagonal system layered compound crystal structure in which one oxide layer or two oxide layers containing Ga and Zn are mixed between In oxide layers is likely to be formed. Alternatively, in the case where a target whose molar ratio of $In_2O_3$ to $Ga_2O_3$ to ZnO is 1:1:2 is used, and crystallization is performed through a heating step, an oxide layer containing Ga and Zn interposed between In oxide layers is likely to have a two-layer structure. Since the crystal structure of the oxide layer containing Ga and Zn of the latter having a two-layer structure is stable and thus crystal growth is likely to occur, in the case where a target whose molar ratio of $In_2O_3$ to $Ga_2O_3$ to ZnO is 1:1:2 is used, and crystallization is performed through a heating step, a crystal continuous from an outer layer of the oxide layer containing Ga and Zn to an interface between a gate insulating film and the oxide layer containing Ga and Zn is formed in some cases. Note that the molar ratio may be referred to as the ratio of atoms.

Figure 10A:
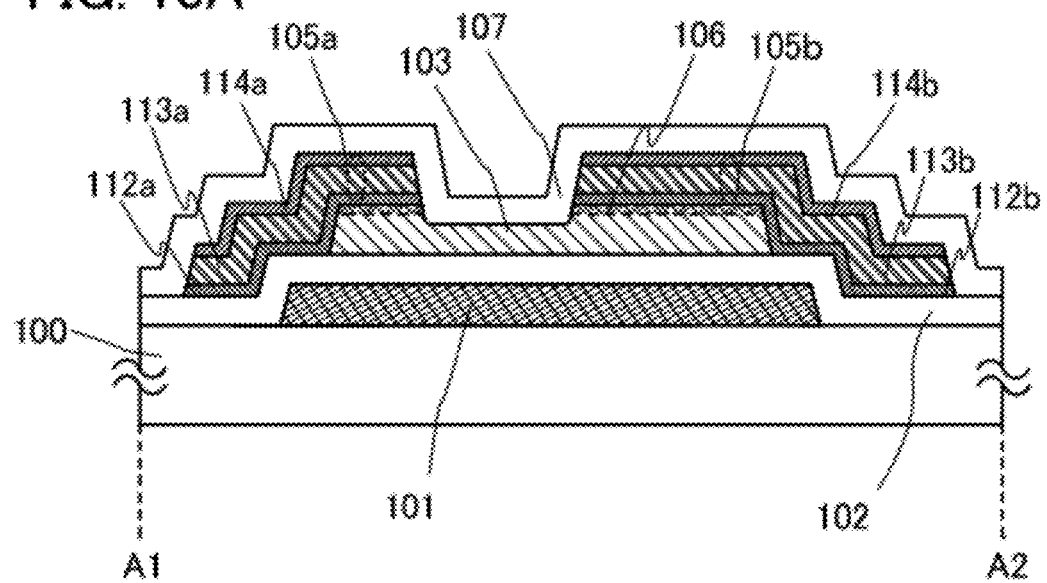
FIGS. 10A and 10B are cross-sectional views each illustrating a transistor.

Note that as illustrated in FIG. 10A, a crystal region is not formed in a side surface portion of the oxide semiconductor layer 103 depending on the order of steps and the crystal region 106 is formed only in an upper layer portion. It is to be noted that the area rate of the side surface portion is low and thus, the above effect can also be kept in that case.

The source electrode layer 105a has a three-layer structure of a first conductive layer 112a, a second conductive layer 113a, and a third conductive layer 114a, while the drain electrode layer 105b has a three-layer structure of a first conductive layer 112b, a second conductive layer 113b, and a third conductive layer 114b. As a material of the source and drain electrode layers 105a and 105b, a material similar to that of the gate electrode layer 101 can be used.

Further, the light-transmitting oxide conductive layer is used for the source and drain electrode layers 105a and 105b in a manner similar to that of the gate electrode layer 101, whereby light transmissivity of the pixel portion can be increased and the aperture ratio can also be increased.

Further, the oxide conductive layer may be formed between the oxide semiconductor layer 103 and the above metal film to be the source and drain electrode layers 105a and 105b so that contact resistance can be reduced.

An oxide insulating layer 107 functioning as a channel protective layer is provided over the oxide semiconductor layer 103, the source electrode layer 105a, and the drain electrode layer 105b. The oxide insulating layer is formed with a sputtering method using an inorganic insulating film, typically, a silicon oxide film, a silicon nitride oxide film, an aluminum oxide film, an aluminum oxynitride film, or the like.

Figure 10B:
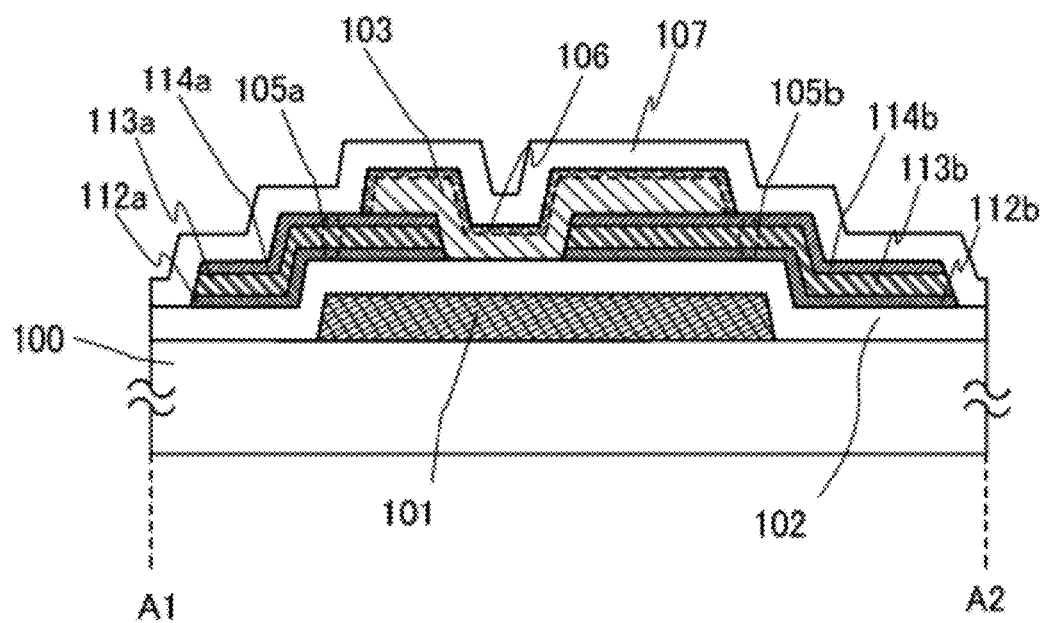

Alternatively, a bottom contact-type transistor illustrated in FIG. 10B may be formed using a similar material for each portion.

The transistor illustrated in FIG. 10B includes, over the substrate 100, the gate electrode layer 101, the gate insulating layer 102, the source electrode layer 105a, the drain electrode layer 105b, and the oxide semiconductor layer 103 including the crystal region 106 in a superficial portion. Further, the oxide insulating layer 107 is provided over the gate insulating layer 102, the source electrode layer 105a, the drain electrode layer 105b, and the oxide semiconductor layer 103.

Also in this structure, the oxide semiconductor layer 103 is amorphous or is formed of a mixture of amorphousness and microcrystals, where an amorphous region is dotted with microcrystals, or is formed of a microcrystal group, except the superficial portion including the crystal region 106 formed of a microcrystalline layer. When the oxide semiconductor layer having such a structure is used, degradation of electric characteristics due to a change to an n-type, which is attributed to entry of moisture to the superficial portion or elimination of oxygen from the superficial portion, can be prevented in a manner similar to that of the channel-etched structure. Further, since the superficial portion of the oxide semiconductor layer is on the back channel side and includes the crystal region formed of the microcrystalline layer, generation of a parasitic channel can be suppressed.

With such a structure, the transistor can have high reliability and high electric characteristics.

Note that although an example of a channel-etched transistor is given in this embodiment, a channel protective transistor may be used. Alternatively, a bottom contact-type transistor including an oxide semiconductor layer overlapping with a source electrode layer and a drain electrode layer may be used.

Note that the structure described in this embodiment can be used in combination with any of the structures described in the other embodiments, as appropriate.

Embodiment 2

In this embodiment, a manufacturing process of a display device including the channel-etched transistor described in Embodiment 1 will be described with reference to FIGS. 2A to 2C, FIGS. 3A to 3C, FIGS. 4A and 4B, FIG. 5, FIG. 6, FIG. 7, FIGS. 8A1, 8A2, 8B1, and 8B2, and FIG. 9. FIGS. 2A to 2C and FIGS. 3A to 3C are cross-sectional views, and FIGS. 4A and 4B, FIG. 5, FIG. 6, and FIG. 7 are plan views, and line A1-A2 and line B1-B2 in FIGS. 4A and 4B, FIG. 5, FIG. 6, and FIG. 7 correspond to line A1-A2 and line B1-B2 in the cross-sectional views of FIGS. 2A to 2C and FIGS. 3A to 3C, respectively.

First, the substrate 100 is prepared. As the substrate 100, any of the following substrates can be used: non-alkaline glass substrates made of barium borosilicate glass, aluminoborosilicate glass, aluminosilicate glass, and the like with a fusion method or a float method; ceramic substrates; plastic substrates having heat resistance enough to withstand a process temperature of this manufacturing process; and the like. Alternatively, a metal substrate such as a stainless steel alloy substrate having a surface provided with an insulating film may be used.

Note that instead of the glass substrate described above, a substrate formed using an insulator, such as a ceramic substrate, a quartz substrate, or a sapphire substrate, may be used as the substrate 100.

Further, as a base film, an insulating film may be formed over the substrate 100. The base film can be formed with a single-layer structure or a layered structure using any of a silicon oxide film, a silicon nitride film, a silicon oxynitride film, and a silicon nitride oxide film with a CVD method, a sputtering method, or the like. In the case where a substrate containing mobile ions, such as a glass substrate, is used as the substrate 100, a film containing nitrogen, such as a silicon nitride film or a silicon nitride oxide film, is used as the base film, whereby the mobile ions can be prevented from entering the semiconductor layer.

Figure 4B:
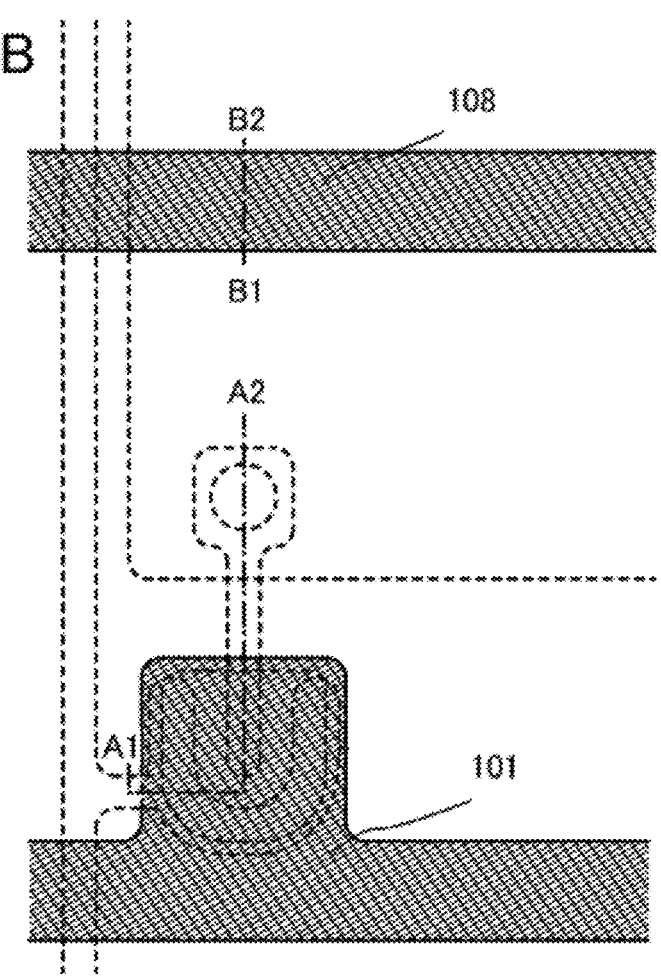

Next, a conductive film to be a gate wiring including the gate electrode layer 101, a capacitor wiring 108, and a first terminal 121 is formed over an entire surface of the substrate 100 with a sputtering method or a vacuum evaporation method. Next, through a first photolithography process, a resist mask is formed. An unnecessary portion is removed by etching to form wirings and an electrode (the gate wiring including the electrode layer 101, the capacitor wiring 108, and the first terminal 121). At this time, etching is preferably performed so that an end portion of the gate electrode layer 101 is tapered, in order to prevent breakage of a film formed over the gate electrode layer 101. A cross-sectional view at this stage is illustrated in FIG. 2A. Note that FIG. 4B is a plan view at this stage.

The gate wiring including the gate electrode layer 101, the capacitor wiring 108, and the first terminal 121 in a terminal portion can be formed with a single-layer structure or a layered structure using any of metal materials such as aluminum, copper, molybdenum, titanium, chromium, tantalum, tungsten, neodymium, and scandium; an alloy material containing any of these metal materials as its main component; or a nitride containing any of these metal materials. In the case where a low-resistance metal material such as aluminum or copper is used for an electrode layer, the low-resistance metal material is preferably used in combination with a refractory metal material because it has disadvantages such as low heat resistance or a tendency to be corroded. As the refractory metal material, molybdenum, titanium, chromium, tantalum, tungsten, neodymium, scandium, or the like can be used.

For example, as a two-layer structure of the gate electrode layer 101, the following structures are preferable: a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, and a two-layer structure of a titanium nitride layer and a molybdenum layer. As a three-layer structure, the following structure is preferable: a layered structure including aluminum, an alloy of aluminum and silicon, an alloy of aluminum and titanium, or an alloy of aluminum and neodymium in a middle layer and any of tungsten, tungsten nitride, titanium nitride, and titanium in a top layer and a bottom layer.

At that time, a light-transmitting oxide conductive layer is used for part of the electrode layer and the wiring layer to increase the aperture ratio. For example, indium oxide, an alloy of indium oxide and tin oxide, an alloy of indium oxide and zinc oxide, zinc oxide, zinc aluminum oxide, zinc aluminum oxynitride, zinc gallium oxide, or the like can be used for the oxide conductive layer.

Next, the gate insulating layer 102 is formed over the gate electrode layer 101. The gate insulating layer 102 is formed to a thickness of from 50 nm to 250 nm with a CVD method, a sputtering method, or the like.

For example, for the gate insulating layer 102, a silicon oxide film with a thickness of 100 nm is formed with a sputtering method. Needless to say, the gate insulating layer 102 is not limited to such a silicon oxide film and may be formed with a single-layer structure or a layered structure using any of insulating films such as a silicon oxynitride film, a silicon nitride oxide film, a silicon nitride film, an aluminum oxide film, and a tantalum oxide film.

Alternatively, the gate insulating layer 102 may be formed using a silicon oxide layer with a CVD method with an organosilane gas. For the organosilane gas, a compound containing silicon, such as tetraethoxysilane (TEOS), tetramethylsilane (TMS), tetramethylcyclotetrasiloxane (TMCTS), octamethylcyclotetrasiloxane (OMCTS), hexamethyldisilazane (HMDS), triethoxysilane (TRIES), or tris(dimethylamino)silane (TDMAS), can be used.

Alternatively, the gate insulating layer 102 may be formed using oxide, nitride, oxynitride, and nitride oxide of aluminum, yttrium, or hafnium; or a compound including at least two or more kinds of the above.

Note that in this specification, the term "oxynitride" refers to a substance that contains oxygen atoms and nitrogen atoms so that the number of the oxygen atoms is larger than that of the nitrogen atoms and the term "nitride oxide" refers to a substance that contains nitrogen atoms and oxygen atoms so that the number of the nitrogen atoms is larger than that of the oxygen atoms. For example, a "silicon oxynitride film" means a film that contains oxygen atoms and nitrogen atoms so that the number of the oxygen atoms is larger than that of the nitrogen atoms and, in the case where measurements are performed using Rutherford backscattering spectrometry (RBS) and hydrogen forward scattering (HFS), contains oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively. Further, a "silicon nitride oxide film" means a film that contains nitrogen atoms and oxygen atoms so that the number of the nitrogen atoms is larger than that of the oxygen atoms and, in the case where measurements are performed using RBS and HFS, contains oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Note that before an oxide semiconductor film for forming the oxide semiconductor layer 103 is formed, dust on a surface of the gate insulating layer is preferably removed by performing reverse sputtering in which an argon gas is introduced and plasma is generated. The reverse sputtering refers to a method in which, an RF power source is used for application of voltage to a substrate side in an argon atmosphere so that plasma is generated around the substrate to modify a surface. Note that instead of an argon atmosphere, a nitrogen atmosphere, a helium atmosphere, or the like may be used. Alternatively, an argon atmosphere to which oxygen, $N_2O$, or the like is added may be used. Still alternatively, an argon atmosphere to which $Cl_2$, $CF_4$, or the like is added may be used. After the reverse sputtering, the oxide semiconductor film is formed without exposure to the air, whereby adhesion of dust and moisture to an interface between the gate insulating layer 102 and the oxide semiconductor layer 103 can be prevented.

Next, an oxide semiconductor film is formed over the gate insulating layer 102 to a thickness of from 5 nm to 200 nm, preferably from 10 nm to 40 nm.

As the oxide semiconductor film, a four-component metal oxide film such as an In—Sn—Ga—Zn—O-based film; a three-component metal oxide film such as an In—Ga—Zn—O-based film, an In—Sn—Zn—O-based film, an In—Al—Zn—O-based film, a Sn—Ga—Zn—O-based film, an Al—Ga—Zn—O-based film, or a Sn—Al—Zn—O-based film; or a two-component metal oxide film such as an In—Zn—O-based film, a Sn—Zn—O-based film, an Al—Zn—O-based film, a Zn—Mg—O-based film, a Sn—Mg—O-based film, or an In—Mg—O-based film; an In—O-based film, a Sn—O-based film, or a Zn—O-based film can be used. Further, the oxide semiconductor film may further contain $SiO_2$.

Here, the oxide semiconductor film is formed using a target for deposition of an oxide semiconductor, which contains In, Ga, and Zn (the ratio of $In_2O_3$ to $Ga_2O_3$ to ZnO is 1:1:1 or 1:1:2 in molar ratio) under conditions where the distance between the substrate and the target is 100 mm, the pressure is 0.6 Pa, and the direct current (DC) power is 0.5 kW, and the atmosphere is an oxygen atmosphere (the proportion of the oxygen flow is 100%). Note that when a pulse direct current (DC) power source is used, dust can be reduced and the film thickness is likely to be uniform. In this embodiment, as the oxide semiconductor film, a 30-nmthick In—Ga—Zn—O-based film is formed with a sputtering method with the use of a target for deposition of an In—Ga—Zn—O-based oxide semiconductor.

Examples of a sputtering method include an RF sputtering method in which a high-frequency power source is used as a sputtering power source, a DC sputtering method in which DC power source is used, and a pulsed DC sputtering method in which a bias is applied in a pulsed manner. An RF sputtering method is mainly used in the case where an insulating film is formed, and a DC sputtering method is mainly used in the case where a conductive film such as a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed at the same time in the same chamber.

In addition, there are a sputtering apparatus provided with a magnet system inside the chamber, which is for a magnetron sputtering method, and a sputtering apparatus which is used for an ECR sputtering method in which plasma produced with the use of microwaves is used without using glow discharge.

Furthermore, as a deposition method using a sputtering method, there are also a reactive sputtering method in which a target substance and a sputtering gas component are chemically reacted with each other during deposition to form a thin compound film thereof, and a bias sputtering method in which voltage is also applied to a substrate during deposition.

Next, through a second photolithography process, a resist mask is formed. Then, the In—Ga—Zn—O-based film is etched. In the etching, organic acid such as citric acid or oxalic acid can be used for an etchant. Here, the In—Ga—Zn—O-based film is etched by wet etching with the use of ITO-07N (manufactured by Kanto Chemical Co., Inc.) to remove an unnecessary portion. Thus, the In—Ga—Zn—O-based film is processed to have an island shape, whereby the oxide semiconductor layer 103 is formed. The end portions of the oxide semiconductor layer 103 are etched to have tapered shapes, whereby breakage of a wiring due to a step shape can be prevented. Note that etching here is not limited to wet etching and dry etching may be performed.

Then, the oxide semiconductor layer is subjected to dehydration or dehydrogenation. First heat treatment for the dehydration or dehydrogenation can be performed through rapid thermal annealing (RTA) treatment with the use of a high-temperature gas (an inert gas such as nitrogen or a rare gas) or light at a temperature from 500° C. to 750° C. (or a temperature lower than or equal to the strain point of a glass substrate) for approximately one minute to ten minutes, preferably at 650° C. for approximately three minutes to six minutes. With an RTA method, dehydration or dehydrogenation can be performed in a short time; therefore, treatment can be performed even at a temperature higher than the strain point of a glass substrate. A cross-sectional view at this stage and a plan view at this stage are illustrated in FIG. 2B and FIG. 5, respectively. Note that the timing of heat treatment is not limited to this timing and may be performed plural times, for example, before and after a photolithography process or a deposition step.

Here, the superficial portion of the oxide semiconductor layer 103 is crystallized through the first heat treatment and thus comes to have the crystal region 106 including microcrystals. The rest region of the oxide semiconductor layer 103 comes to be amorphous or be formed of a mixture of amorphousness and microcrystals, where an amorphous region is dotted with microcrystals, or be formed of a microcrystal group. Note that the crystal region 106 is part of the oxide semiconductor layer 103 and hereinafter, the "oxide semiconductor layer 103" includes the crystal region 106.

Note that in this specification, heat treatment in the atmosphere of an inert gas such as nitrogen or a rare gas is referred to as heat treatment for dehydration or dehydrogenation. In this specification, "dehydrogenation" does not indicate elimination of only $H_2$ with heat treatment. For convenience, elimination of H, OH, and the like is also referred to as "dehydration or dehydrogenation".

It is important that the oxide semiconductor layer which has been subjected to dehydration or dehydrogenation should not be exposed to the air so that entry of water or hydrogen into the oxide semiconductor layer can be prevented. When a transistor is formed using an oxide semiconductor layer obtained by changing an oxide semiconductor layer into a low-resistance oxide semiconductor layer, i.e., an n-type (e.g., $n^-$-type or $n^+$-type) oxide semiconductor layer by performing dehydration or dehydrogenation and by changing the low-resistance oxide semiconductor layer into a high-resistance oxide semiconductor layer so that the oxide semiconductor layer becomes an i-type oxide semiconductor layer, the threshold voltage ($V_{th}$) of the transistor is positive, so that a so-called normally-off property is realized. It is preferable for a transistor used in a display device that gate voltage be positive threshold voltage that is as close to 0 V as possible. In an active matrix display device, electric characteristics of a transistor included in a circuit are important and the performance of the display device depends on the electrical characteristics. In particular, the threshold voltage of the transistor is important. If the threshold voltage of the transistor is negative, the transistor has a so-called normally-on property, that is, current flows between a source electrode and a drain electrode even when gate voltage is 0 V, so that it is difficult to control the circuit formed using the transistor. In the case of a transistor where the threshold voltage is positive but an absolute value of the threshold voltage is large, the transistor cannot perform a switching operation in some cases because driving voltage is not high enough. In the case of an n-channel transistor, it is preferable that a channel be formed and drain current flows after positive voltage is applied as gate voltage. A transistor in which a channel is not formed unless driving voltage is raised and a transistor in which a channel is formed and drain current flows even when negative voltage is applied are unsuitable for a transistor used in a circuit.

In cooling from the temperature at which dehydration or dehydrogenation is performed, an atmosphere may be switched to a different atmosphere from the atmosphere where a temperature is raised or heat treatment is performed. For example, cooling can be performed in the furnace where dehydration or dehydrogenation is performed while the furnace is filled with a high-purity oxygen gas, a high-purity $N_2O$ gas, or ultra-dry air (having a dew point of −40° C. or lower, preferably −60° C. or lower) without exposure to the air.

Note that in the first heat treatment, it is preferable that water, hydrogen, and the like be not contained in the atmosphere. Alternatively, the purity of an inert gas which is introduced into a heat treatment apparatus is preferably 6N (99.9999%) or more, more preferably 7N (99.99999%) or more (that is, the impurity concentration is 1 ppm or less, preferably 0.1 ppm or less).

In the case where the heat treatment is performed in an inert gas atmosphere, the oxide semiconductor layer is changed into an oxygen-vacant oxide semiconductor layer so that the oxide semiconductor layer becomes a low-resistance oxide semiconductor layer (i.e., an n-type (e.g., n⁻-type or n⁺-type oxide semiconductor layer) through the heat treatment. After that, the oxide semiconductor layer is made to be in an oxygen excess state by the formation of an oxide insulating layer which is in contact with the oxide semiconductor layer. Thus, the oxide semiconductor layer is made to be i-type; that is, the oxide semiconductor layer is changed into a high-resistance oxide semiconductor layer. Accordingly, it is possible to form a highly reliable transistor having favorable electrical characteristics.

Depending on a condition of the first heat treatment or a material of the oxide semiconductor layer, the oxide semiconductor layer may be partly crystallized. After the first heat treatment, the oxide semiconductor layer 103 which is oxygen-vacant and has low resistance is obtained. After the first heat treatment, the carrier concentration is higher than that of the oxide semiconductor film just after the film formation, so that the oxide semiconductor layer has a carrier concentration of, preferably, $1 \times 10^{18}/cm^3$ or more.

The first heat treatment for the oxide semiconductor film may be performed before the oxide semiconductor film is processed into an island-shaped oxide semiconductor layer. In that case, the second photolithography process is performed after the first heat treatment. A crystal region is not formed in a side surface portion of the island-shaped oxide semiconductor layer 103 and the crystal region 106 is formed only in an upper layer portion of the oxide semiconductor layer 103 (see FIG. 10A).

Next, through a third photolithography process, a resist mask is formed. An unnecessary portion is removed by etching to form a contact hole reaching the wiring or the electrode layer which is formed from the same material as the gate electrode layer 101. This contact hole is provided for connection between the above wiring or the like and a conductive film to be formed later.

Next, over the oxide semiconductor layer 103 and the gate insulating layer 102, a first conductive layer 112, a second conductive layer 113, and a third conductive layer 114 are formed as conductive layers with a sputtering method or a vacuum evaporation method. FIG. 2C is a cross-sectional view at this stage.

The first conductive layer 112, the second conductive layer 113, and the third conductive layer 114 can each be formed using a material similar to that of the gate electrode layer 101.

Here, the first conductive layer 112 and the third conductive layer 114 are formed using titanium that is a heat-resistant conductive material, and the second conductive layer 113 is formed using an aluminum alloy containing neodymium. Such a structure can utilize a low resistance property of aluminum and reduce generation of hillock. Note that although the conductive layer has a three-layer structure in this embodiment, an embodiment of the present invention is not limited to this. A single-layer structure or a layered structure including two layers or four or more layers may be employed. For example, a single-layer structure of a titanium film or a layered structure of a titanium film and an aluminum film containing silicon may be employed.

Figure 6:
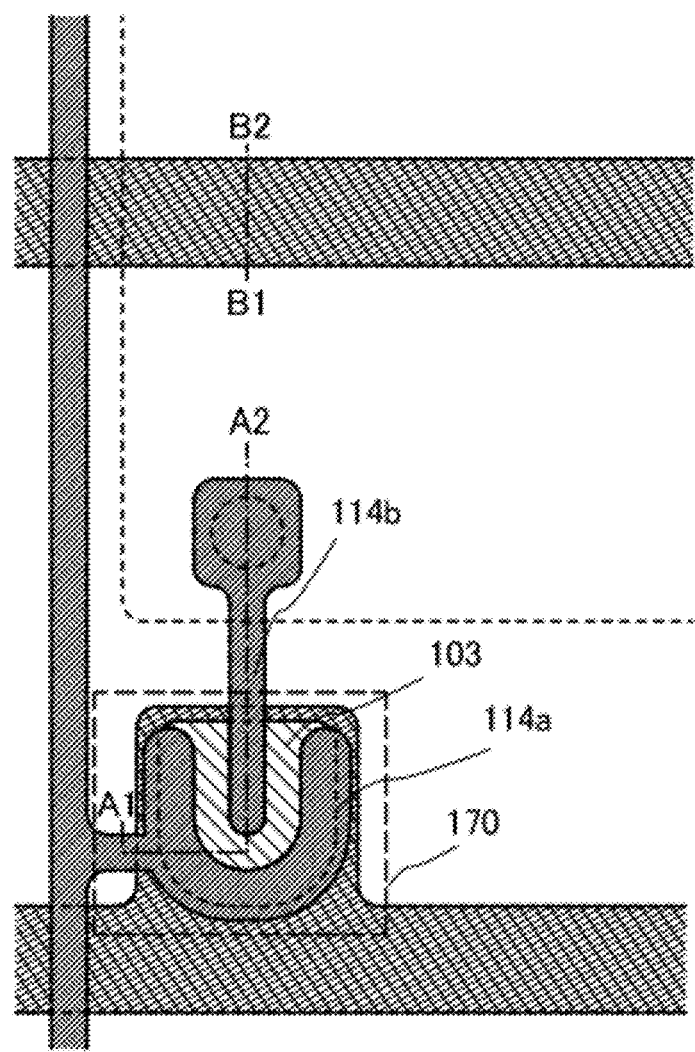
FIG. 6 is a plan view illustrating a transistor.

Next, through a fourth photolithography process, a resist mask 131 is formed. Unnecessary portions are removed by etching, whereby the source and drain electrode layers 105a and 105b, the oxide semiconductor layer 103, and a connection electrode 120 are formed. Wet etching or dry etching is employed as an etching method at this time. For example, when the first conductive layer 112 and the third conductive layer 114 are formed using titanium and the second conductive layer 113 is formed using an aluminum alloy containing neodymium, wet etching can be performed using a hydrogen peroxide solution or heated hydrochloric acid as an etchant. Through this etching step, the oxide semiconductor layer 103 is partly etched to have a thin region between the source electrode layer 105a and the drain electrode layer 105b. A cross-sectional view at this stage and a plan view at this stage are illustrated in FIG. 3A and FIG. 6, respectively.

At this time, etching treatment is performed under the condition that the selectivity ratio of the oxide semiconductor layer 103 to the first conductive layer 112 and the third conductive layer 114 is low enough, whereby a transistor has a structure where a crystal region of a superficial portion is left as illustrated in FIG. 1B.

The first conductive layer 112, the second conductive layer 113, the third conductive layer 114, and the oxide semiconductor layer 103 can be entirely etched using a hydrogen peroxide solution or heated hydrochloric acid. Therefore, a step or the like is not formed in an end portion of the source electrode layer 105a, the drain electrode layer 105b, or the oxide semiconductor layer 103. In addition, wet etching allows the layers to be etched isotropically; thus, the source and drain electrode layers 105a and 105b are reduced in size so that the end portions of them are on the inner side of the resist mask 131. Through the above steps, a transistor 170 in which the oxide semiconductor layer 103 and the crystal region 106 are used as a channel formation region can be manufactured.

Here, the source electrode layer 105a and the drain electrode layer 105b are formed using the light-transmitting oxide conductive layer similarly to the gate electrode layer 101, whereby light transmissivity of the pixel portion can be increased and the aperture ratio can also be increased.

Further, the oxide conductive layer may be formed between the oxide semiconductor layer 103 and the metal film to be the source and drain electrode layers 105a and 105b so that contact resistance can be reduced.

In the fourth photolithography process, a second terminal 122 formed using the same material as the source electrode layer 105a and the drain electrode layer 105b is also left in the terminal portion. Note that the second terminal 122 is electrically connected to a source wiring (the source wiring including the source and drain electrode layers 105a and 105b).

In addition, in the terminal portion, the connection electrode 120 is directly connected to the first terminal 121 of the terminal portion through a contact hole formed in the gate insulating layer 102. Note that although not illustrated, a source or drain wiring and a gate electrode of a transistor of a driver circuit are directly connected to each other through the same steps as the above steps.

Further, by use of a resist mask having regions with plural thicknesses (typically, two different thicknesses), which is formed using a multi-tone mask, the number of resist masks can be reduced, resulting in a simplified process and lower costs.

Next, the resist mask 131 is removed, and the oxide insulating layer 107 is formed to cover the transistor 170. The oxide insulating layer 107 can be formed using a silicon oxide film, a silicon oxynitride film, an aluminum oxide film, a tantalum oxide film, or the like.

In this embodiment, a silicon oxide film is formed for the oxide insulating layer with a sputtering method. The substrate temperature in film formation may be from a room temperature to 300° C. and in this embodiment, is 100° C. In order to prevent entry of an impurity such as water or hydrogen in the film formation, it is preferable to perform pre-baking under reduced pressure at a temperature from 150° C. to 350° C. for from two to ten minutes, before the film formation, to form an oxide insulating layer without exposure to the air. The silicon oxide film can be formed with a sputtering method in a rare gas (typically argon) atmosphere, an oxygen atmosphere, or a mixed atmosphere containing a rare gas (typically argon) and oxygen. Further, a silicon oxide target or a silicon target can be used as a target. For example, with the use of a silicon target, a silicon oxide film can be formed with a sputtering method in an atmosphere of oxygen and a rare gas. The oxide insulating layer which is formed in contact with the oxide semiconductor layer in a region whose resistance is reduced is formed using an inorganic insulating film that does not contain impurities such as moisture, a hydrogen ion, and OH$^-$ and blocks entry of such impurities from the outside.

In this embodiment, film formation is performed with a pulsed DC sputtering method with the use of a silicon target doped with a columnar polycrystal B (with a resistivity of 0.01 Ω·cm) and has a purity of 6N under conditions where the distance between the substrate and the target (T–S distance) is 89 mm, the pressure is 0.4 Pa, and the direct current (DC) power is 6 kW, and the atmosphere is an oxygen atmosphere (the proportion of the oxygen flow is 100%). The thickness is 300 nm.

Next, second heat treatment is performed in an inert-gas atmosphere (preferably at a temperature from 200° C. to 400° C., e.g., from 250° C. to 350° C.). For example, the second heat treatment is performed in a nitrogen atmosphere at 250° C. for one hour. Alternatively, RTA treatment may be performed at high temperature for a short time as in the first heat treatment. In the second heat treatment, since the oxide insulating layer 107 is heated in contact with part of the oxide semiconductor layer 103, oxygen is supplied from the oxide insulating layer 107 to the oxide semiconductor layer 103 which comes to be n-type and have lower resistance through the first heat treatment, so that the oxide semiconductor layer 103 is in an oxygen excess state. Thus, the oxide semiconductor layer 103 can be i-type (have higher resistance.

In this embodiment, the second heat treatment is performed after formation of the silicon oxide film; however, the timing of the heat treatment is not limited to the timing immediately after formation of the silicon oxide film as long as it is after formation of the silicon oxide film.

In the case where the source electrode layer 105a and the drain electrode layer 105b are formed using a heat resistant material, a step using conditions of the first heat treatment can be performed at the timing of the second heat treatment. In that case, heat treatment may be performed once after formation of the silicon oxide film.

Then, through a fifth photolithography process is performed, a resist mask is formed. The oxide insulating layer 107 is etched so that a contact hole 125 that reaches the drain electrode layer 105b is formed. In addition, a contact hole 126 that reaches the connection electrode 120 and a contact hole 127 that reaches the second terminal 122 are also formed by this etching. FIG. 3B is a cross-sectional view at this stage.

Next, a light-transmitting conductive film is formed after the resist mask is removed. The light-transmitting conductive film is formed using indium oxide ($In_2O_3$), an alloy of indium oxide and tin oxide ($In_2O_3$—$SnO_2$, hereinafter abbreviated as ITO), or the like with a sputtering method, a vacuum evaporation method, or the like. Such a material is etched with a hydrochloric acid-based solution. It is to be noted that since a residue is likely to be generated in etching ITO, an alloy of indium oxide and zinc oxide ($In_2O_3$—ZnO, hereinafter abbreviated as IZO) may be used to improve etching processability.

Next, through a sixth photolithography process, a resist mask is formed. An unnecessary portion of the light-transmitting conductive film is removed by etching, so that a pixel electrode layer 110 is formed. Here, a storage capacitor is formed with the gate insulating layer 102 and the oxide insulating layer 107 in the capacitor portion, which are used as a dielectric, the capacitor wiring 108, and the pixel electrode layer 110.

Further, in the sixth photolithography process and the etching step, the light-transmitting conductive layers 128 and 129 are formed over the first terminal 121 and the second terminal 122, respectively. The light-transmitting conductive layers 128 and 129 each serve as an electrode or a wiring connected to an FPC. The light-transmitting conductive layer 128 which is connected to the first terminal 121 is a connection terminal electrode which functions as an input terminal of the gate wiring. The light-transmitting conductive layer 129 formed over the second terminal 122 serves as a connection terminal electrode which functions as an input terminal of the source wiring.

Figure 7:
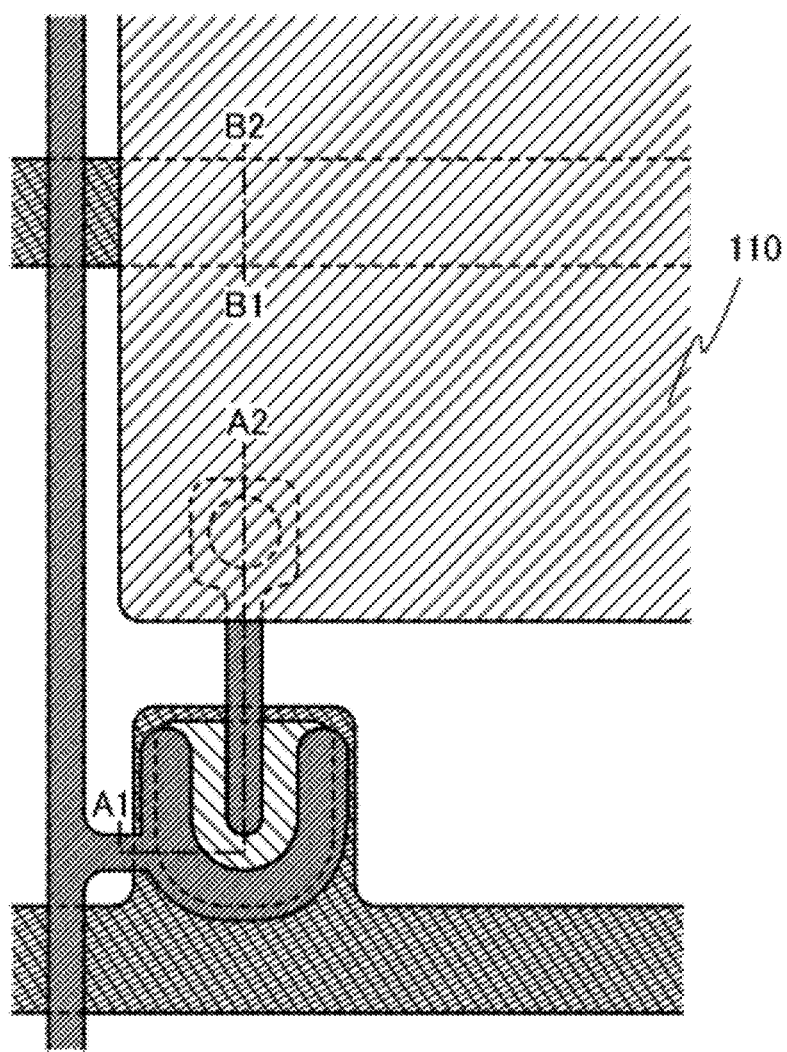
FIG. 7 is a plan view illustrating a transistor.

Then, the resist mask is removed. A cross-sectional view at this stage and a plan view at this stage are illustrated in FIG. 3C and FIG. 7, respectively.

FIGS. 8A1 and 8A2 are a cross-sectional view of a gate wiring terminal portion at this stage and a plan view thereof, respectively. FIG. 8A1 is a cross-sectional view taken along line C1-C2 of FIG. 8A2. In FIG. 8A1, a light-transmitting conductive layer 155 formed over a protective insulating film 154 and the connection electrode 153 is a connection terminal electrode which functions as an input terminal. Further, in FIG. 8A1, the first terminal 151 formed from the same material as the gate wiring and a connection electrode 153 formed from the same material as the source wiring are overlapped with each other with a gate insulating layer 152 interposed therebetween and are partly in direct contact with each other and in electrical connection. Furthermore, the connection electrode 153 and the light-transmitting conductive layer 155 are directly connected to each other through a contact hole formed in the protective insulating film 154.

FIGS. 8B1 and 8B2 are a cross-sectional view of a source wiring terminal portion and a plan view thereof, respectively. FIG. 8B1 is a cross-sectional view taken along line D1-D2 of FIG. 8B2. In FIG. 8B1, the light-transmitting conductive layer 155 formed over the protective insulating film 154 and the connection electrode 150 is a connection terminal electrode which functions as an input terminal. Further, in FIG. 8B1, a second terminal 156 formed from the same material as the gate wiring is overlapped with the connection electrode 150 electrically connected to the source wiring, with the gate insulating layer 152 interposed therebetween. The second terminal 156 is not electrically connected to the connection electrode 150, and a capacitor to prevent noise or static electricity can be formed when the potential of the second terminal 156 is set to a potential different from that of the connection electrode 150, such as GND or 0 V, or the second terminal 156 is set to be in a floating state. The connection electrode 150 is electrically connected to the light-transmitting conductive layer 155 through a contact hole formed in the protective insulating film 154.

A plurality of gate wirings, source wirings, and capacitor wirings are provided depending on the pixel density. Also in the terminal portion, a plurality of first terminals at the same potential as the gate wiring, a plurality of second terminals at the same potential as the source wiring, a plurality of third terminals at the same potential as the capacitor wiring, and the like are arranged. The number of each of the terminals may be any number, and the number of the terminals may be determined by a practitioner as appropriate.

Through these six photolithography processes, the channel-etched transistor 170 and the storage capacitor portion can be thus completed. By disposing the transistors and the storage capacitors in matrix in a pixel portion, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

Figure 9:
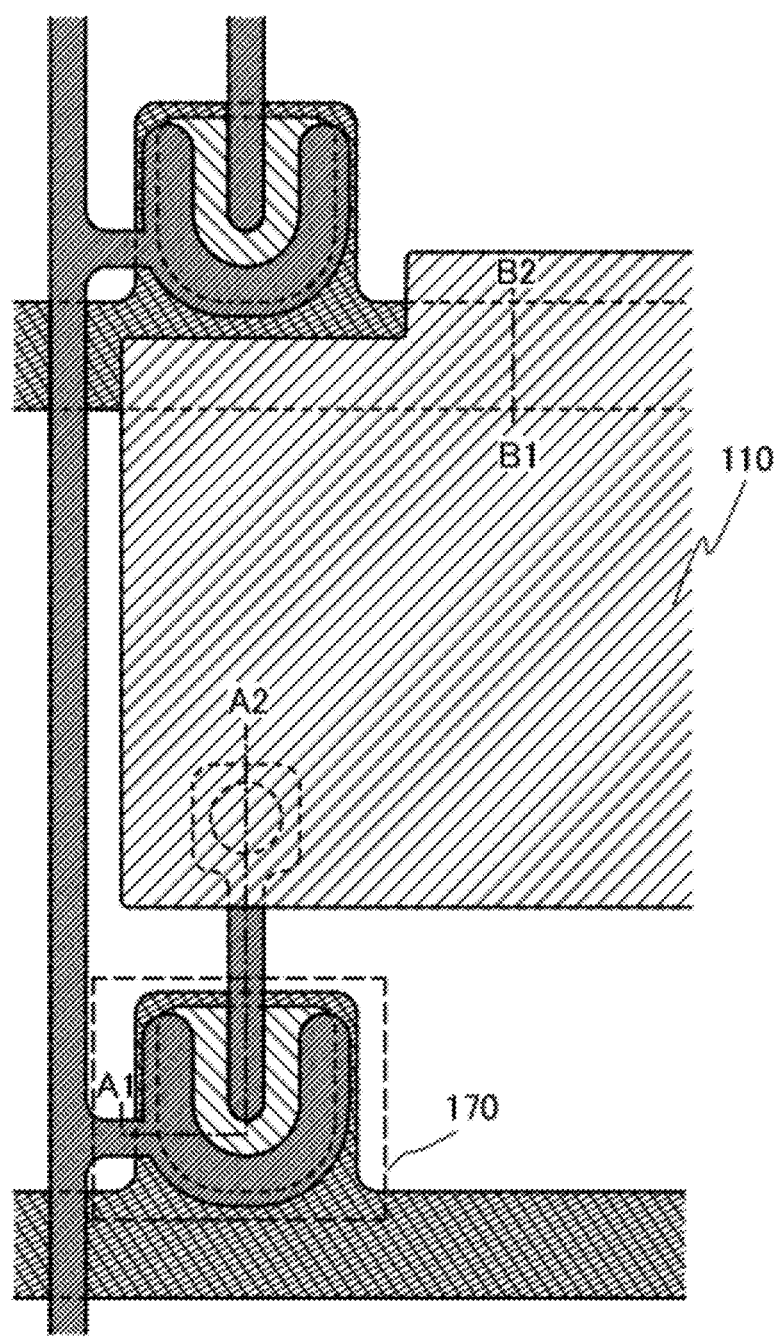
FIG. 9 is a plan view illustrating a transistor.

A pixel structure of this embodiment is not limited to the pixel structure in FIG. 7. FIG. 9 is a plan view illustrating an example of another pixel structure. FIG. 9 illustrates an example in which a capacitor wiring is not provided and a storage capacitor is formed with a pixel electrode and a gate wiring of an adjacent pixel which overlap each other with a protective insulating film and a gate insulating layer interposed therebetween. In this case, the capacitor wiring and the third terminal connected to the capacitor wiring can be omitted. Note that in FIG. 9, portions which are the same as those in FIG. 7 are denoted by common reference numerals.

In an active matrix liquid crystal display device, a display pattern is formed by driving liquid crystal elements arranged in matrix. Specifically, by applying voltage between a pixel electrode and a counter electrode which are included in a selected liquid crystal element, optical modulation of a liquid crystal layer is performed, and this optical modulation is perceived as a display pattern by a viewer.

In displaying moving images of a liquid crystal display device, there is a problem in that a long response time of liquid crystal molecules themselves causes afterimages. In order to reduce such afterimages, a driving method called black insertion is employed in which black is displayed on the whole screen every other frame period.

Further, there is another driving technique which is so-called double-frame rate driving. In the double-frame rate driving, a vertical synchronizing frequency is set to 1.5 times or more, preferably, 2 times or more as high as a usual vertical synchronizing frequency, whereby the response speed is increased, and the grayscale to be written is selected for every plural fields in each frame which have been obtained by dividing.

Moreover, there is a driving technique by which a plane light source is formed using a plurality of LEDs (light-emitting diodes), a plurality of EL light sources, or the like as a backlight and each light source of the plane light source is used independently to perform intermittent lighting driving within one frame period. For example, in the case of using LEDs, LEDs of white color are not always used and LEDs of three or more colors may be used. Since a plurality of LEDs can be controlled independently, the light emission timing of the LEDs can be synchronized with the timing at which a liquid crystal layer is optically modulated. According to this driving method, LEDs can be partly turned off; therefore, an effect of reducing power consumption can be obtained particularly in the case of displaying an image having a large black display region occupied in one screen.

By combining these driving methods, the display characteristics of a liquid crystal display device, such as moving-image characteristics, can be improved as compared to those of conventional liquid crystal display devices.

In the case of manufacturing a light-emitting display device, an electrode on the low power supply potential side (also called a cathode) of a light-emitting element is set at GND, 0 V, or the like; thus, a fourth terminal for setting the cathode at a low power supply potential such as GND or 0 V is provided in a terminal portion. Also in manufacturing a light-emitting display device, a power supply line is provided in addition to a source wiring and a gate wiring. Accordingly, the terminal portion is provided with a fifth terminal electrically connected to the power supply line.

Note that in this embodiment, the manufacturing method is described taking a channel-etched transistor as an example; however, a bottom contact-type transistor may be manufactured by changing the order of steps.

Since a transistor is likely to be broken due to static electricity or the like, a protective circuit for protecting the transistor in the pixel portion is preferably provided over the substrate over which a gate line or a source line is formed. The protective circuit is preferably formed using a non-linear element including an oxide semiconductor layer.

Through the above steps, the transistor can have high reliability and high electric characteristics and a display device including the transistor can be provided.

Note that the structure described in this embodiment can be used in combination with any of the structures described in the other embodiments, as appropriate.

Embodiment 3

In this embodiment, an example will be described below in which some of driver circuits and a pixel portion that include transistors formed over one substrate are driven.

In this embodiment, a pixel portion and a driver circuit portion are formed over one substrate with the use of the method for manufacturing a transistor, according to Embodiment 1. The transistor described in Embodiment 1 is an n-channel transistor, and thus the driver circuit portion is limited to part of circuits, which is constituted by only n-channel transistors.

Figure 14A:
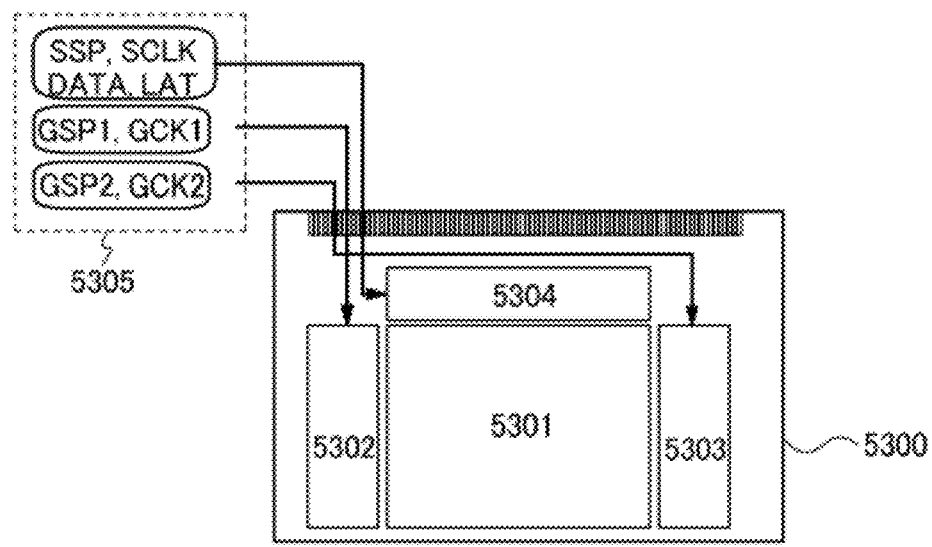
FIGS. 14A and 14B are block diagrams illustrating liquid crystal display devices.

FIG. 14A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 are placed and a plurality of scan lines extended from the first scan line driver circuit 5302 and the second scan line driver circuit 5303 are placed. Note that pixels each including a display element are arranged in matrix in respective regions where the scan lines and the signal lines intersect with each other. The substrate 5300 of the display device is connected to a timing control circuit 5305 (also referred to as a controller or a control IC) through a connection portion such as an FPC (flexible printed circuit).

In FIG. 14A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like that are externally provided is reduced, so that costs can be reduced. Moreover, the number of connection portions (e.g., FPC) between the substrate 5300 and external driver circuits can be reduced, and the reliability or yield can be increased.

Note that the timing control circuit 5305 supplies a first scan line driver circuit start signal (GSP1) (a start signal is also referred to as a start pulse) and a scan line driver circuit clock signal (GCK1) to the first scan line driver circuit 5302. Furthermore, the timing control circuit 5305 supplies a second scan line driver circuit start signal (GSP2), a scan line driver circuit clock signal (GCK2), and the like to the second scan line driver circuit 5303.

Moreover, the timing control circuit 5305 supplies a signal line driver circuit start signal (SSP), a signal line driver circuit clock signal (SCK), video signal data (DATA, also simply referred to as a video signal), a latch signal (LAT), and the like to the signal line driver circuit 5304. Each clock signal may be a plurality of clock signals with shifted phases or may be supplied together with a signal (CKB) obtained by inverting the clock signal. Note that it is possible to omit one of the first scan line driver circuit 5302 and the second scan line driver circuit 5303.

Figure 14B:
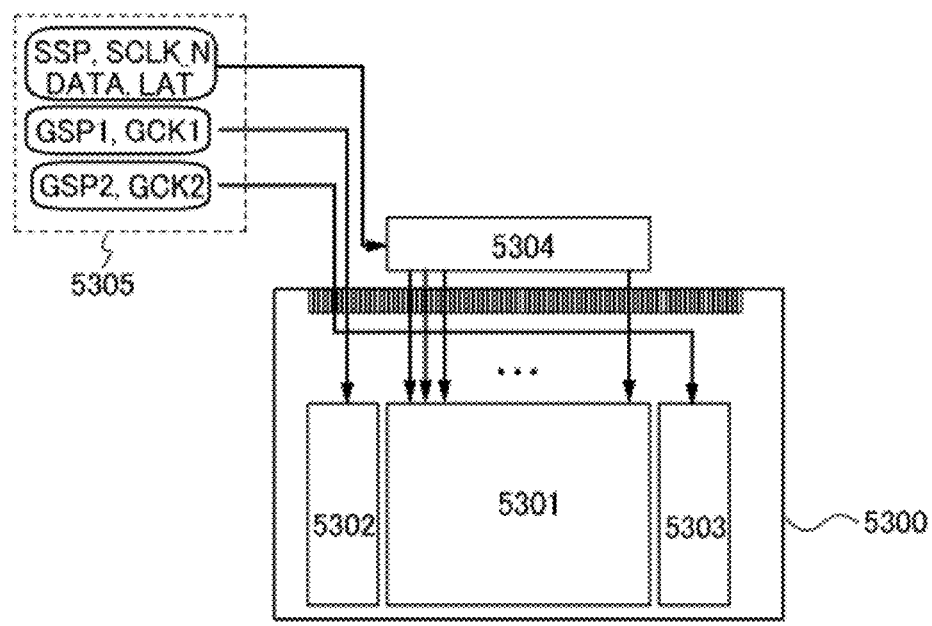

FIG. 14B illustrates a structure in which circuits with lower driving frequency (e.g., the first scan line driver circuit 5302 and the second scan line driver circuit 5303) are formed over the substrate 5300 where the pixel portion 5301 is formed, and the signal line driver circuit 5304 is formed over a substrate which is different from the substrate 5300 where the pixel portion 5301 is formed. With this structure, some of the driver circuits can be formed over the substrate 5300 where the pixel portion 5301 is formed even in the case of using transistors whose field effect mobility is relatively low. Thus, reduction in cost, improvement in yield, or the like can be achieved.

Next, an example of a structure and operation of a signal line driver circuit constituted by n-channel transistors will be described with reference to FIGS. 15A and 15B.

The signal line driver circuit includes a shift register 5601 and a switching circuit 5602. The switching circuit 5602 is constituted by switching circuits 5602_1 to 5602_N (N is a natural number). The switching circuits 5602_1 to 5602_N are each constituted by transistors 5603_1 to 5603_k (k is a natural number). Here, the transistors 5603_1 to 5603_k are n-channel transistors.

A connection relation in the signal line driver circuit is described by using the switching circuit 5602_1 as an example. First terminals of the transistors 5603_1 to 5603_k are connected to wirings 5604_1 to 5604_k, respectively. Second terminals of the transistors 5603_1 to 5603_k are connected to signal lines S1 to Sk, respectively. Gates of the transistors 5603_1 to 5603_k are connected to a wiring 5605_1.

The shift register 5601 has a function of sequentially selecting the switching circuits 5602_1 to 5602_N by sequentially outputting H-level signals (also referred to as H signals or signals at high power supply potential level) to wirings 5605_1 to 5605_N.

The switching circuit 5602_1 has a function of controlling a conduction state between the wirings 5604_1 to 5604_k and the signal lines S1 to Sk (electrical continuity between the first terminals and the second terminals), that is, a function of controlling whether potentials of the wirings 5604_1 to 5604_k are supplied to the signal lines S1 to Sk. In this manner, the switching circuit 5602_1 functions as a selector. Moreover, the transistors 5603_1 to 5603_k have functions of controlling conduction states between the wirings 5604_1 to 5604_k and the signal lines S1 to Sk, respectively, that is, a function of controlling whether potentials of the wirings 5604_1 to 5604_k are supplied to the signal lines S1 to Sk, respectively. In this manner, each of the transistors 5603_1 to 5603_k functions as a switch.

The video signal data (DATA) is input to each of the wirings 5604_1 to 5604_k. The video signal data (DATA) is often an analog signal corresponding to image data or an image signal.

Figure 15A:
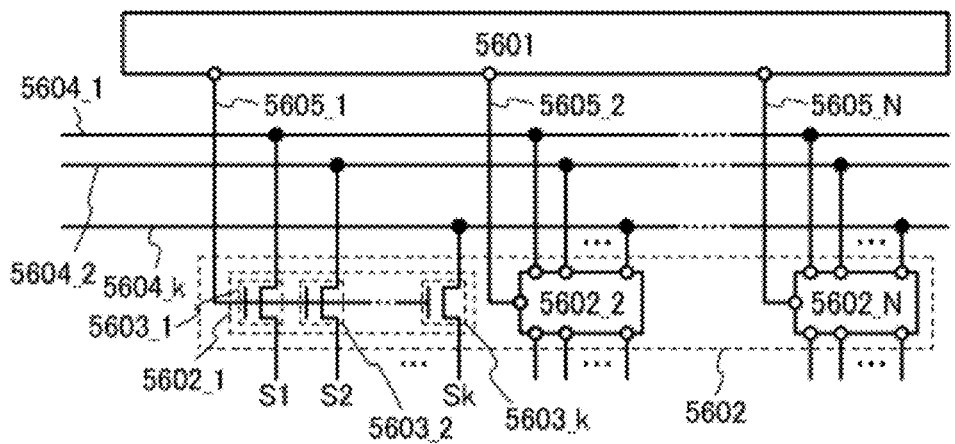
FIGS. 15A and 15B are a configuration diagram and a timing chart of a signal line driver circuit, respectively.
Figure 15B:
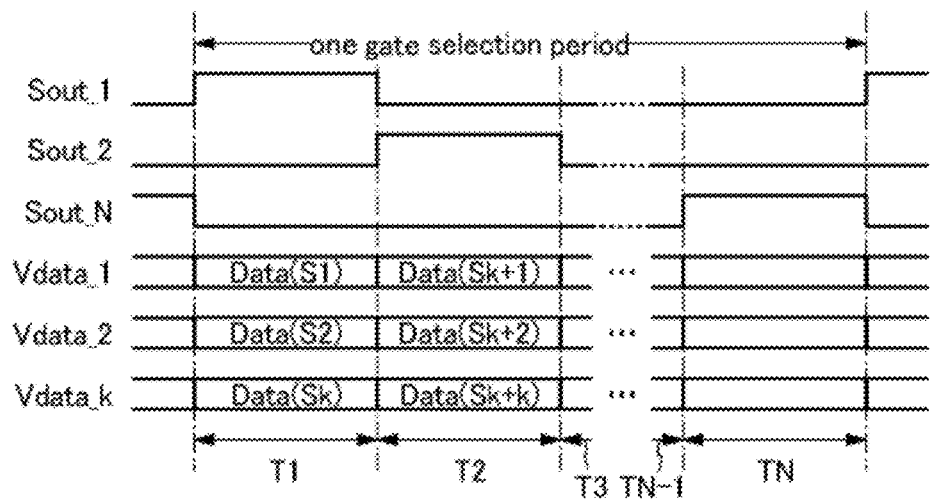

Next, the operation of the signal line driver circuit in FIG. 15A is described with reference to a timing chart in FIG. 15B. FIG. 15B illustrates examples of signals Sout_1 to Sout_N and signals Vdata_1 to Vdata_k. The signals Sout_1 to Sout_N are examples of output signals from the shift register 5601. The signals Vdata_1 to Vdata_k are examples of signals input to the wirings 5604_1 to 5604_k. Note that one operation period of the signal line driver circuit corresponds to one gate selection period in a display device. For example, one gate selection period is divided into periods T1 to TN. Each of the periods T1 to TN is a period for writing the video signal data (DATA) into a pixel that belongs to a selected row.

Note that signal waveform distortion and the like in drawings in this embodiment are exaggerated for simplicity in some cases. Therefore, this embodiment is not necessarily limited to the scale illustrated in the drawing.

In the periods T1 to TN, the shift register 5601 outputs H-level signals sequentially to the wirings 5605_1 to 5605_N. For example, in the period T1, the shift register 5601 outputs a high-level signal to the wiring 5605_1. At that time, the transistors 5603_1 to 5603_k are turned on, so that the wirings 5604_1 to 5604_k and the signal lines S1 to Sk are brought into conduction. Then, Data(S1) to Data(Sk) are input to the wirings 5604_1 to 5604_k, respectively. The Data(S1) to Data(Sk) are written into pixels in a first to kth columns in a selected row through the transistors 5603_1 to 5603_k, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when video signals are written into pixels by a plurality of columns; thus, insufficient writing of video signals can be prevented.

Note that any of the circuits constituted by the transistors in Embodiments 1 and 2 can be used for the shift register 5601 and the switching circuit 5602. In that case, the shift register 5601 can be constituted by only unipolar transistors.

Next, a structure of the scan line driver circuit will be described. The scan line driver circuit includes a shift register. Additionally, the scan line driver circuit may include a level shifter, a buffer, or the like in some cases. In the scan line driver circuit, a clock signal (CLK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to a scan line. Since the transistors in the pixels of one line have to be turned on all at once, a buffer that can supply large current is used.

One embodiment of a shift register which is used for part of the scan line driver circuit and/or the signal line driver circuit is described with reference to FIGS. 16A to 16D and FIGS. 17A and 17B.

Figure 16A:
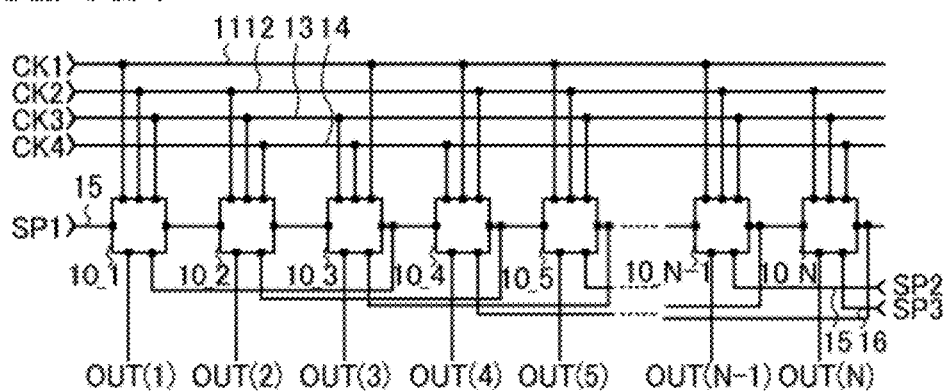
FIGS. 16A to 16D are circuit diagrams each illustrating a configuration of a shift register.

The shift register includes a first to Nth pulse output circuits 10_1 to 10_N(N is a natural number greater than or equal to 3) (see FIG. 16A). In the shift register, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N.

A start pulse SP1 (a first start pulse) is input from a fifth wiring 15 to the first pulse output circuit 10_1. To the nth pulse output circuit 10_n of the second or subsequent stage (n is a natural number greater than or equal to 2 and less than or equal to N), a signal from the pulse output circuit of the previous stage (such a signal is referred to as a previous-stage signal OUT(n−1)) is input. To the first pulse output circuit 10_1, a signal from the third pulse output circuit 10_3 of the stage following the next stage is input. In a similar manner, to the nth pulse output circuit 10_n of the second or subsequent stage, a signal from the (n+2)th pulse output circuit 10_(n+2) of the stage following the next stage (such a signal is referred to as a subsequent-stage signal OUT(n+2)) is input.

Thus, the pulse output circuits of the respective stages output first output signals (OUT(1)(SR) to OUT(N)(SR)) to be input to the pulse output circuits of the subsequent stages and/or the pulse output circuits of the previous stages and second output signals (OUT(1) to OUT(N)) to be input to different circuits or the like. Note that since the subsequent-stage signal OUT(n+2) is not input to the last two stages of the shift register as illustrated in FIG. 16A, a second start pulse SP2 and a third start pulse SP3 may be additionally input to the stage before the last stage and the last stage, respectively, for example.

Note that a clock signal (CK) is a signal that alternates between an H-level and an L-level (also referred to as an L signal or a signal at low power supply potential level) at regular intervals. Here, the first clock signal (CK1) to the fourth clock signal (CK4) are delayed by ¼ cycle sequentially. In this embodiment, driving of the pulse output circuit is controlled with the first to fourth clock signals (CK1) to (CK4). Note that the clock signal is also referred to as GCK or SCK in some cases depending on a driver circuit to which the clock signal is input; the clock signal is referred to as CK in the following description.

A first input terminal 21, a second input terminal 22, and a third input terminal 23 are electrically connected to any of the first to fourth wirings 11 to 14. For example, in the first pulse output circuit 10_1 in FIG. 16A, the first input terminal 21 is electrically connected to the first wiring 11, the second input terminal 22 is electrically connected to the second wiring 12, and the third input terminal 23 is electrically connected to the third wiring 13. In the second pulse output circuit 102, the first input terminal 21 is electrically connected to the second wiring 12, the second input terminal 22 is electrically connected to the third wiring 13, and the third input terminal 23 is electrically connected to the fourth wiring 14.

Figure 16B:
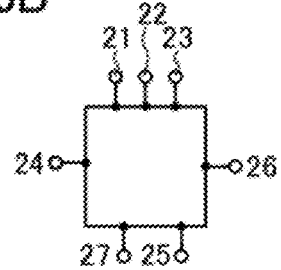

Each of the first to Nth pulse output circuits 10_1 to 10_N is assumed to include the first input terminal 21, the second input terminal 22, the third input terminal 23, a fourth input terminal 24, a fifth input terminal 25, a first output terminal 26, and a second output terminal 27 (see FIG. 16B).

In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1)(SR) is output from the first output terminal 26; and the second output signal OUT(1) is output from the second output terminal 27.

In the first to Nth pulse output circuits 10_1 to 10_N, the transistor 28 having four terminals (see FIG. 16C) can be used in addition to a transistor having three terminals. Note that in this specification, when a transistor has two gate electrodes with a semiconductor layer therebetween, the gate electrode below the semiconductor layer is called a lower gate electrode and the gate electrode above the semiconductor layer is called an upper gate electrode. The transistor 28 is an element that can perform electric control between an IN terminal and an OUT terminal with a first control signal G1 input to the lower gate electrode and a second control signal G2 input to the upper gate electrode.

When an oxide semiconductor is used for a semiconductor layer including a channel formation region in a transistor, the threshold voltage sometimes shifts in the positive or negative direction depending on a manufacturing process. For that reason, the transistor in which an oxide semiconductor is used for a semiconductor layer including a channel formation region preferably has a structure with which the threshold voltage can be controlled. The gate electrodes are provided over and under the channel formation region of the transistor 28 in FIG. 16C with a gate insulating layer therebetween. By controlling a potential of the upper gate electrode and/or the lower gate electrode, the threshold voltage can be controlled to be a desired value.

Next, an example of a specific circuit configuration of the pulse output circuit will be described with reference to FIG. 16D.

Figure 16C:
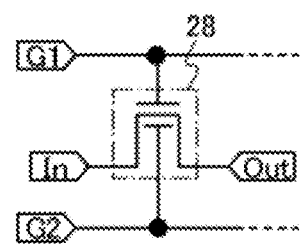
Figure 16D:
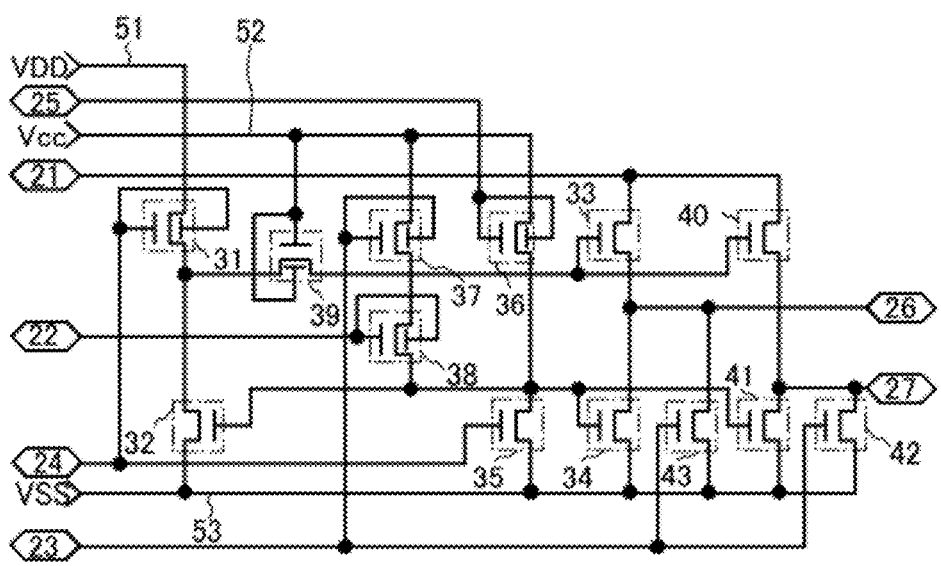

The pulse output circuit illustrated in FIG. 16D includes a first to thirteenth transistors 31 to 43. The first to thirteenth transistors 31 to 43 are connected to the first to fifth input terminals 21 to 25, the first output terminal 26, the second output terminal 27, a power supply line 51 to which a first high power supply potential VDD is supplied, a power supply line 52 to which a second high power supply potential VCC is supplied, and a power supply line 53 to which a low power supply potential VSS is supplied. A signal or power supply potential is supplied to the first to thirteenth transistors 31 to 43 from the power supply line 51 to which a first high power supply potential VDD is supplied, the power supply line 52 to which a second high power supply potential VCC is supplied, and the power supply line 53 to which a low power supply potential VSS is supplied, in addition to the first to fifth input terminals 21 to 25, the first output terminal 26, and the second output terminal 27.

The relation of the power supply potentials of the power supply lines in FIG. 16D is as follows: the first power supply potential VDD is higher than or equal to the second power supply potential VCC, and the second power supply potential VCC is higher than the third power supply potential VSS. Note that the first to fourth clock signals (CK1) to (CK4) each alternate between an H-level and an L-level at regular intervals; for example, the clock signal at H level is VDD and the clock signal at L level is VSS.

By making the potential VDD of the power supply line 51 higher than the potential VCC of the power supply line 52, a potential applied to the gate electrode of the transistor can be lowered, shift in threshold voltage of the transistor can be reduced, and degradation of the transistor can be suppressed without an adverse effect on the operation of the transistor.

As illustrated in FIG. 16D, the transistor 28 with four terminals in FIG. 16C is preferably used as each of the first transistor 31 and the sixth to ninth transistors 36 to 39 among the first to thirteenth transistors 31 to 43.

A potential of a node to which one electrode serving as a source or a drain of each of the first transistor 31 and the sixth to ninth transistors 36 to 39 is connected needs to be switched with a control signal of a gate electrode of each of the first transistor 31 and the sixth to ninth transistors 36 to 39. Further, the first transistor 31 and the sixth to ninth transistors 36 to 39 each preferably reduce a malfunction of the pulse output circuit since response to the control signal input to the gate electrode is fast (the rise of on-state current is steep). Thus, by using the transistor with four terminals, the threshold voltage can be controlled, and a malfunction of the pulse output circuit can be further reduced. Note that in FIG. 16D, the first control signal G1 and the second control signal G2 are the same control signal; however, different control signals may be input.

In FIG. 16D, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24.

A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34.

A first terminal of the third transistor 33 is electrically connected to the first input terminal 21, and a second terminal of the third transistor 33 is electrically connected to the first output terminal 26.

A first terminal of the fourth transistor 34 is electrically connected to the power supply line 53, and a second terminal of the fourth transistor 34 is electrically connected to the first output terminal 26.

A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24.

A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25.

A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23.

A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22.

The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a lower gate electrode and an upper gate electrode) of the ninth transistor 39 are electrically connected to the power supply line 52.

A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39.

A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34.

A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the lower gate electrode and the upper gate electrode) of the seventh transistor 37.

A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the lower gate electrode and the upper gate electrode) of the seventh transistor 37.

In FIG. 16D, a portion where the gate electrode of the third transistor 33, the gate electrode of the tenth transistor 40, and the second terminal of the ninth transistor 39 are connected is referred to as a node A. Moreover, a portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 17A).

Figure 17A:
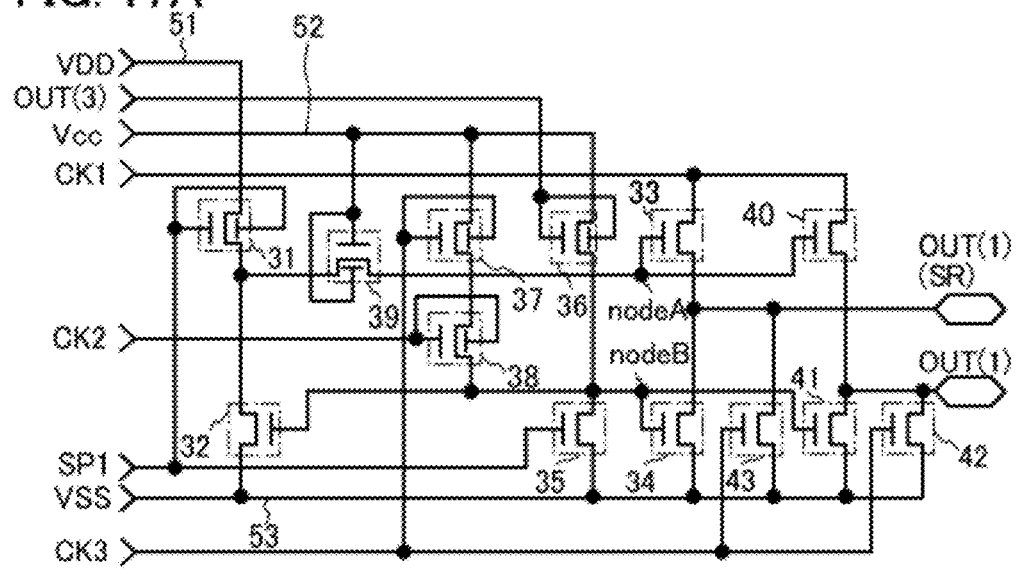
FIGS. 17A and 17B are a circuit diagram illustrating a configuration of a shift register and a timing chart illustrating an operation of the shift register, respectively.

FIG. 17A illustrates signals that are input to or output from the first to fifth input terminals 21 to 25 and the first and second output terminals 26 and 27 in the case where the pulse output circuit illustrated in FIG. 16D is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse (SP1) is input to the fourth input terminal 24; the subsequent-stage signal OUT(3) is input to the fifth input terminal 25; the first output signal OUT(1)(SR) is output from the first output terminal 26; and the second output signal OUT(1) is output from the second output terminal 27.

Note that a transistor is an element having at least three terminals of a gate, a drain, and a source, where a channel region is formed between the drain region and the source region and current can flow through the drain region, the channel region, and the source region. Here, since the source and the drain of the transistor may change depending on the structure, the operating condition, and the like of the transistor, it is difficult to define which is a source or a drain. Therefore, a region functioning as the source or the drain is not called the source or the drain in some cases. In that case, for example, such regions may be referred to as a first terminal and a second terminal.

Note that in FIG. 17A, a capacitor for performing bootstrap operation by bringing the node A into a floating state may be additionally provided. Furthermore, a capacitor having one electrode electrically connected to the node B may be additionally provided in order to hold a potential of the node B.

Figure 17B:
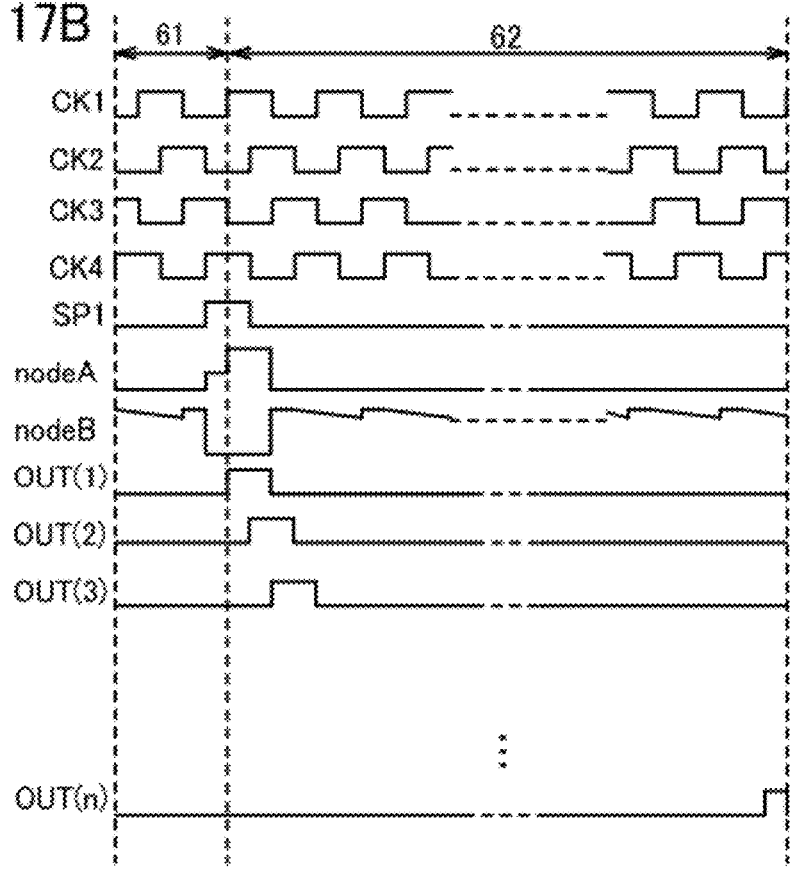

FIG. 17B illustrates a timing chart of a shift register including a plurality of pulse output circuits illustrated in FIG. 17A. Note that when the shift register is the one of a scan line driver circuit, a period 61 in FIG. 17B corresponds to a vertical retrace period and a period 62 corresponds to a gate selection period.

Note that the placement of the ninth transistor 39 in which the second power supply potential VCC is applied to the gate electrode as illustrated in FIG. 17A has the following advantages before and after bootstrap operation.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the source of the first transistor 31 is switched to the first terminal, that is, the terminal on the power supply line 51 side. Consequently, in the first transistor 31, high bias voltage is applied and thus significant stress is applied between the gate and the source and between the gate and the drain, which might cause deterioration of the transistor.

On the other hand, with the ninth transistor 39 in which the second power supply potential VCC is applied to the gate electrode, increase in the potential of the second terminal of the first transistor 31 can be prevented while the potential of the node A is raised by bootstrap operation. In other words, the placement of the ninth transistor 39 can lower the level of negative bias voltage applied between the gate and the source of the first transistor 31. Thus, the circuit configuration in this embodiment can reduce negative bias voltage applied between the gate and the source of the first transistor 31, so that deterioration of the first transistor 31 due to stress can be suppressed.

Note that the ninth transistor 39 may be provided so that the first terminal and the second terminal of the ninth transistor 39 are connected between the second terminal of the first transistor 31 and the gate of the third transistor 33. Note that in the case of the shift register including a plurality of pulse output circuits in this embodiment in a signal line driver circuit having a larger number of stages than a scan line driver circuit, the ninth transistor 39 can be omitted, which is advantageous in that the number of transistors is reduced.

Note that an oxide semiconductor is used for a semiconductor layer of each of the first to thirteenth transistors 31 to 43, whereby the off-state current of the transistors can be reduced, the on-state current and field effect mobility can be increased. Accordingly, the degree of degradation of the transistors can be reduced and thus, a malfunction in the circuit is reduced. Moreover, the degree of deterioration of the transistor using an oxide semiconductor by application of a high potential to a gate electrode is smaller than that of a transistor using amorphous silicon. Consequently, similar operation can be obtained even when the first power supply potential VDD is supplied to the power supply line to which the second power supply potential VCC is supplied, and the number of power supply lines placed between circuits can be reduced; thus, the size of the circuit can be reduced.

Note that a similar function is obtained even when the connection relation is changed so that a clock signal that is supplied to the gate electrodes (the lower gate electrode and the upper gate electrode) of the seventh transistor 37 from the third input terminal 23 and a clock signal that is supplied to the gate electrodes (the lower gate electrode and the upper gate electrode) of the eighth transistor 38 from the second input terminal 22 are supplied from the second input terminal 22 and the third input terminal 23, respectively.

In the shift register illustrated in FIG. 17A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B due to fall in potentials of the second input terminal 22 and the third input terminal 23 is caused twice by fall in potential of the gate electrode of the seventh transistor 37 and fall in potential of the gate electrode of the eighth transistor 38.

On the other hand, in the shift register illustrated in FIG. 17A, when a state of the seventh transistor 37 and the eighth transistor 38 is changed so that both the seventh transistor 37 and the eighth transistor 38 are on, then the seventh transistor 37 is on and the eighth transistor 38 is off, and then the seventh transistor 37 and the eighth transistor 38 are off, the fall in potential of the node B due to fall in potentials of the second input terminal 22 and the third input terminal 23 occurs only once, which is caused by fall in potential of the gate electrode of the eighth transistor 38.

Consequently, the connection relation, in which the clock signal CK3 is supplied to the gate electrodes (the lower gate electrode and the upper gate electrode) of the seventh transistor 37 from the third input terminal 23 and the clock signal CK2 is supplied to the gate electrodes (the lower gate electrode and the upper gate electrode) of the eighth transistor 38 from the second input terminal 22, is preferable. That is because the number of times of the change in the potential of the node B can be reduced, whereby the noise can be reduced.

In such a manner, an H-level signal is regularly supplied to the node B in a period during which the potentials of the first output terminal 26 and the second output terminal 27 are held at L level; thus, a malfunction of the pulse output circuit can be suppressed.

Note that the structure described in this embodiment can be used in combination with any of the structures described in the other embodiments, as appropriate.

Embodiment 4

In this embodiment, a display device with a display function, which is formed using the transistors described in Embodiments 1 and 2 in a pixel portion and a driver circuit will be described.

The display device includes a display element. As the display element, a liquid crystal element (also referred to as a liquid crystal display element) or a light-emitting element (also referred to as a light-emitting display element) can be used. The light-emitting element includes an element whose luminance is controlled by current or voltage in its category, and specifically includes an inorganic electroluminescent (EL) element, an organic EL element, and the like in its category. Furthermore, a display medium whose contrast is changed by an electric effect, such as electronic ink, can be used.

Note that a display device in this specification refers to an image display device, a display device, or a light source (including a lighting device). Further, the display device includes the following modules in its category: a module including a connector such as a flexible printed circuit (FPC), a tape automated bonding (TAB) tape; a module having a TAB tape that is provided with a printed wiring board at the end thereof; and a module having an integrated circuit (IC) that is directly mounted on a display element with a chip on glass (COG) method.

In this embodiment, the appearance and a cross section of a liquid crystal display panel, which is one embodiment of a semiconductor device, will be described with reference to FIGS. 20A1, 20A2, and 20B. FIGS. 20A1 and 20A2 are top plan views of the liquid crystal display panels. FIG. 20B is a cross-sectional view along M-N in FIGS. 20A1 and 20A2. The liquid crystal display panel has a structure in which a liquid crystal element 4013 is sealed between a first substrate 4001 provided with transistors 4010 and 4011 each including an oxide semiconductor layer and a second substrate 4006 with a sealant 4005.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor or a polycrystalline semiconductor is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 20A1 illustrates an example in which the signal line driver circuit 4003 is mounted with a COG method. FIG. 20A2 illustrates an example in which signal line driver circuit 4003 is mounted with a TAB method.

The pixel portion 4002 and the scan line driver circuit 4004 provided over the first substrate 4001 include a plurality of transistors. FIG. 20B illustrates the transistor 4010 included in the pixel portion 4002 and the transistor 4011 included in the scan line driver circuit 4004, as an example. Insulating layers 4020 and 4021 are provided over the transistors 4010 and the insulating layer 4020 is provided over the transistor 4011.

Any of the highly reliable transistors including the oxide semiconductor layers which are described in Embodiments 1 and 2 can be used as the transistors 4010 and 4011. In this embodiment, the transistors 4010 and 4011 are n-channel transistors.

A conductive layer 4040 is provided over part of the insulating layer 4044, which overlaps with a channel formation region of an oxide semiconductor layer in the transistor 4011 for the driver circuit. The conductive layer 4040 is provided at the position overlapping with the channel formation region of the oxide semiconductor layer, whereby the amount of change in threshold voltage of the transistor 4011 between before and after the BT test can be reduced. A potential of the conductive layer 4040 is the same as that of a gate electrode layer of the transistor 4011, whereby the conductive layer 4040 can function as a second gate electrode layer. Alternatively, the conductive layer 4040 may be given a potential different from that of the gate electrode layer of the transistor 4011. Still alternatively, the potential of the conductive layer 4040 may be GND or 0 V, or the conductive layer 4040 may be in a floating state.

A pixel electrode layer 4030 included in the liquid crystal element 4013 is electrically connected to the transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. The pixel electrode layer 4030 and the counter electrode layer 4031 are provided with an insulating layer 4032 and an insulating layer 4033 functioning as alignment films, respectively. Note that although not illustrated, a color filter may be provided on either the first substrate 4001 side or the second substrate 4006 side.

Note that glass, ceramics, or plastics can be used as the first substrate 4001 and the second substrate 4006. As plastics, a fiberglass-reinforced plastics (FRP) plate, a polyvinyl fluoride (PVF) film, a polyester film, or an acrylic resin film can be used. Alternatively, a sheet with a structure in which aluminum foil is sandwiched between PVF films, polyester films, or the like may be used.

A columnar spacer 4035 is provided in order to control the thickness (a cell gap) of the liquid crystal layer 4008. The columnar spacer 4035 is obtained by selective etching of an insulating film. Alternatively, a spherical spacer may be used.

The counter electrode layer 4031 is electrically connected to a common potential line formed over the substrate where the transistor 4010 is formed. The counter electrode layer 4031 and the common potential line can be electrically connected to each other through conductive particles arranged between a pair of substrates using the common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is only generated within a narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of from 10 μsec to 100 μsec and is optically isotropic; therefore, alignment treatment is not necessary and viewing angle dependence is small. Note that in the case where a blue phase is used, the embodiment of the present invention is not limited to the structures in FIGS. 20A1, 20A2, and 20B and a structure of a so-called horizontal electric field mode, in which an electrode layer corresponding to the counter electrode layer 4031 is formed on the side of the substrate over which the pixel electrode layer 4030 is formed, may be used.

Note that this embodiment is an example of a transmissive liquid crystal display device and can also be applied to a reflective liquid crystal display device and a transflective liquid crystal display device.

In the example of the liquid crystal display device according to this embodiment, a polarizing plate is provided on the outer surface of the substrate (on the viewer side) and a coloring layer and an electrode layer used for a display element are sequentially provided on the inner surface of the substrate; alternatively, the polarizing plate may be provided on the inner surface of the substrate. The layered structure of the polarizing plate and the coloring layer is not limited to that in this embodiment and may be set as appropriate depending on materials of the polarizing plate and the coloring layer or conditions of the manufacturing process. Further, a light-blocking film serving as a black matrix may be provided.

In this embodiment, in order to reduce the surface roughness due to the transistor and to improve the reliability, the transistor is covered with insulating layers (the insulating layers 4020 and 4021) serving as a protective film and a planarizing insulating film. Note that the protective film is provided to prevent entry of contaminant impurities such as an organic substance, metal, and moisture existing in the air and is preferably a dense film. The protective film may be formed with a single-layer structure or a layered structure using any of a silicon oxide film, a silicon nitride film, a silicon oxynitride film, a silicon nitride oxide film, an aluminum oxide film, an aluminum nitride film, aluminum oxynitride film, and an aluminum nitride oxide film. Although this embodiment describes an example in which the protective film is formed with a sputtering method, any other method may be used.

In this embodiment, the insulating layer 4020 having a layered structure is formed as a protective film. Here, a silicon oxide film is formed with a sputtering method as a first layer of the insulating layer 4020. The use of the silicon oxide film as the protective film has an effect of preventing hillock of an aluminum film which is used as the source and drain electrode layers.

Further, as a second layer of the protective film, a silicon nitride film is formed with a sputtering method. The use of the silicon nitride film as the protective film can prevent mobile ions of sodium or the like from entering a semiconductor region, so that variation in electrical characteristics of the transistor can be suppressed.

After the protective film is formed, annealing (from 300° C. to 400° C.) of the oxide semiconductor layer may be performed.

The insulating layer 4021 is formed as a planarization insulating film. The insulating layer 4021 can be formed using a heat-resistant organic material such as an acrylic resin, polyimide, a benzocyclobutene resin, polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed using any of these materials.

Note that a siloxane-based resin is a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method of forming the insulating layer 4021, and the following method or means can be employed depending on the material: a method such as a sputtering method, an SOG method, a spin coating method, a dipping method, a spray coating method, or a droplet discharge method (e.g., an ink-jet method, screen printing, or offset printing), or a tool such as a doctor knife, a roll coater, a curtain coater, or a knife coater. In the case of forming the insulating layer 4021 with the use of a liquid material, annealing (300° C. to 400° C.) of the oxide semiconductor layer may be performed at the same time as a baking step. The baking step of the insulating layer 4021 also serves as annealing of the oxide semiconductor layer, whereby steps can be reduced.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Alternatively, a conductive composition including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a light transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. Examples are polyaniline and a derivative thereof, polypyrrole and a derivative thereof, polythiophene and a derivative thereof, and a copolymer of two or more kinds of these materials.

Further, a variety of signals and potentials are supplied to the signal line driver circuit 4003 which is separately formed, the scan line driver circuit 4004, or the pixel portion 4002 through an FPC 4018.

In this embodiment, a connection terminal electrode 4015 is formed using the same conductive film as the pixel electrode layer 4030 included in the liquid crystal element 4013. A terminal electrode 4016 is formed using the same conductive film as source and drain electrode layers of the transistor 4010 and the transistor 4011.

The connection terminal electrode 4015 is electrically connected to a terminal included in the FPC 4018 through an anisotropic conductive film 4019.

Note that FIGS. 20A1, 20A2, and 20B illustrate the example in which the signal line driver circuit 4003 is mounted on the first substrate 4001; however, this embodiment is not limited to this structure. Only part of the scan line driver circuit and part of the signal line driver circuit or part of the scan line driver circuit may be mounted.

Figure 21:
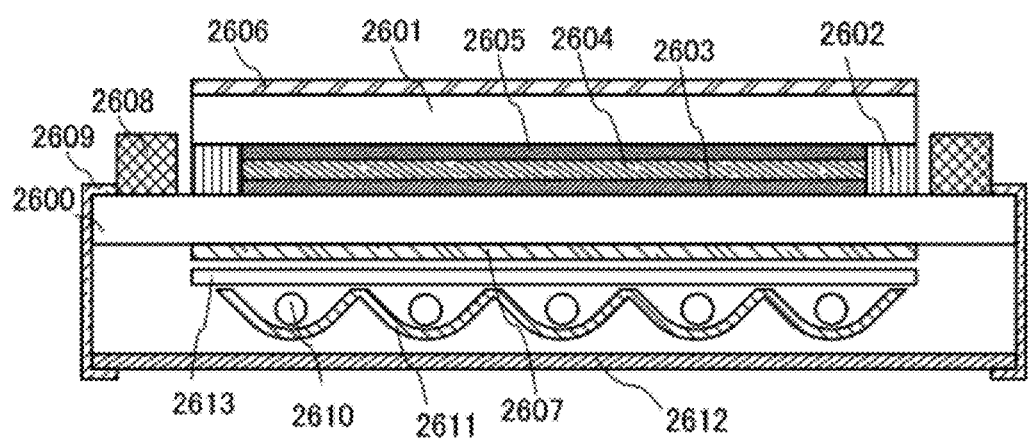
FIG. 21 is a cross-sectional view illustrating a display device.

FIG. 21 illustrates an example of a liquid crystal display module which is formed using a substrate 2600 over which the transistor described in Embodiments 1 and 2 is formed.

FIG. 21 illustrates an example of the liquid crystal display module, in which the substrate 2600 and a counter substrate 2601 are fixed to each other with a sealant 2602, and a pixel portion 2603 including a transistor and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for pixels. Polarizing plates 2606 and 2607 and a diffusion plate 2613 are provided outside the substrate 2600 and the counter substrate 2601. A light source includes a cold cathode tube 2610 and a reflective plate 2611. A circuit board 2612 is connected to a wiring circuit portion 2608 of the substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Through the above steps, a highly reliable liquid crystal display panel can be formed.

Note that the structure described in this embodiment can be used in combination with any of the structures described in the other embodiments, as appropriate.

Embodiment 5

In this embodiment, an example of electronic paper will be described as a display device to which the transistor described in Embodiments 1 and 2 is applied.

Figure 13:
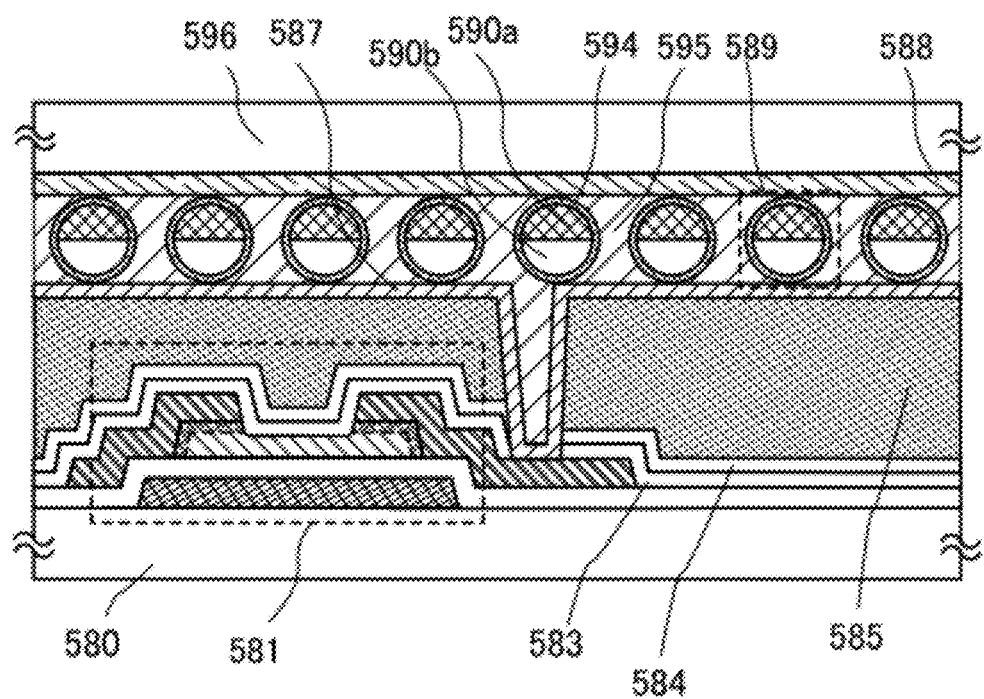
FIG. 13 is a cross-sectional view illustrating a display device.

FIG. 13 illustrates active matrix electronic paper as an example of a display device. The transistor described in Embodiments 1 and 2 can be used as a transistor 581 used for the display device.

The electronic paper in FIG. 13 is an example of a display device using a twisting ball display system. The twisting ball display system refers to a method in which spherical particles each colored in black and white are arranged between a first electrode layer and a second electrode layer, and a potential difference is generated between the first electrode layer and the second electrode layer to control orientation of the spherical particles, so that display is performed.

The transistor 581 is a bottom-gate transistor, and a source electrode layer or a drain electrode layer of the transistor 581 is electrically connected to a first electrode layer 587 through an opening formed in insulating layers 583, 584, and 585. Spherical particles 589 are provided between the first electrode layer 587 and a second electrode layer 588. Each of the spherical particles 589 includes a black region 590a, a white region 590b, and a cavity 594 filled with liquid around the black region 590a and the white region 590b. A space around the spherical particles 589 is filled with a filler 595 such as a resin (see FIG. 13). In this embodiment, the first electrode layer 587 corresponds to a pixel electrode, and the second electrode layer 588 corresponds to a common electrode. The second electrode layer 588 is electrically connected to a common potential line provided over the substrate where the transistor 581 is formed.

Alternatively, it is possible to use an electrophoretic element instead of the twisting ball. A microcapsule having a diameter of approximately 10 μm to 200 μm, in which transparent liquid, positively charged white microparticles, and negatively charged black microparticles are encapsulated, is used. In the microcapsule provided between the first electrode layer and the second electrode layer, when an electric field is applied by the first electrode layer and the second electrode layer, the white microparticles and the black microparticles move in opposite directions, so that white or black can be displayed. A display element using this principle is an electrophoretic display element, and a device including the electrophoretic display element is called electronic paper in general. The electrophoretic display element has higher reflectance than a liquid crystal display element; thus, an auxiliary light is unnecessary, power consumption is low, and a display portion can be recognized in a dim place.

In addition, even when power is not supplied to the display portion, an image which has been displayed once can be maintained. Consequently, a displayed image can be stored even if a display device having a display function (which is also referred to as a semiconductor device or a semiconductor device provided with a display device) is kept away from an electric wave source.

Note that the structure described in this embodiment can be used in combination with any of the structures described in the other embodiments, as appropriate.

Embodiment 6

In this embodiment, an example of a light-emitting display device will be described as a display device including the transistor described in Embodiments 1 and 2 is applied. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Because of such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions.

Figure 18:
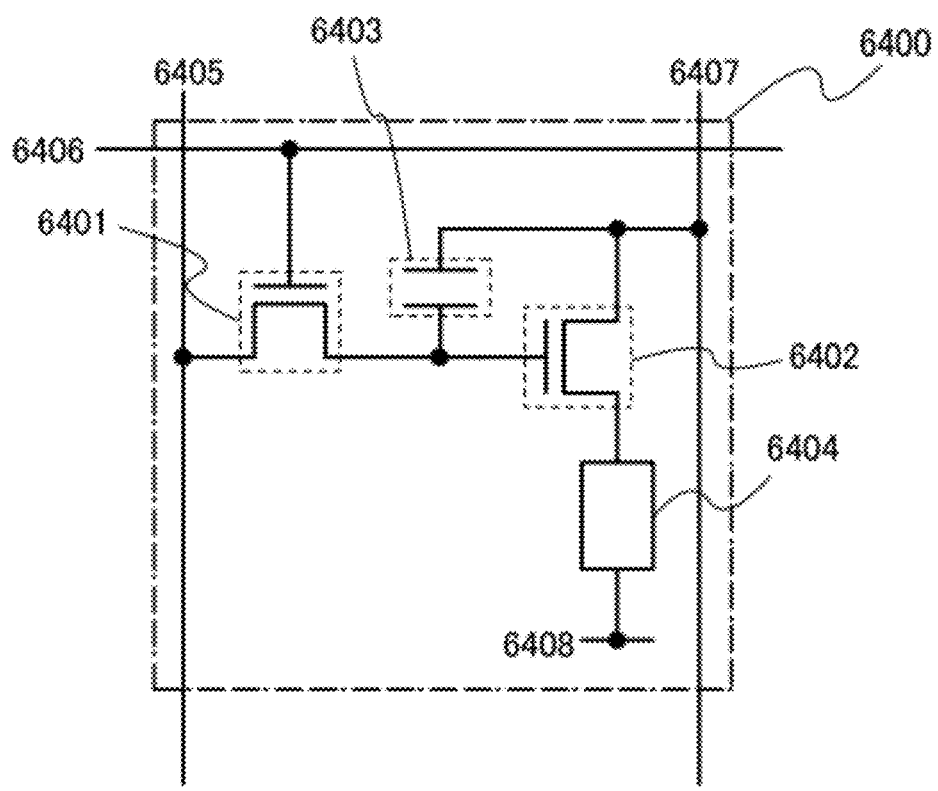
FIG. 18 illustrates a pixel equivalent circuit of a display device.

Note that an example of an organic EL element as a light-emitting element is described here. FIG. 18 illustrates an example of a pixel structure to which digital time grayscale driving can be applied.

A structure and operation of a pixel to which digital time grayscale driving can be applied are described. Here, an example is described in which one pixel includes two n-channel transistors each of which is described in Embodiments 1 and 2 and each of which includes the oxide semiconductor layer in a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to low power supply potential. Note that the low power supply potential is a potential lower than the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a voltage needed for light emission of the light-emitting element 6404 or higher.

Note that a gate capacitor of the driver transistor 6402 may be used as a substitute for the capacitor 6403, so that the capacitor 6403 can be omitted. The gate capacitor of the driver transistor 6402 may be formed between the channel formation region and the gate electrode.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, voltage higher than the voltage of the power supply line 6407 is applied to the gate of the driver transistor 6402. Note that voltage higher than or equal to (voltage of the power supply line+Vth of the driver transistor 6402) is applied to the signal line 6405.

In the case of performing analog grayscale driving instead of digital time grayscale driving, the same pixel configuration as FIG. 18 can be used by changing signal input.

In the case of performing analog grayscale driving, voltage higher than or equal to (forward voltage of the light-emitting element 6404+Vth of the driver transistor 6402) is applied to the gate of the driver transistor 6402. The forward voltage of the light-emitting element 6404 indicates voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure illustrated in FIG. 18 is not limited thereto. For example, a switch, a resistor, a capacitor, a transistor, a logic circuit, or the like may be added to the pixel illustrated in FIG. 18.

Next, structures of the light-emitting element will be described with reference to FIGS. 19A to 19C. Here, the case where a driver transistor is an n-channel transistor is illustrated, and cross-sectional structures of pixels are described. As each of transistors 7001, 7011, and 7021 used for display devices illustrated in FIGS. 19A to 19C, the transistor described in Embodiments 1 and 2 can be used.

In order to extract light emitted from the light-emitting element, at least one of an anode and a cathode is required to transmit light. For example, a light-emitting element can have a top emission structure in which light emission is extracted through the surface on the side opposite to the substrate side; a bottom emission structure in which light emission is extracted through the surface on the substrate side; or a dual emission structure in which light emission is extracted through the surface on the side opposite to the substrate side and the surface on the substrate side. The pixel structure according to an embodiment of the present invention can be applied to a light-emitting element having any of these emission structures.

Next, a light-emitting element having a bottom emission structure will be described with reference to FIG. 19A.

FIG. 19A is a cross-sectional view of a pixel in the case where the transistor 7011 is an n-channel transistor and light generated in a light-emitting element 7012 is emitted to pass through a first electrode 7013. In FIG. 19A, the first electrode 7013 of the light-emitting element 7012 is formed over a light-transmitting conductive layer 7017 which is electrically connected to the drain layer of the transistor 7011, and an EL layer 7014 and a second electrode 7015 are stacked in that order over the first electrode 7013.

As the light-transmitting conductive layer 7017, a light-transmitting conductive film such as a film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

Any of a variety of materials can be used for the first electrode 7013 of the light-emitting element. For example, the first electrode 7013 is preferably formed using a material having a relatively low work function, such as an alkali metal (such as Li or Cs); an alkaline earth metal (such as Mg, Ca, or Sr); an alloy containing any of the alkali metals and the alkaline earth metals (e.g., Mg:Ag or Al:Li); or a rare earth metal (such as Yb or Er). In FIG. 19A, the first electrode 7013 is formed to have a thickness enough to transmit light (preferably, approximately 5 nm to 30 nm). For example, an aluminum film with a thickness of 20 nm is used as the first electrode 7013.

Alternatively, a light-transmitting conductive film and an aluminum film may be stacked and then selectively etched so as to form the light-transmitting conductive layer 7017 and the first electrode 7013. In this case, the etching can be performed using the same resist mask.

The peripheral portion of the first electrode 7013 is covered with a partition 7019. The partition 7019 can be formed using an organic resin film of polyimide, acrylic, polyamide, epoxy, or the like; an inorganic insulating film; or organic polysiloxane. In the case where a photosensitive resin material is used for the partition 7019, a step of forming a resist mask can be omitted.

The EL layer 7014 which is formed over the first electrode 7013 and the partition 7019 may include at least a light-emitting layer and be formed using a single layer or a plurality of layers stacked. When the EL layer 7014 is formed using a plurality of layers, an electron-injection layer, an electron-transport layer, a light-emitting layer, a hole-transport layer, and a hole-injection layer are stacked in that order over the first electrode 7013 which serves as a cathode. Note that not all of these layers need to be provided except for the light-emitting layer.

The stacking order is not limited to the above stacking order, and a hole-injection layer, a hole-transport layer, a light-emitting layer, an electron-transport layer, and an electron-injection layer may be stacked in that order over the first electrode 7013 which serves as an anode. However, compared to the above case, in the case where the first electrode 7013 serves as a cathode and an electron-injection layer, an electron-transport layer, a light-emitting layer, a hole-transport layer, and a hole-injection layer are stacked in that order over the first electrode 7013, voltage rise in the driver circuit portion can be suppressed and power consumption can be decreased.

As the second electrode 7015 formed over the EL layer 7014, various materials can be used. For example, when the second electrode 7015 is used as an anode, it is preferable to use a material having a relatively high work function, such as ZrN, Ti, W, Ni, Pt, Cr, or a light-transmitting conductive material of ITO, IZO, or ZnO. Further, a light-blocking film 7016, a metal which blocks light, a metal which reflects light, or the like is provided over the second electrode 7015. In this embodiment, an ITO film is used as the second electrode 7015 and a Ti film is used as the light-blocking film 7016.

The light-emitting element 7012 corresponds to a region where the first electrode 7013, the EL layer 7014, and the second electrode 7015 are stacked. In the case of the element structure illustrated in FIG. 19A, light is emitted from the light-emitting element 7012 to the first electrode 7013 side as indicated by an arrow.

Note that in FIG. 19A, light emitted from the light-emitting element 7012 passes through a color filter layer 7033, an insulating layer 7032, an oxide insulating layer 7031, a gate insulating layer 7030, and a substrate 7010 to be emitted.

The color filter layer 7033 can be formed with a droplet discharge method such as an inkjet method, a printing method, an etching method with the use of a photolithography technique, or the like.

The color filter layer 7033 is covered with the overcoat layer 7034 and the protective insulating layer 7035. Note that although the overcoat layer 7034 is illustrated to have a small thickness in FIG. 19A, the overcoat layer 7034 has also a function of reducing unevenness caused by the color filter layer 7033. Note that the overcoat layer 7034 can be formed using a resin material such as an acrylic resin.

A contact hole which is formed in the oxide insulating layer 7031, the insulating layer 7032, the color filter layer 7033, the overcoat layer 7034, and the protective insulating layer 7035, and which reaches the drain electrode layer is formed in a portion which overlaps with the partition 7019.

Next, a light-emitting element having a dual emission structure will be described with reference to FIG. 19B.

In FIG. 19B, a first electrode 7023, an EL layer 7024, and a second electrode 7025 which are included in a light-emitting element 7022 are stacked in that order over a light-transmitting conductive layer 7027 which is electrically connected to the drain electrode layer of the transistor 7021.

As the light-transmitting conductive layer 7027, a light-transmitting conductive film such as a film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

Any of a variety of materials can be used for the first electrode 7023. For example, when the first electrode 7023 serves as a cathode, the first electrode 7023 is preferably formed using a material having a relatively low work function such as an alkali metal (such as Li or Cs); an alkaline earth metal (such as Mg, Ca, or Sr); an alloy containing any of the alkali metals and the alkaline earth metals (e.g., Mg:Ag or Al:Li); or a rare earth metal (such as Yb or Er). In this embodiment, the first electrode 7023 serves as a cathode and the thickness of the first electrode 7023 is formed to a thickness enough to transmit light (preferably, approximately 5 nm to 30 nm). For example, an aluminum film with a thickness of 20 nm is used for the first electrode 7023.

Alternatively, a light-transmitting conductive film and an aluminum film may be stacked and then selectively etched so as to form the light-transmitting conductive layer 7027 and the first electrode 7023. In this case, the etching can be performed using the same resist mask.

The periphery of the first electrode 7023 is covered with a partition 7029. The partition 7029 can be formed using an organic resin film of polyimide, acrylic, polyamide, epoxy, or the like; an inorganic insulating film; or organic polysiloxane. In the case where a photosensitive resin material is used for the partition 7029, a step of forming a resist mask can be omitted.

The EL layer 7024 which is formed over the first electrode 7023 and the partition 7029 may include at least a light-emitting layer and be formed using a single layer or a plurality of layers stacked. When the EL layer 7024 is formed using a plurality of layers, an electron-injection layer, an electron-transport layer, a light-emitting layer, a hole-transport layer, and a hole-injection layer are stacked in that order over the first electrode 7023 serving as a cathode. Note that not all of these layers need to be provided except for the light-emitting layer.

The stacking order is not limited to the above; the first electrode 7023 is used as an anode and a hole-injection layer, a hole-transport layer, a light-emitting layer, an electron-transport layer, and an electron-injection layer may be stacked in that order over the first electrode 7023. However, compared to the above case, in the case where the first electrode 7023 serves as a cathode, and an electron-injection layer, an electron-transport layer, a light-emitting layer, a hole-transport layer, and a hole-injection layer are stacked in that order over the first electrode 7023, voltage rise in the driver circuit portion can be suppressed and power consumption can be decreased.

As the second electrode 7025 formed over the EL layer 7024, various materials can be used. For example, when the second electrode 7025 is used as an anode, it is preferable to use a material having a relatively high work function, such as a light-transmitting conductive material of ITO, IZO, or ZnO. In this embodiment, the second electrode 7025 is used as an anode, and an ITO film containing silicon oxide is formed.

The light-emitting element 7022 corresponds to a region where the first electrode 7023, the EL layer 7024, and the second electrode 7025 are stacked. In the case of the element structure illustrated in FIG. 19B, light emitted from the light-emitting element 7022 is ejected from both the second electrode 7025 side and the first electrode 7023 side as indicated by arrows.

Note that in FIG. 19B, light emitted from the light-emitting element 7022 to the first electrode 7023 side passes through a color filter layer 7043, an insulating layer 7042, an oxide insulating layer 7041, a first gate insulating layer 7040, and a substrate 7020 to be emitted.

The color filter layer 7043 can be formed with a droplet discharge method such as an inkjet method, a printing method, an etching method with the use of a photolithography technique, or the like.

The color filter layer 7043 is covered with the overcoat layer 7044 and the protective insulating layer 7045.

A contact hole which is formed in the oxide insulating layer 7041, the insulating layer 7042, the color filter layer 7043, the overcoat layer 7044, and the protective insulating layer 7045, and which reaches the drain electrode layer is formed in a portion which overlaps with the partition 7029.

Note that in the case where the light-emitting element having a dual emission structure is used and full color display is performed on both display surfaces, light from the second electrode 7025 side does not pass through the color filter layer 7043; therefore, a sealing substrate provided with another color filter layer is preferably provided on the second electrode 7025.

Next, a light-emitting element having a top emission structure will be described with reference to FIG. 19C.

In FIG. 19C, a first electrode 7003 of the light-emitting element 7002 is formed to be electrically connected to the drain electrode layer of the transistor 7001, and an EL layer 7004 and the second electrode 7005 are stacked in that order over the first electrode 7003.

The first electrode 7003 can be formed using any of a variety of materials. For example, when the first electrode 7003 is used as a cathode, the first electrode 7003 is preferably formed using a material having a relatively low work function such as an alkali metal (such as Li or Cs); an alkaline earth metal (such as Mg, Ca, or Sr); an alloy containing any of the alkali metals and the alkaline earth metals (e.g., Mg:Ag or Al:Li); or a rare earth metal (such as Yb or Er).

The periphery of the first electrode 7003 is covered with a partition 7009. The partition 7009 can be formed using an organic resin film of polyimide, acrylic, polyamide, epoxy, or the like; an inorganic insulating film; or organic polysiloxane. In the case where a photosensitive resin material is used for the partition 7009, a step of forming a resist mask can be omitted.

The EL layer 7004 which is formed over the first electrode 7003 and the partition 7009 may include at least a light-emitting layer and be formed using a single layer or a plurality of layers stacked. When the EL layer 7004 is formed using a plurality of layers, the EL layer 7004 is formed by stacking an electron-injection layer, an electron-transport layer, a light-emitting layer, a hole-transport layer, and a hole-injection layer in that order over the first electrode 7003. Note that not all of these layers need to be provided except for the light-emitting layer.

The stacking order is not limited to the above stacking order, and a hole-injection layer, a hole-transport layer, a light-emitting layer, an electron-transport layer, and an electron-injection layer may be stacked in that order over the first electrode 7003.

In this embodiment, a hole-injection layer, a hole-transport layer, a light-emitting layer, an electron-transport layer, and an electron-injection layer are stacked in that order over a laminate film in which a titanium film, an aluminum film, and a titanium film are stacked in that order, and thereover, a stacked layer of a Mg:Ag alloy thin film and ITO is formed.

Note that when the transistor 7001 is an n-channel transistor, it is preferable that an electron-injection layer, an electron-transport layer, a light-emitting layer, a hole-transport layer, and a hole-injection layer be stacked in that order over the first electrode 7003 because voltage rise in the driver circuit can be suppressed and power consumption can be decreased.

The second electrode 7005 is made of a light-transmitting conductive material such as indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added.

The light-emitting element 7002 corresponds to a region where the first electrode 7003, the EL layer 7004, and the second electrode 7005 are stacked. In the case of the pixel illustrated in FIG. 19C, light is emitted from the light-emitting element 7002 to the second electrode 7005 side as indicated by arrows.

The drain electrode layer of the transistor 7001 is electrically connected to the first electrode 7003 through a contact hole formed in the oxide insulating layer 7051, the protective insulating layer 7052, and the insulating layer 7055.

A planarizing insulating layer 7053 can be formed using a resin material such as polyimide, acrylic, benzocyclobutene, polyamide, or epoxy. In addition to such resin materials, it is also possible to use a low-dielectric constant material (low-k material), a siloxane-based resin, phosphosilicate glass (PSG), borophosphosilicate glass (BPSG), or the like. Note that the planarizing insulating layer 7053 may be formed by stacking a plurality of insulating films formed of these materials. There is no particular limitation on the method for forming the planarizing insulating layer 7053, and the planarizing insulating layer 7053 can be formed, depending on the material, with a method such as a sputtering method, an SOG method, spin coating, dipping, spray coating, or a droplet discharge method (e.g., an ink-jet method, screen printing, or offset printing), or with a tool (equipment) such as a doctor knife, a roll coater, a curtain coater, or a knife coater.

The partition 7009 is provided so as to insulate the first electrode 7003 and a first electrode of an adjacent pixel. The partition 7009 can be formed using an organic resin film of polyimide, acrylic, polyamide, epoxy, or the like; an inorganic insulating film; or organic polysiloxane. In the case where a photosensitive resin material is used for the partition 7009, a step of forming a resist mask can be omitted.

In the structure illustrated in FIG. 19C, for performing full-color display, the light-emitting element 7002, one of light-emitting elements adjacent to the light-emitting element 7002, and the other of the light-emitting elements are, for example, a green light-emitting element, a red light-emitting element, and a blue light-emitting element, respectively. Alternatively, a light-emitting display device capable of full color display may be manufactured using four kinds of light-emitting elements which include a white light-emitting element in addition to the three kinds of light-emitting elements.

Alternatively, a light-emitting display device capable of full color display may be manufactured in such a way that all of a plurality of light-emitting elements which is arranged is white light-emitting elements and a sealing substrate having a color filter or the like is arranged on the light-emitting element 7002. A material which exhibits a single color such as white is formed and combined with a color filter or a color conversion layer, whereby full color display can be performed.

Needless to say, display of monochromatic light can also be performed. For example, a lighting system may be formed with the use of white light emission, or an area-color light-emitting device may be formed with the use of a single color light emission.

If necessary, an optical film such as a polarizing film including a circularly polarizing plate may be provided.

Note that, although the organic EL elements are described here as the light-emitting elements, an inorganic EL element can also be provided as a light-emitting element.

Note that the example is described in which a transistor which controls the driving of a light-emitting element is electrically connected to the light-emitting element; however, a structure may be employed in which a transistor for current control is connected between the transistor and the light-emitting element.

The structure of the display device described in this embodiment is not limited to those illustrated in FIGS. 19A to 19C and can be modified in various ways based on the spirit of techniques of the present invention.

Next, the appearance and the cross section of a light-emitting display panel (also referred to as a light-emitting panel) which corresponds to one embodiment of a display device to which the transistor described in Embodiments 1 and 2 is applied are described with reference to FIGS. 22A and 22B. FIG. 22A is a top view of a panel in which a transistor and a light-emitting element are sealed between a first substrate and a second substrate with a sealant. FIG. 22B is a cross-sectional view taken along line H-I of FIG. 22A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of transistors, and the transistor 4510 included in the pixel portion 4502 and the transistor 4509 included in the signal line driver circuit 4503a are illustrated as an example in FIG. 22B.

For each of the transistors 4509 and 4510, a highly reliable transistor including an In—Ga—Zn—O-based film as an oxide semiconductor layer as described in Embodiments 1 and 2 can be applied. In this embodiment, the transistors 4509 and 4510 are n-channel transistors.

Over an insulating layer 4544, a conductive layer 4540 is provided in a position overlapping with a channel formation region of an oxide semiconductor layer of the transistor 4509 used for a driver circuit. By providing the conductive layer 4540 so as to overlap with the channel formation region of the oxide semiconductor layer, the amount of change in the threshold voltage of the transistor 4509 between before and after the BT test can be reduced. A potential of the conductive layer 4540 is the same as that of a gate electrode layer of the transistor 4509, whereby the conductive layer 4540 can function as a second gate electrode layer. Alternatively, the conductive layer 4540 may be given a potential different from that of the gate electrode layer of the transistor 4509. Still alternatively, the potential of the conductive layer 4540 may be GND or 0 V, or the conductive layer 4540 may be in a floating state.

Moreover, reference numeral 4511 denotes a light-emitting element. A first electrode layer 4517 which is a pixel electrode included in the light-emitting element 4511 is electrically connected to a source or drain electrode layer of the transistor 4510. Note that a structure of the light-emitting element 4511 is a layered structure of the first electrode layer 4517, the electroluminescent layer 4512, and the second electrode layer 4513, but there is no particular limitation on the structure. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is preferable that the partition 4520 be formed using a photosensitive material and an opening be formed over the first electrode layer 4517 so that a sidewall of the opening is formed as an inclined surface with a curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potential are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed using the same conductive film that is used for the first electrode layer 4517 included in the light-emitting element 4511. A terminal electrode 4516 is formed using the same conductive film that is used for the source and drain electrode layers included in the transistors 4509 and 4510.

The connection terminal electrode 4515 is electrically connected to a terminal included in the FPC 4518a via an anisotropic conductive film 4519.

The substrate located in the direction in which light is extracted from the light-emitting element 4511 should have a light-transmitting property. In that case, a light-transmitting material such as a glass plate, a plastic plate, a polyester film, or an acrylic film is used for the substrate.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Driver circuits separately formed using a single crystal semiconductor or a polycrystalline semiconductor may be mounted as the signal line driver circuits 4503a and 4503b and the scan line driver circuits 4504a and 4504b. In addition, only the signal line driver circuits or part thereof, or the scan line driver circuits or part thereof may be separately formed and mounted. This embodiment is not limited to the structure illustrated in FIGS. 22A and 22B.

Through the above process, a highly reliable light-emitting display device (display panel) can be manufactured.

Note that the structure described in this embodiment can be used in combination with any of the structures described in other embodiments, as appropriate.

Embodiment 7

A display device to which the transistor described in any of Embodiment 1 and Embodiment 2 is applied can be used as electronic paper. Electronic paper can be used for electronic devices of a variety of fields as long as they can display data. For example, electronic paper can be applied to an e-book reader (electronic book), a poster, an advertisement in a vehicle such as a train, or displays of various cards such as a credit card. Examples of the electronic devices are illustrated in FIGS. 11A and 11B and FIG. 12.

Figure 11A:
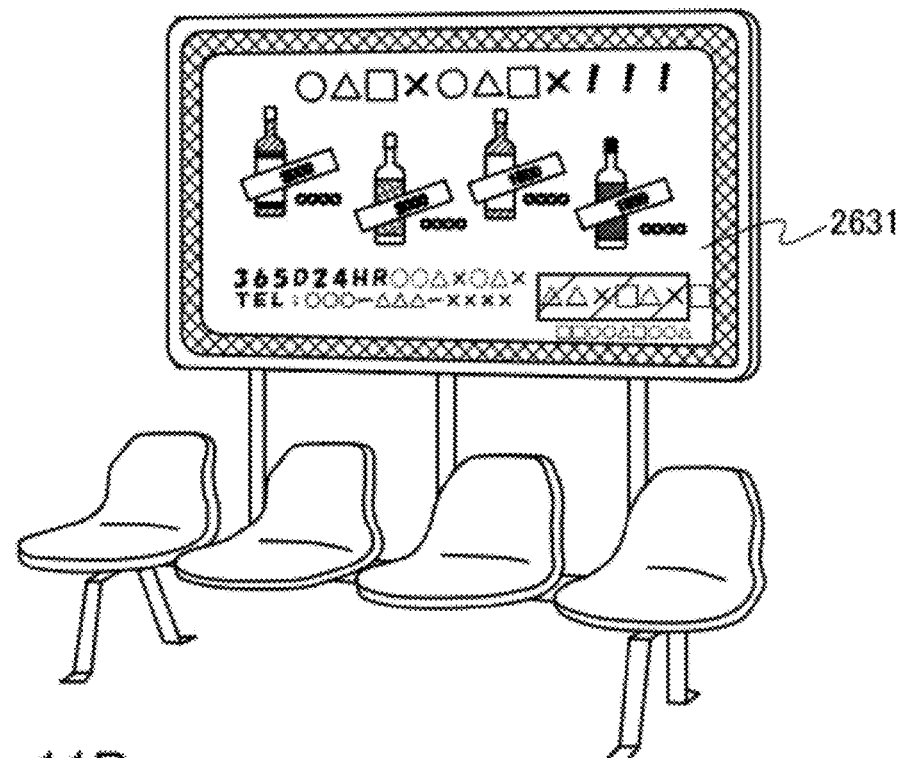
FIGS. 11A and 11B are diagrams each illustrating an example of application of a display device.

FIG. 11A illustrates a poster 2631 using electronic paper. In the case where an advertising medium is printed paper, the advertisement is replaced by hands; however, by using the electronic paper, the advertising display can be changed in a short time. Note that the poster 2631 may have a configuration capable of wirelessly transmitting and receiving data.

Figure 11B:
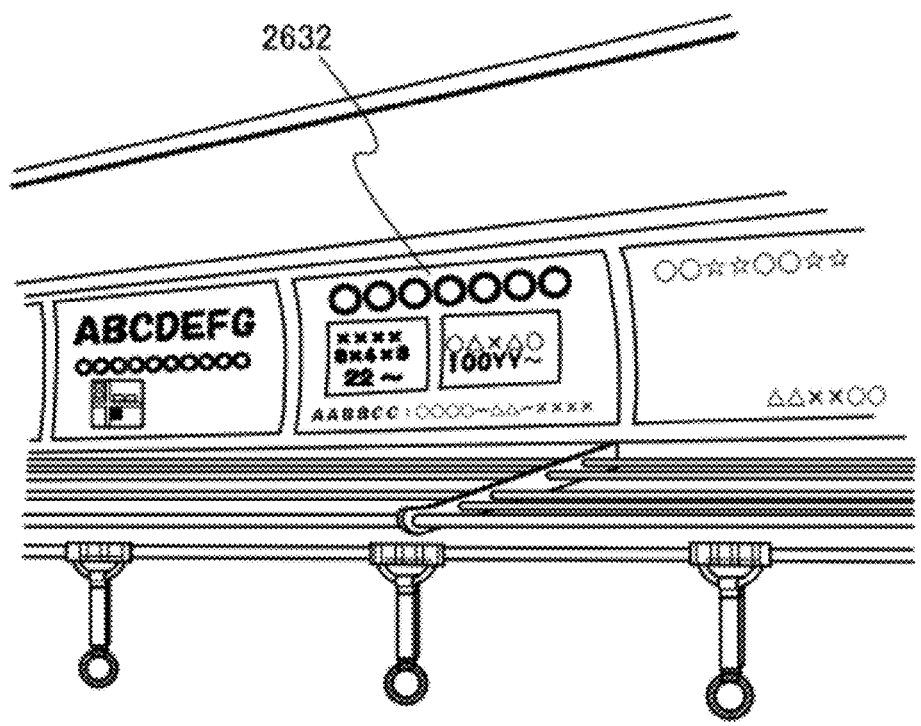

FIG. 11B illustrates an advertisement 2632 in a vehicle such as a train. In a case where an advertising medium is paper, the advertisement is replaced by hand, but in a case where it is electronic paper, much manpower is not needed and the advertising display can be changed in a short time. Furthermore, stable images can be obtained without display defects. Note that the advertisement in a vehicle may have a configuration capable of wirelessly transmitting and receiving data.

Figure 12:
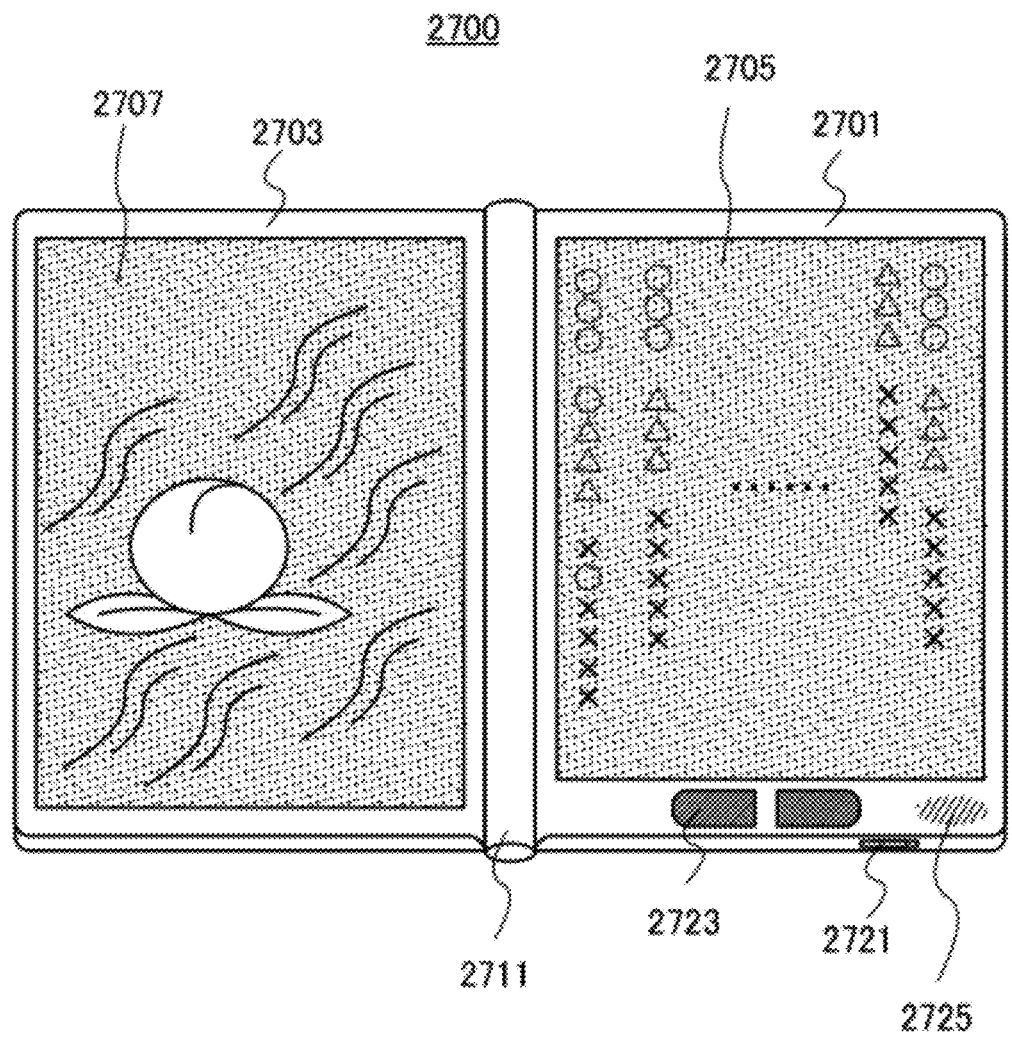
FIG. 12 is an external view illustrating an example of a display device.

FIG. 12 illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. Owing to such a structure, a reader can operate the e-book reader 2700 just like he/she reads a paper book.

A display portion 2705 and a display portion 2707 are incorporated in the housing 2701 and the housing 2703, respectively. The display portion 2705 and the display portion 2707 may display one image or different images. In the structure where different images are displayed in different display portions, for example, the right display portion (the display portion 2705 in FIG. 12) can display text and the left display portion (the display portion 2707 in FIG. 12) can display an image.

In the example illustrated in FIG. 12, the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Note that the structure described in this embodiment can be combined with any of the structures described in other embodiments, as appropriate.

Embodiment 8

A display device using the transistor described in any of Embodiment 1 and Embodiment 2 can be applied to a variety of electronic appliances (including an game machine). Examples of electronic devices are a television device (also referred to as a television or a television receiver), a monitor of a computer or the like, a camera such as a digital camera or a digital video camera, a digital photo frame, a mobile phone (also referred to as a mobile phone handset or a mobile phone device), a portable game console, a portable information terminal, an audio reproducing device, a large-sized game machine such as a pachinko machine, and the like.

Figure 23A:
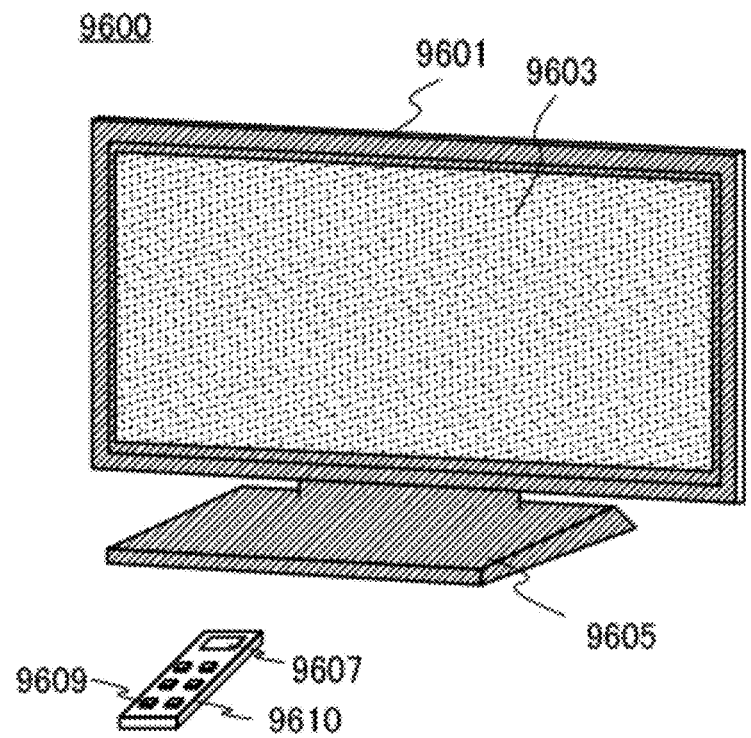
FIGS. 23A and 23B are external views illustrating examples of a television device and a digital photo frame, respectively.

FIG. 23A illustrates an example of a television device. In a television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote controller 9610. Channels and volume can be switched and controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television device 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 23B:
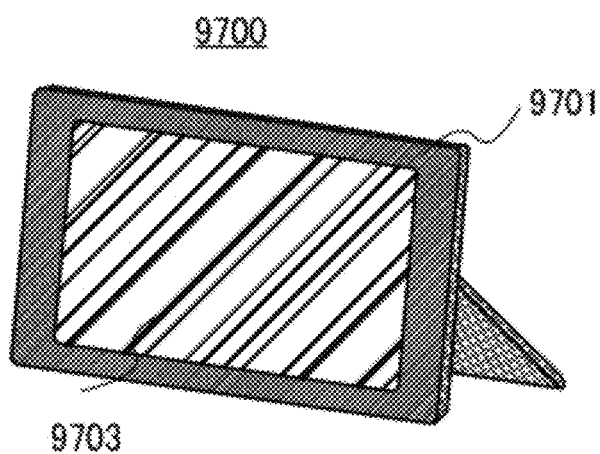

FIG. 23B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 24A:
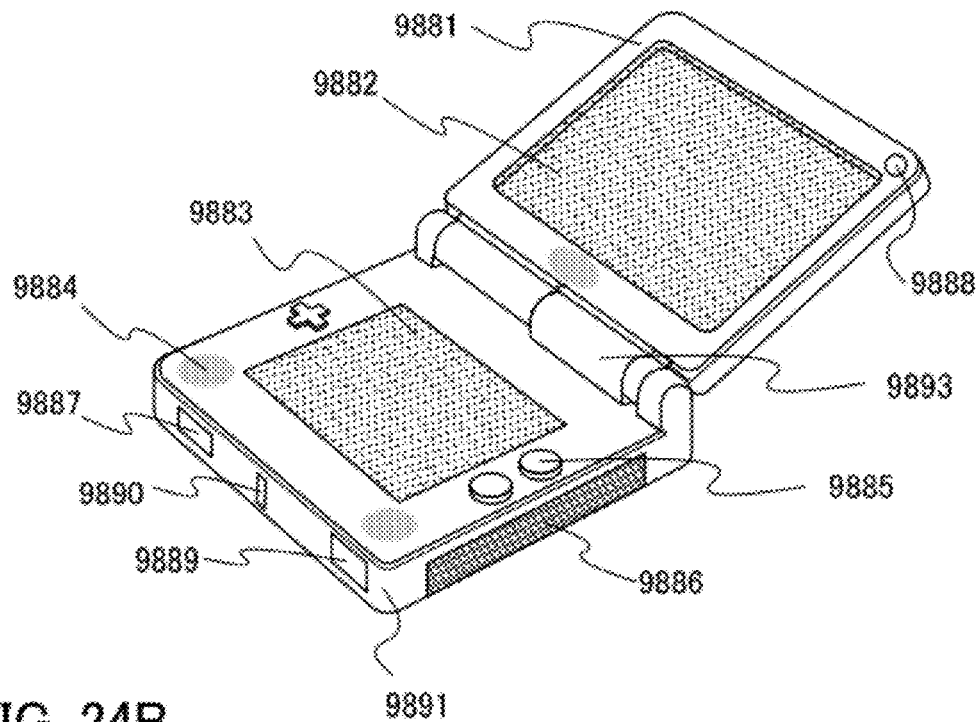
FIGS. 24A and 24B are external views illustrating examples of game machines.

FIG. 24A is a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively. In addition, the portable game machine illustrated in FIG. 24A is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable game machine is not limited to the above and other structures provided with at least a display device of the present invention may be employed. The portable game machine may include other accessories, as appropriate. The portable game machine illustrated in FIG. 24A has a function of reading a program or data stored in the recording medium to display it on the display portion, and a function of sharing information with another portable game machine by wireless communication. Note that a function of the portable game machine illustrated in FIG. 24A is not limited to the above, and the portable game machine can have a variety of functions.

Figure 24B:
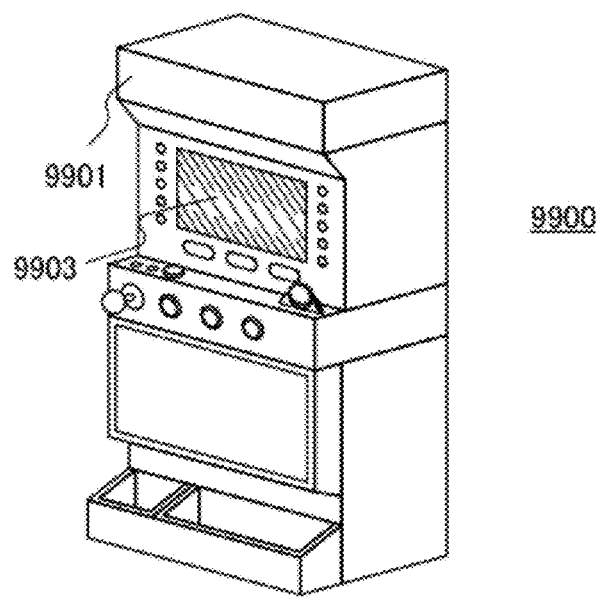

FIG. 24B illustrates an example of a slot machine which is a large-sized game machine. In a slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a display device of the present invention may be employed. The slot machine 9900 may include other accessories, as appropriate.

Figure 25A:
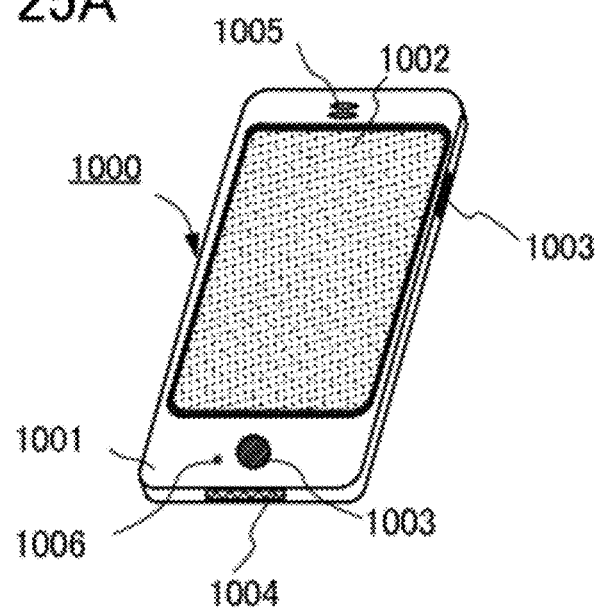
FIGS. 25A and 25B are external views illustrating examples of mobile phones.

FIG. 25A illustrates an example of a mobile phone. A mobile phone 1000 includes a display portion 1002 incorporated in a housing 1001, an operation button 1003, an external connection port 1004, a speaker 1005, a microphone 1006, and the like.

When the display portion 1002 illustrated in FIG. 25A is touched with a finger or the like, data can be input into the mobile phone 1000. Furthermore, operations such as making calls and sending and receiving mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in a case of making a call or composing a mail, a text input mode mainly for inputting text is selected for the display portion 1002 so that text displayed on a screen can be input.

When a detection device including a sensor for detecting inclination, such as a gyroscope or an acceleration sensor, is provided inside the mobile phone 1000, display in the screen of the display portion 1002 can be automatically switched by determining the installation direction of the mobile phone 1000 (whether the mobile phone 1000 is placed horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 25B:
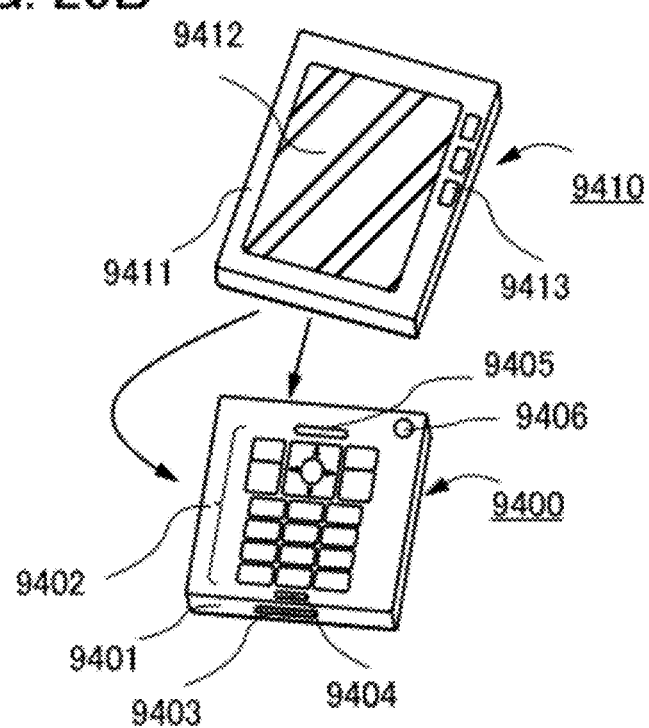

FIG. 25B also illustrates an example of a mobile phone. The mobile phone in FIG. 25B includes an a display device 9410 in which a display portion 9412 and an operation button 9413 are included in a housing 9411, and a communication device 9400 in which operation buttons 9402, an external input terminal 9403, a microphone 9404, a speaker 9405, and a light-emitting portion 9406 that emits light when a phone call is received are included in a housing 9401. The display device 9410 having a display function can be detached from or attached to the communication device 9400 having a telephone function in two directions as indicated by arrows. Thus, a short axis of the display device 9410 can be attached to a short axis of the communication device 9400, and a long axis of the display device 9410 can be attached to a long axis of the communication device 9400. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

Note that the structure described in this embodiment can be used in combination with any of the structures described in the other embodiments, as appropriate.

Embodiment 9

A phenomenon occurs in which oxygen moves when an oxide semiconductor layer is in contact with a metal layer or an oxide insulating layer. In this embodiment, differences between an amorphous oxide semiconductor layer and a crystalline oxide semiconductor layer are described using scientific computation on the phenomenon.

Figure 33:
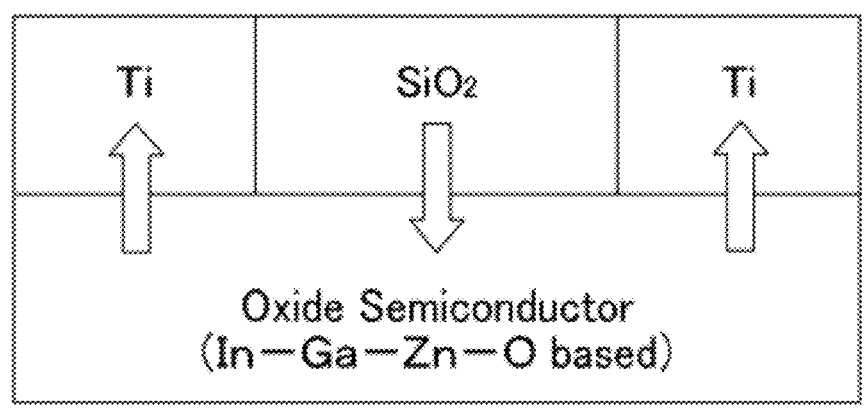
FIG. 33 is a diagram briefly illustrating scientific computing.

FIG. 33 is a schematic view of a state in which an oxide semiconductor layer is in contact with an oxide insulating layer and a metal layer to serve as a source electrode and a drain electrode in a structure of a transistor which is an embodiment of the present invention. The directions of arrows indicate direction of movement of oxygen in a state where these are in contact with each other or a state in which these are heated.

When oxygen vacancies occur, an i-type oxide semiconductor layer has n-type conductivity, whereas when oxygen is oversupplied, an n-type oxide semiconductor layer caused by oxygen vacancies becomes an i-type oxide semiconductor layer. This effect is utilized in an actual device process, and in the oxide semiconductor layer which is in contact with the metal layer to serve as a source electrode and a drain electrode, oxygen is pulled to the metal side, and oxygen vacancies occur in part of a region, which is in contact with the metal layer (in the case of a small thickness, in an entire region in the film thickness direction), whereby the oxide semiconductor layer becomes an n-type oxide semiconductor layer and favorable contact with the metal layer can be obtained. In addition, oxygen is supplied from an oxide insulating layer to the oxide semiconductor layer in contact with the oxide insulating layer, and part of a region of the oxide semiconductor layer, which is in contact with the oxide insulating layer (in the case of a small thickness, in the entire region in the film thickness direction), contains excessive oxygen, to be an i-type region, whereby the oxide semiconductor layer becomes an i-type oxide semiconductor layer and functions as a channel formation region of a transistor.

In an embodiment of the present invention, in a region where the oxide semiconductor layer is in contact with the oxide insulating layer and the metal layer to serve as a source electrode and a drain electrode, a crystal region of the oxide semiconductor is formed. Therefore, a difference in oxygen movement state was examined by scientific computing between the case where the region where the oxide semiconductor layer is in contact with the oxide insulating layer or the metal layer includes a crystal region and the case where the region where the oxide semiconductor layer is in contact with the oxide insulator or the metal layer is amorphous.

Figure 34A:
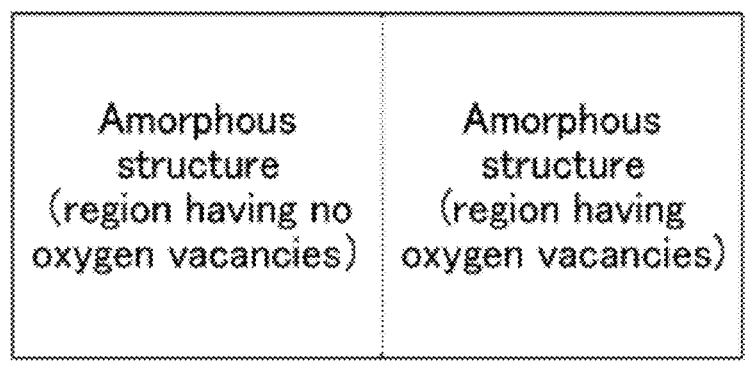
FIGS. 34A and 34B are diagrams briefly illustrating scientific computing.
Figure 34B:
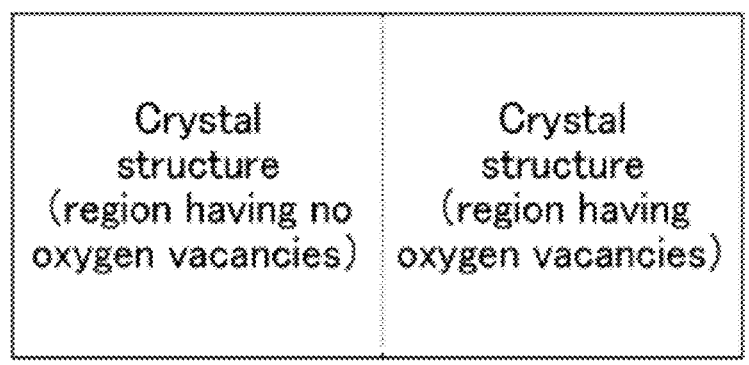

Models used for scientific computing have an In—Ga—Zn—O-based amorphous structure and an In—Ga—Zn—O-based crystal structure. In each of the models, one of regions in longitudinal direction of a rectangular solid was deficient in oxygen by 10% as compared to the other region (see FIGS. 34A and 34B). The calculation is to compare distribution of oxygen in the In—Ga—Zn—O-based amorphous structure and the In—Ga—Zn—O-based crystal structure, after ten nsec under an accelerated condition of 650° C. Respective conditions are shown in Table 1 and Table 2.

TABLE 1

| | Structural Conditions |
|---|---|
| Number of atoms | 317 atoms (Oxygen: 192 atoms) |
| Lattice constant | a = b = 1.3196 nm, c = 2.6101 nm, α = β = 90°, γ = 120° |
| Density | 6.23 g/cm$^3$ |

TABLE 2

| | Calculation contents |
|---|---|
| Ensemble | NTV (number of atoms, temperature, volume) |
| Temperature | 923 K |
| Time interval | 0.2 fs |

TABLE 2-continued

| | Calculation contents |
|---|---|
| Total of computation time | 10 ns |
| Potential | Type of Born-Mayer-Huggins is applied to Metal-Oxygen & Oxygen-Oxygen |
| Electric Charge | In: +3, Ga: +3, Zn: +2, O: −2 |

Figure 35A:
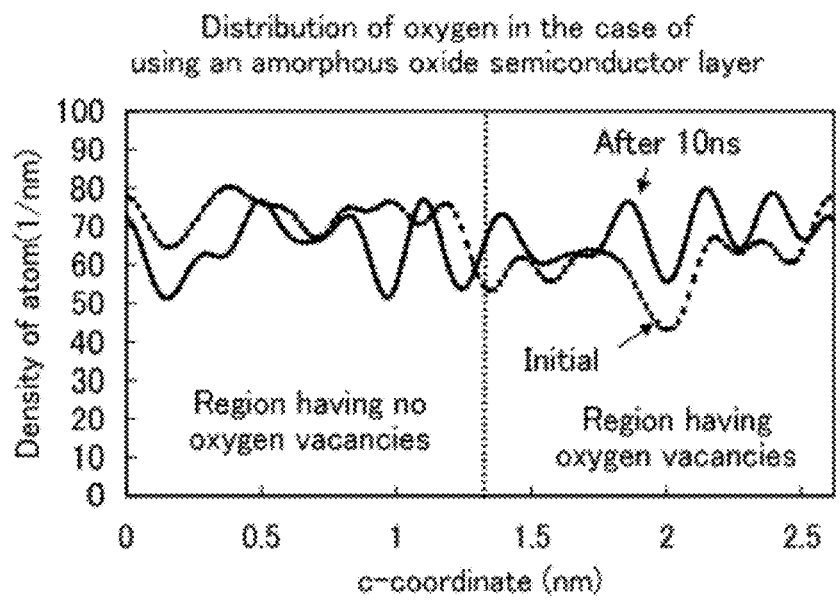
FIGS. 35A and 35B are diagrams illustrating scientific computation.
Figure 35B:
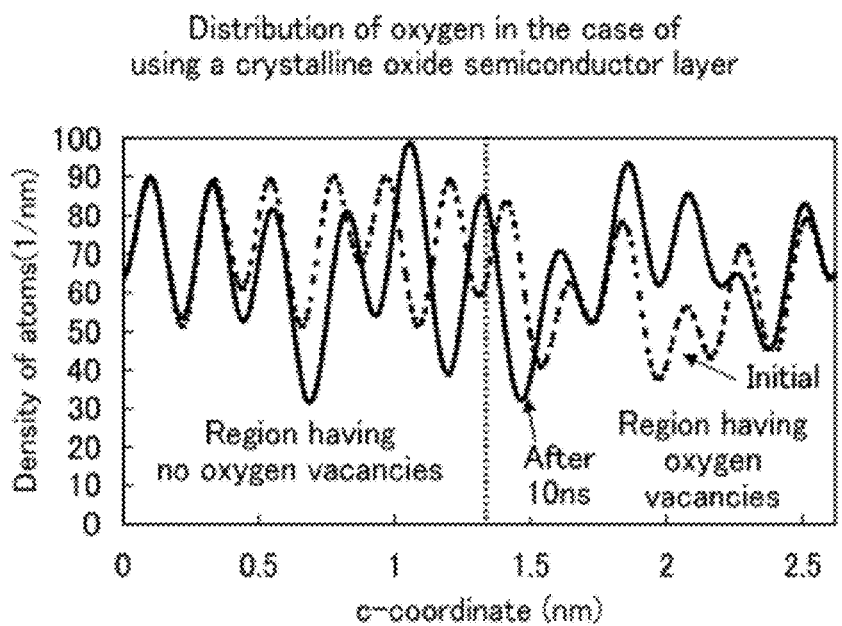

As the calculation results, distribution of oxygen in the case of using an amorphous oxide semiconductor layer is shown in FIG. 35A, and distribution of oxygen in the case of using a crystalline oxide semiconductor layer is shown in FIG. 35B. A dotted line indicates an initial state (Initial), and a solid line indicates a result (after ten nsec). It is found that oxygen moves regardless of whether the amorphous oxide semiconductor layer or the crystalline oxide semiconductor layer is used.

The increasing rates of oxygen atoms between before and after calculation in a region having oxygen vacancies were 15.9% in the case of the amorphous oxide semiconductor layer and 11.3% in the case of the crystalline oxide semiconductor layer. That is, oxygen in the amorphous oxide semiconductor layer is more likely to move than oxygen in the crystalline oxide semiconductor layer, resulting in easily compensating for the oxygen vacancies. In other words, oxygen in the crystalline oxide semiconductor layer is relatively less likely to move than oxygen in the amorphous oxide semiconductor layer.

Therefore, it is also found that oxygen moves in the oxide semiconductor layer in an embodiment of the present invention having the crystal region, in a manner similar to that of the case of the amorphous oxide semiconductor layer. It is also found that the crystal region has an effect in which elimination of oxygen from the oxide semiconductor layer is suppressed because oxygen is relatively less likely to move in the crystalline oxide semiconductor layer than in the amorphous oxide semiconductor layer.

Note that the structure described in this embodiment can be used in combination with any of the structures described in other embodiments, as appropriate.

Example 1

In this example, a state of the oxide semiconductor film which is subjected to dehydration or dehydrogenation at high temperature in a short time with an RTA method was analyzed with a TEM analysis, a TEM-EDX analysis, an X-ray diffraction analysis, and an SIMS analysis, and the results are described.

Samples used for analysis are In—Ga—Zn—O-based films each formed in accordance with Embodiment 2 with the use of an oxide semiconductor deposition target whose molar ratio of $In_2O_3$ to $Ga_2O_3$ to ZnO is 1:1:1. There are three kinds of samples: a sample A, and a sample B and a sample C which are comparative examples. The sample A is formed in such a manner that a heating step is performed in a nitrogen gas atmosphere at 650° C. for six minutes using an RTA apparatus. The sample B is formed in such a manner that a heating step is performed in a nitrogen gas atmosphere at 450° C. for one hour using an electric furnace, and the sample C (as-depo) is in a non-heating state.

Figure 26A:
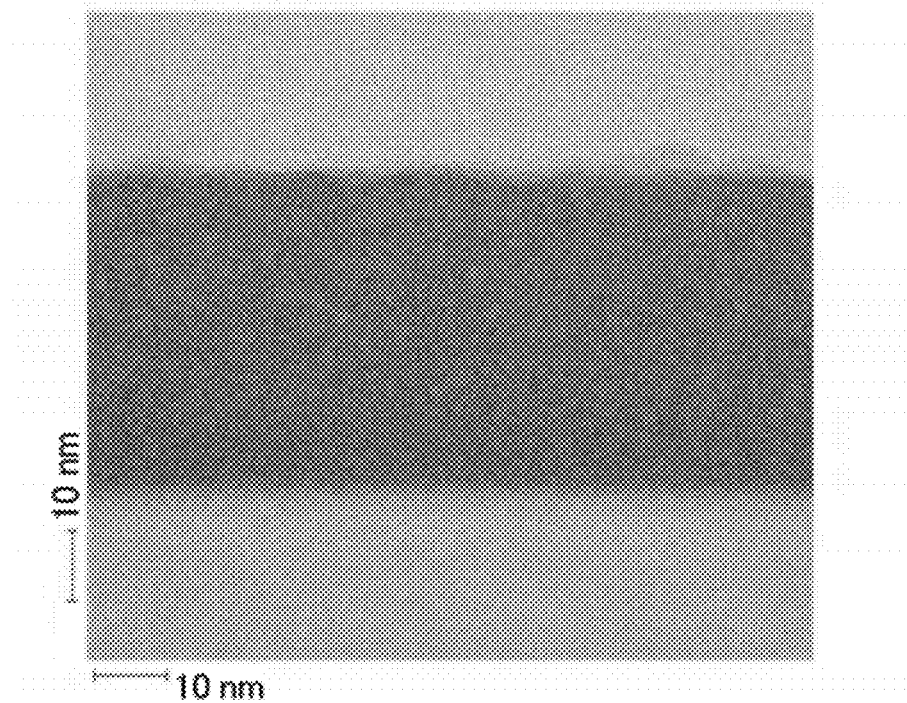
FIGS. 26A and 26B are TEM photographs of a cross section of an oxide semiconductor layer.
Figure 26B:
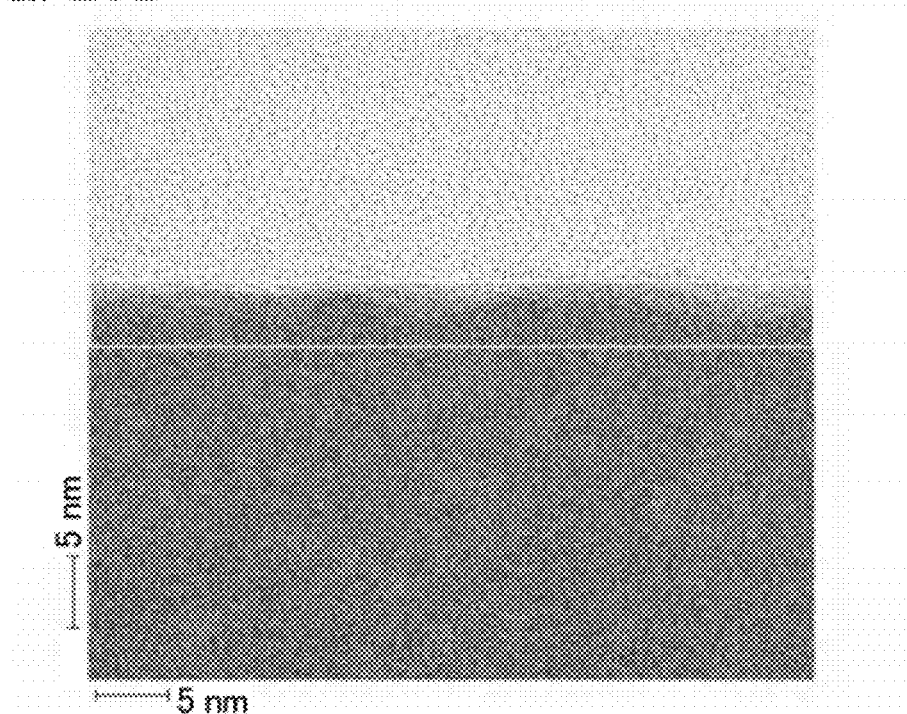
Figure 27A:
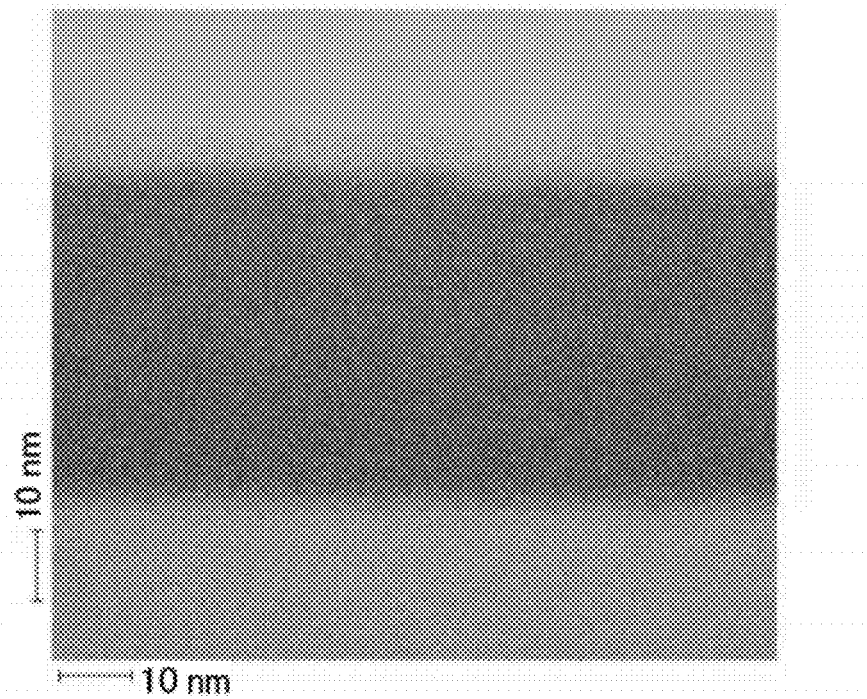
FIGS. 27A and 27B are TEM photographs of a cross section of an oxide semiconductor layer.
Figure 27B:
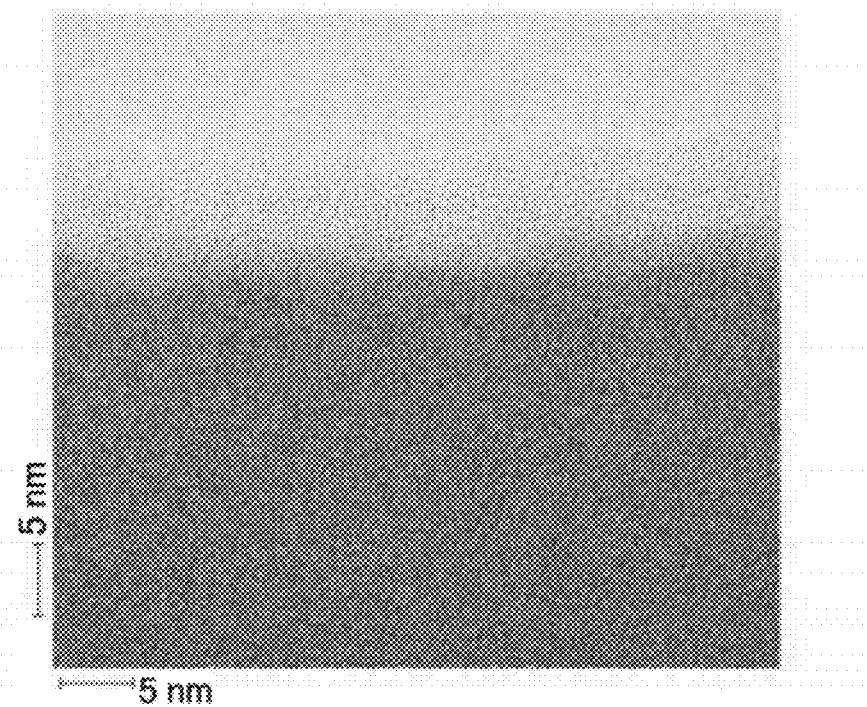
Figure 28A:
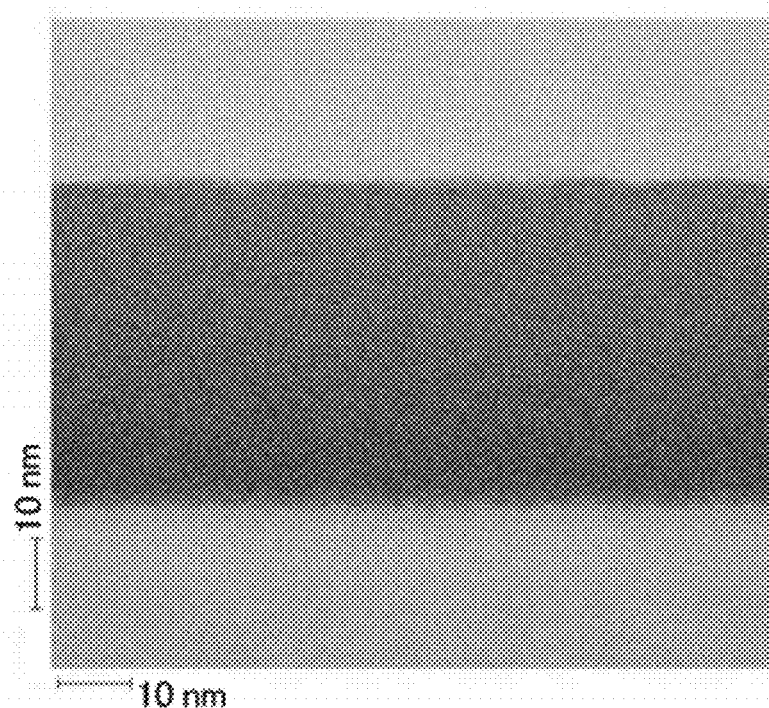
FIGS. 28A and 28B are TEM photographs of a cross section of an oxide semiconductor layer.
Figure 28B:
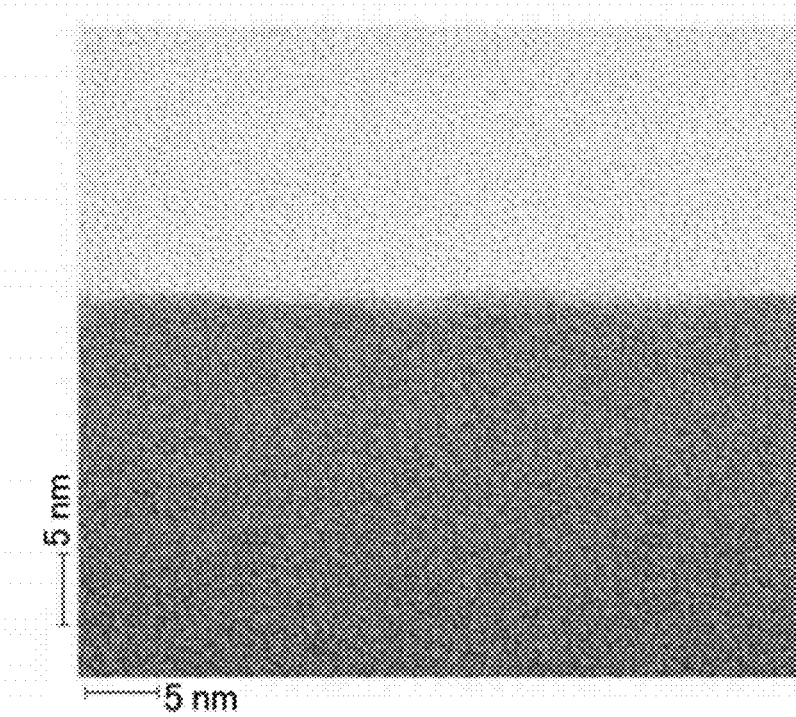

First, a cross section of a crystalline state of each sample was observed at an acceleration voltage of 300 kV using a high resolution transmission electron microscope ("H9000-NAR" manufactured by Hitachi, Ltd.: TEM) to examine the crystalline state of each sample. Cross-sectional photographs of the sample A, the sample B, and the sample C are illustrated in FIGS. 26A and 26B, FIGS. 27A and 27B, and FIGS. 28A and 28B, respectively. Note that FIG. 26A, FIG. 27A, and FIG. 28A are low magnification photographs (two million-fold magnification) and FIG. 26B, FIG. 27B, and FIG. 28B are high magnification photographs (four million-fold magnification).

A continuous lattice image was observed in a superficial portion of a cross section of the sample A which is heated at 650° C. for six minutes with an RTA method in FIGS. 26A and 26B. In particular, in the high magnification photograph of FIG. 26B, a clear lattice image is observed in a region surrounded by a white frame, and the existence of microcrystals whose crystal axes are aligned is indicated. Accordingly, it is found that the superficial portion of the In—Ga—Zn—O-based film is crystallized by performing heating at 650° C. for as short as approximately six minutes with an RTA method and a crystal region is provided. Note that in a region except for the superficial portion, a clear continuous lattice image is not observed and a state where microcrystalline particles exist here and there in an amorphous region is found. The microcrystals are so-called nanocrystals each with a grain size of from 2 nm to 4 nm.

On the other hand, a clear lattice image was not observed in any region in a thickness direction from the cross-sectional photographs of FIGS. 27A and 27B (the sample B) and FIGS. 28A and 28B (the sample C), so that it is found that the sample B and the sample C are amorphous.

Figure 29A:
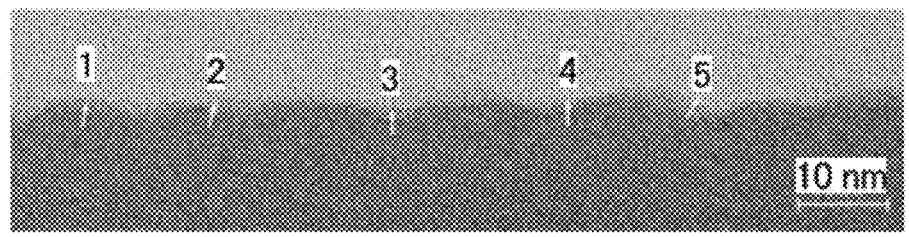
FIGS. 29A and 29B are a TEM photograph of a cross section of an oxide semiconductor layer and an electron diffraction pattern, respectively.
Figure 29B:
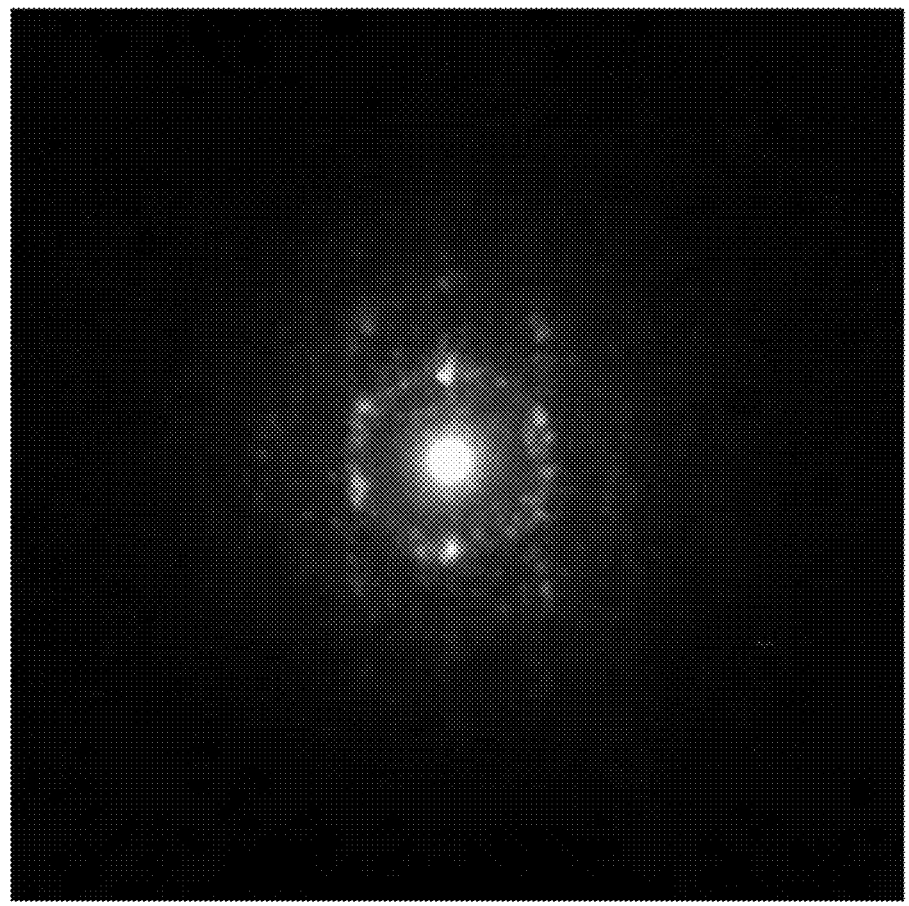
Figure 36:
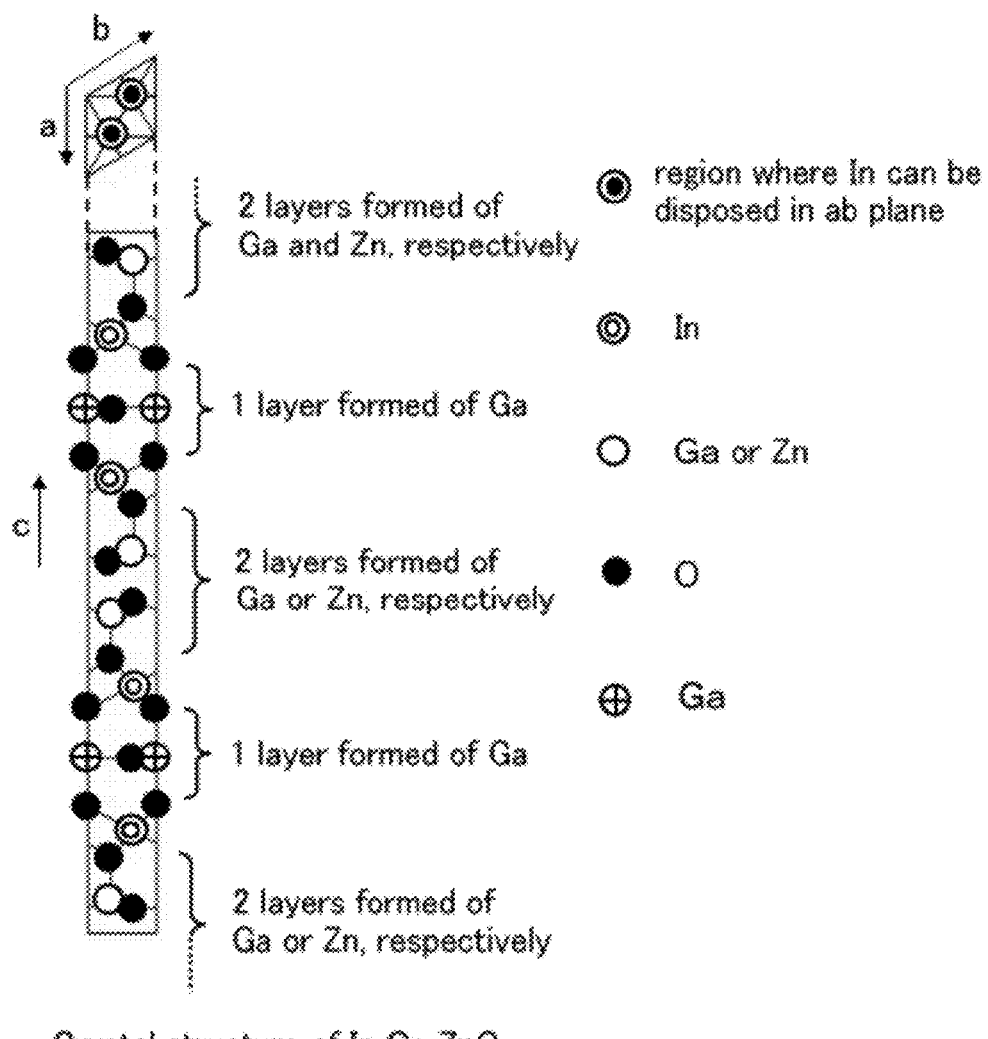
FIG. 36 is a diagram illustrating a crystal structure of an oxide semiconductor.

A macrophotography of the superficial portion of the sample A which is heated at 650° C. for six minutes with an RTA method, and an electron diffraction pattern of a crystal region are shown in FIGS. 29A and 29B, respectively. Directional arrows 1 to 5 indicating directions where lattice images are aligned are illustrated in the macrophotography of the superficial portion (FIG. 29A), and crystals are grown in a direction perpendicular to a surface of the film. The electron diffraction pattern shown in FIG. 29B is observed at a position indicated by the arrow 3, and a c-axis orientation is found. As a result of comparison between this electron diffraction pattern and a known lattice constant, it became clear that a crystal structure is $In_2Ga_2ZnO_7$ (see FIG. 36).

FIG. 30 shows results of analysis with TEM-EDX (energy dispersive X-ray spectrometry) of a cross section of the superficial portion of the sample A. A material target whose molar ratio of $In_2O_3$ to $Ga_2O_3$ to ZnO is 1:1:1 was used, while it is found that the composition ratio of the superficial portion, In or Ga is 1 whereas Zn is from 0.3 to 0.4, so that Zn is slightly deficient.

Figure 31:
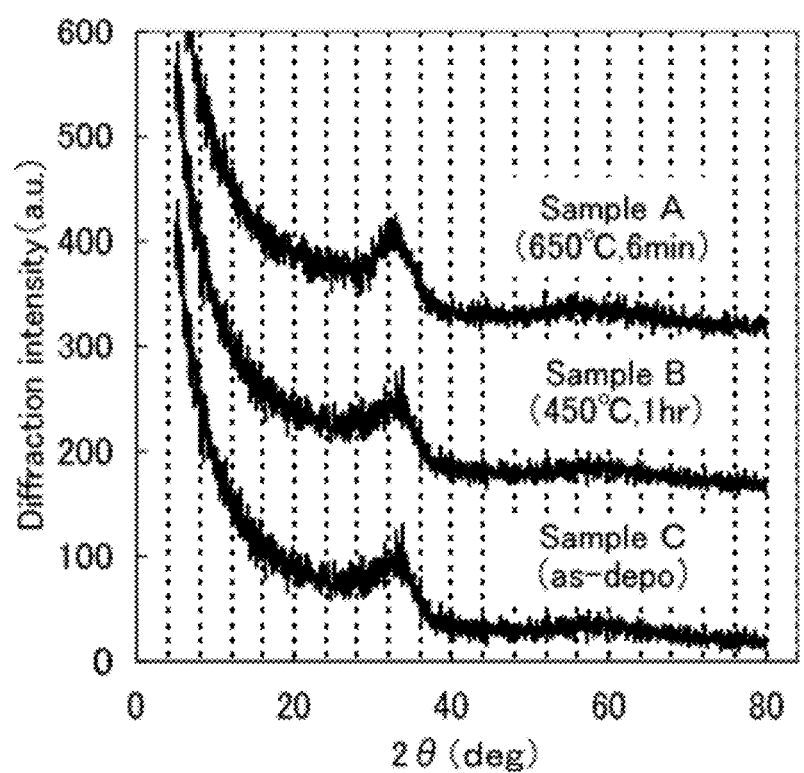
FIG. 31 is an X-ray diffraction chart of an oxide semiconductor layer.

Next, results of analysis of crystalline states of the same samples of three kinds with an X-ray diffraction analysis are shown in FIG. 31. In the chart of the samples, a peak seen when 2θ is 30 to 36 degrees is data derived from an In—Ga—Zn—O-based material and is broad; therefore, an amorphous state is reflected. However, the peak position of the sample A which is heated at 650° C. for six minutes with an RTA method is on the lower angle side than the sample B and the sample C, indicating the existence of a diffraction peak obtained from a (009) plane or a (101) plane, which show the strongest diffraction intensity in the In—Ga—Zn—O-based crystal materials. Therefore, it is also confirmed with the X-ray diffraction analysis that the sample A has a crystal region.

Figure 32A:
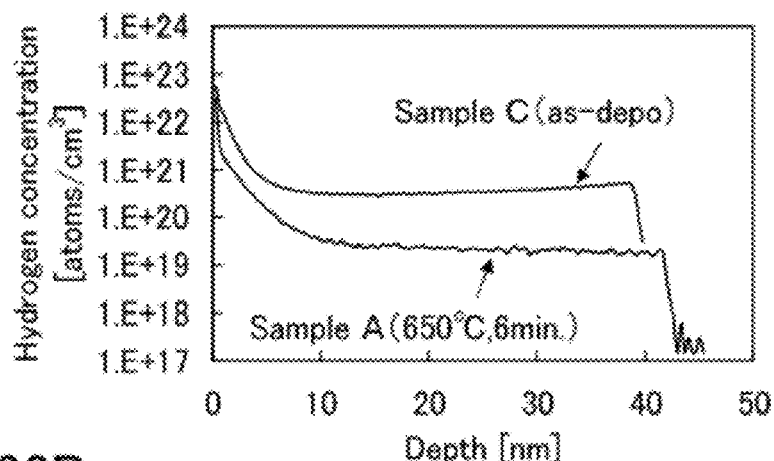
FIGS. 32A to 32C are SIMS analysis depth profiles of oxide semiconductor layers.
Figure 32B:
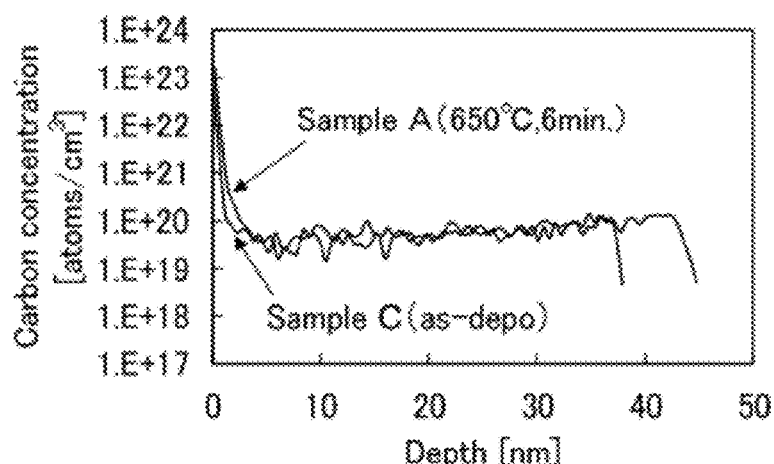
Figure 32C:
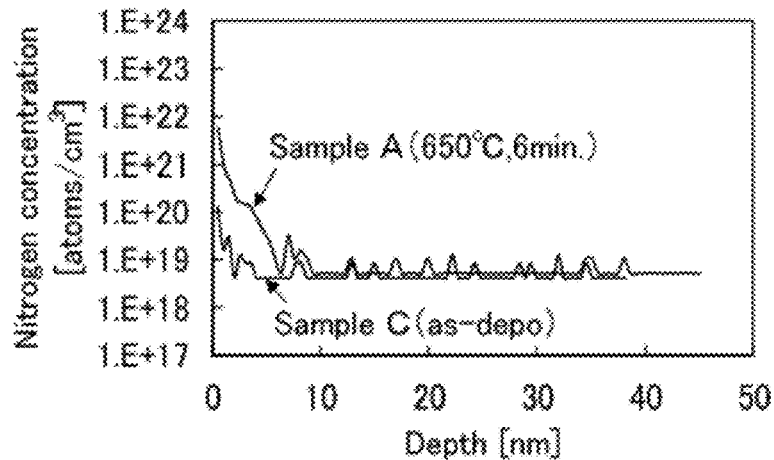

Next, results of analysis of the hydrogen concentration, the carbon concentration, and the nitrogen concentration in a film of each of the sample A and the sample C with secondary ion mass spectrometry (SIMS) are shown in FIGS. 32A to 32C. A horizontal axis indicates a depth from surfaces of the samples, and a left end where the depth is 0 nm corresponds to the outermost surfaces of the samples (outermost surfaces of the oxide semiconductor layers), and analysis is performed from the surface side.

FIG. 32A illustrates a hydrogen concentration profile. It turns out that the hydrogen concentration of the profile of the sample A decreases by greater than or equal to one digit as compared to that of the profile of the sample C, and it is confirmed that the dehydration or dehydrogenation was effectively performed at 650° C. for six minutes with an RTA method. Note that the profile of the sample A and the profile of the sample C are quantified using a reference sample formed with the use of an In—Ga—Zn—O-based oxide semiconductor layer similarly to the samples.

It is known that it is difficult to accurately obtain data in the proximity of a surface of a sample or in the proximity of an interface between laminate films formed using different materials with the SIMS analysis in principle. In this analysis, the profile of from 15 nm to 35 nm in depth in the thickness of approximately 40 nm was an object of evaluation in order to obtain accurate data in the film.

It is found from the profile of the sample C that hydrogen is contained in the oxide semiconductor layer which is not subjected to dehydrogenation at approximately $3\times10^{20}$ atoms/cm$^3$ to approximately $5\times10^{20}$ atoms/cm$^3$ and at an average hydrogen concentration of approximately $4\times10^{20}$ atoms/cm$^3$. It is found from the profile of the sample A that the average hydrogen concentration in the oxide semiconductor layer can be reduced to approximately $2\times10^{19}$ atoms/cm$^3$ by dehydrogenation.

Figure 38A:
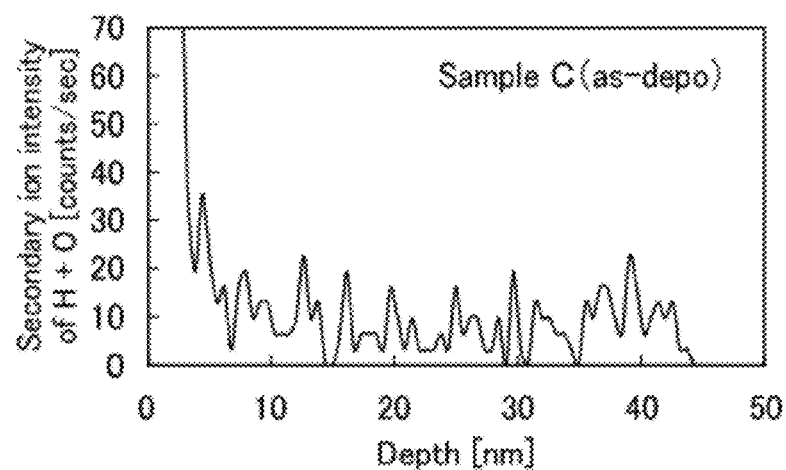
FIGS. 38A to 38C are SIMS analysis depth profiles of oxide semiconductor layers.
Figure 38B:
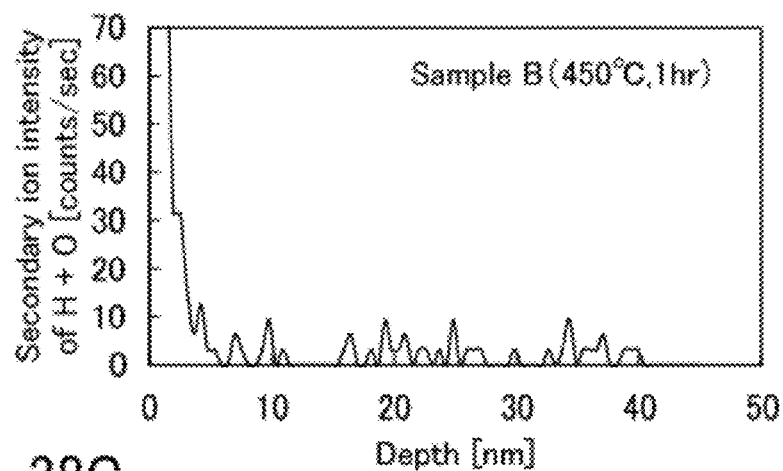
Figure 38C:
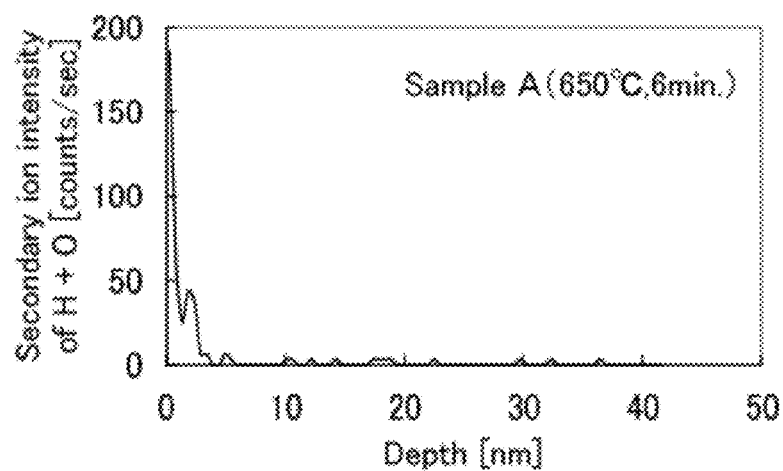
Figure 39A:
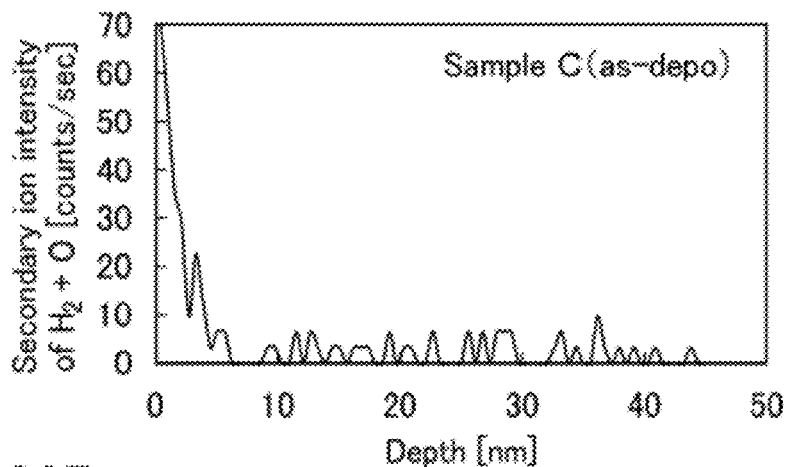
FIGS. 39A to 39C are SIMS analysis depth profiles of oxide semiconductor layers.
Figure 39B:
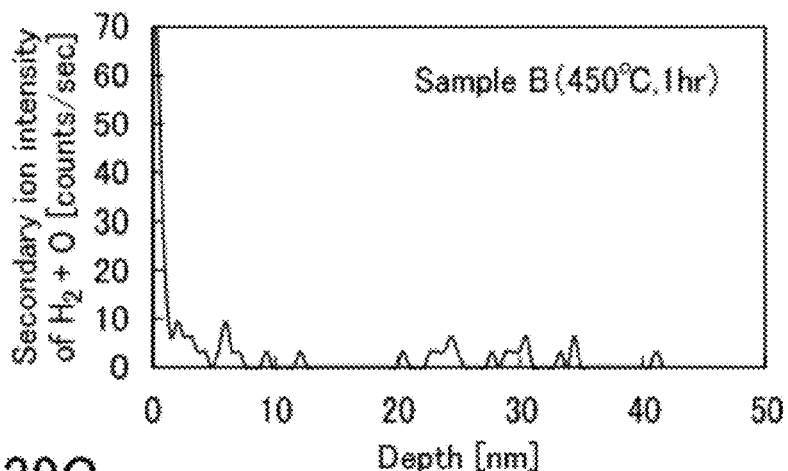
Figure 39C:
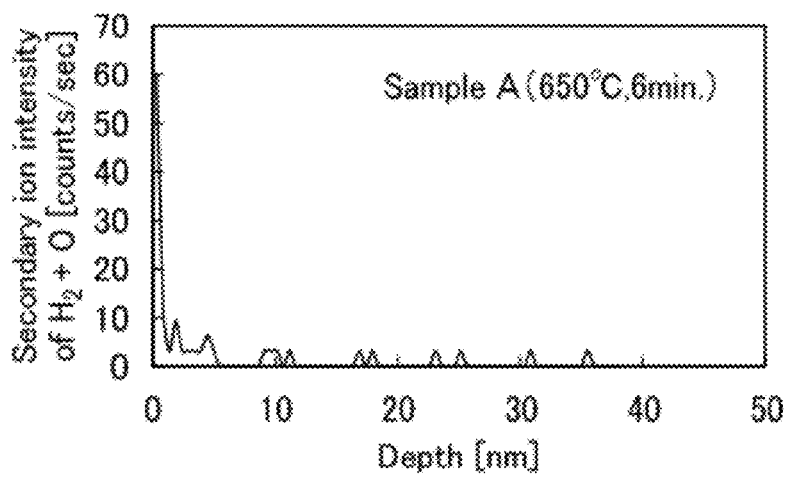

The carbon concentration profile is shown in FIG. 32B, and the nitrogen concentration profile is shown in FIG. 32C. Unlike the hydrogen concentration profile, neither the carbon concentration profile nor the nitrogen concentration profile has a sharp contrast between the sample A and the sample C, and it is confirmed that there is no discharge or entry of a carbon component and a nitrogen component due to heating at 650° C. for six minutes with an RTA method. The detection results of secondary ion intensity of "H"+"O" are shown in FIGS. 38A to 38C, and those of "H$_2$"+"O" are shown in FIGS. 39A to 39C. It is found that the samples processed at higher temperature have lower intensity in both "H"+"O" and "H$_2$"+"O" and that discharge of water or OH is efficiently performed by performing heating at 650° C. for six minutes with an RTA method.

From the results of analysis, it is found that the superficial portion of the sample which is heated at 650° C. in a short time of six minutes with an RTA method has a crystal region. It is also found that the hydrogen concentration in the oxide semiconductor layer can be reduced to 1/10 or less.

Example 2

In this example, the result obtained by performing a −BT test on the transistor formed in Embodiment 1 will be described.

One of methods for examining reliability of transistors is a bias-temperature stress test (hereinafter, referred to as a BT test). The BT test is one kind of accelerated test and can evaluate change in characteristics, caused by long-term usage, of transistors in a short time. In particular, the amount of shift in threshold voltage of the transistor between before and after the BT test is an important indicator for examining reliability. As a difference in the threshold voltage between before and after the BT test is small, the transistor has higher reliability.

Specifically, the temperature of a substrate over which a transistor is formed (substrate temperature) is set at fixed temperature, a source and a drain of the transistor are set at the same potential, and a gate is supplied with potential different from those of the source and the drain for a certain period. The substrate temperature may be set as appropriate in accordance with the purpose of the test. A test in the case where potential applied to the gate is higher than potential of the source and the drain is referred to as a +BT test, and a test in the case where potential applied to the gate is lower than potential of the source and the drain is referred to as a −BT test.

The stress conditions for the BT test can be determined by setting the substrate temperature, electric field intensity applied to a gate insulating film, or a time period of application of electric field. The electric field intensity applied to a gate insulating film can be determined by dividing the potential difference between the gate potential and the source and drain potential by the thickness of the gate insulating film. For example, in the case where the electric field intensity applied to the 100-nm-thick gate insulating film is to be set to 2 MV/cm, the potential difference may be set to 20 V.

Note that "voltage" generally indicates a difference between potential of two points, and "potential" indicates electrostatic energy (electrical potential energy) of a unit charge at a given point in an electrostatic field. Note that in general, a difference between potential of one point and reference potential (e.g., ground potential) is merely called potential or voltage, and potential and voltage are used as synonymous words in many cases. Thus, in this specification, potential may be rephrased as voltage and voltage may be rephrased as potential unless otherwise specified.

A −BT test was performed under such conditions that a substrate temperature was 150° C., an electric field intensity applied to the gate insulating film was 2 MV/cm, and a time period for application was one hour.

First, in order to measure initial characteristics of a transistor subjected to the −BT test, a change in characteristics of the source-drain current (hereinafter, referred to as the drain current or Id) was measured, under the conditions where the substrate temperature was set to 40° C., the voltage between a source and a drain (hereinafter, the drain voltage or Vd) was set to 1 V, and the voltage between a source and a gate (hereinafter, the gate voltage or Vg) was changed in the range of −20 V to +20 V. That is, Vg-Id characteristics when Vd was 1 V were measured. Here, as a countermeasure against moisture-absorption onto surfaces of the samples, the substrate temperature was set to 40° C. However, the measurement may be performed at room temperature (25° C.) or lower if there is no particular problem.

Next, a similar measurement was conducted when Vd was set to 10 V, and Vg-Id characteristics at the time when Vd was 10 V were measured.

Next, the substrate temperature was increased to 150° C., and then, the potential of the source and the drain of the transistor was set to 0 V. Then, voltage was applied to the gate so that the intensity of the electric field applied to the gate insulating film was 2 MV/cm. Since the thickness of the gate insulating film of the transistor was 100 nm, −20 V was applied to the gate and this voltage was kept for one hour. The time period for voltage application was one hour here; however, the time period may be changed as appropriate in accordance with the purpose.

Next, the substrate temperature was decreased to 40° C. while voltage is applied between the gate and the source and the drain. If application of the voltage is stopped before the substrate temperature was completely decreased to 40° C., the transistor which has been damaged during the BT test is repaired by the influence of residual heat. Thus, the substrate temperature must be decreased while the voltage is applied. After the substrate temperature was decreased to 40° C., application of the voltage was terminated. Strictly, the time of decreasing temperature must be added to the time of the voltage application; however, since the temperature was able to be decreased to 40° C. in several minutes actually, this was considered to be an error range and the time of decreasing temperature was not added to the time of application.

Then, the Vg-Id characteristics when Vd was 1 V and 10 V were measured under the same conditions as those for the measurement of the initial characteristics, so that the Vg-Id characteristics after the −BT test is performed were obtained.

Figure 37A:
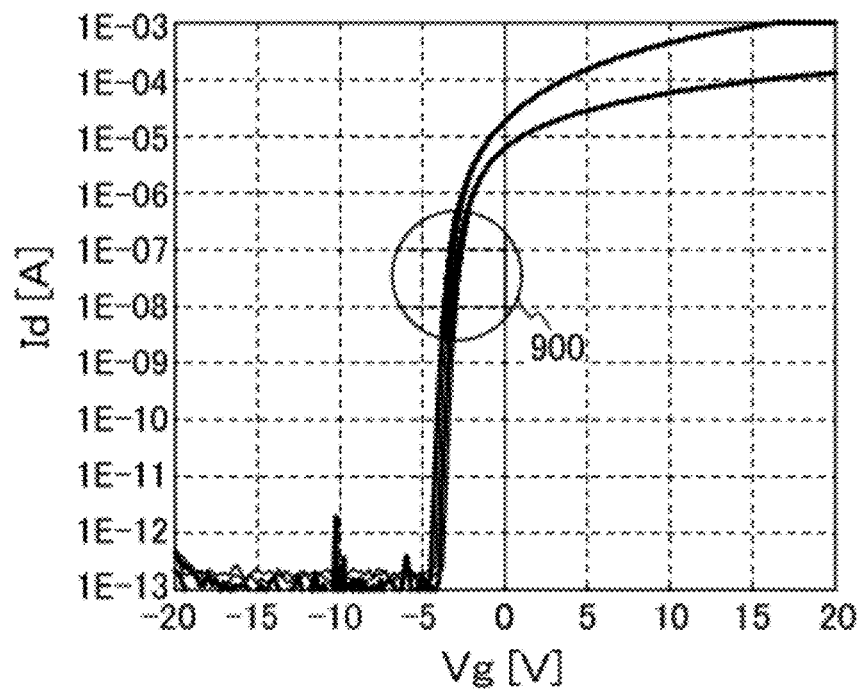
FIGS. 37A and 37B show I-V characteristics of a transistor which has not been subjected to −BT test and has been subjected to −BT test.

FIG. 37A illustrates the Vg-Id characteristics of the transistor which has not been subjected to −BT test and has been subjected to −BT test. In FIG. 37A, the horizontal axis represents the gate voltage (Vg) which is shown with a logarithmic scale, and the vertical axis represents the drain current (Id) which is shown with a logarithmic scale.

Figure 37B:
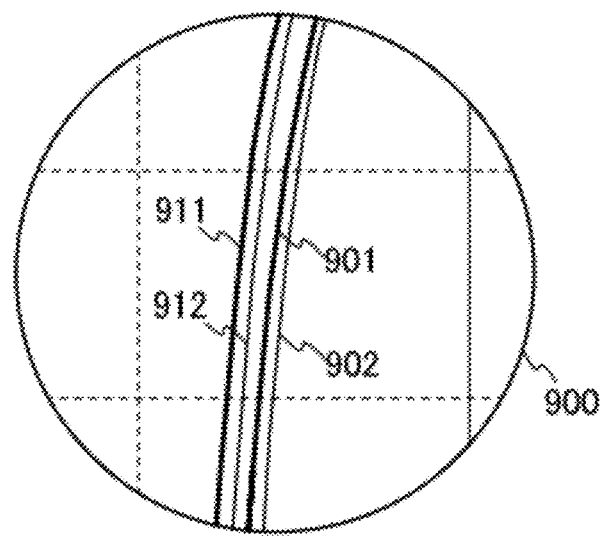

FIG. 37B is an enlarged view of a portion 900 shown in FIG. 37A. Initial characteristics 901 represent the Vg-Id characteristics of the transistor which has not been subjected to the −BT test, in the case where Vd is 1 V, and initial characteristics 911 represent the Vg-Id characteristics of the transistor which has been subjected to the −BT test, in the case where Vd is 10 V. In addition, −BT 902 represents the Vg-Id characteristics of the transistor which has been subjected to the −BT test, in the case where Vd is 1 V, and −BT 912 represents the Vg-Id characteristics of the transistor which has been subjected to the −BT test, in the case where Vd is 10 V.

It is found that, from FIGS. 37A and 37B, compared to the initial characteristics 901 and the initial characteristics 911, the entire −BT 902 and the entire −BT 912 slightly shift to the positive direction. However, it is found that the shift amount is as small as 0.5 V or less and that the transistor formed in Embodiment 1 has high reliability in the −BT test.

This application is based on Japanese Patent Application serial no. 2009-215084 filed with Japan Patent Office on Sep. 16, 2009, the entire contents of which are hereby incorporated by reference.

EXPLANATION OF REFERENCE

11: wiring, 12: wiring, 13: wiring, 14: wiring, 15: wiring, 21: input terminal, 22: input terminal, 23: input terminal, 24: input terminal, 25: input terminal, 26: output terminal, 27: output terminal, 28: transistor, 31: transistor, 32: transistor, 33: transistor, 34: transistor, 35: transistor, 36: transistor, 37: transistor, 38: transistor, 39: transistor, 40: transistor, 41: transistor, 42: transistor, 43: transistor, 51: power supply line, 52: power supply line, 53: power supply line, 61: period, 62: period, 100: substrate, 101: gate electrode layer, 102: gate insulating layer, 103: oxide semiconductor layer, 106: crystal region, 107: oxide insulating layer, 108: capacitor wiring, 110: pixel electrode layer, 112: conductive layer, 113: conductive layer, 114: conductive layer, 120: connection electrode, 121: terminal, 122: terminal, 125: contact hole, 126: contact hole, 127: contact hole, 128: light-transmitting conductive layer, 129: light-transmitting conductive layer, 131: resist mask, 150: terminal, 151: terminal, 152: gate insulating layer, 153: connection electrode, 154: protective insulating film, 155: light-transmitting conductive layer, 156: electrode, 170: transistor, 581: transistor, 585: insulating layer, 587: electrode layer, 588: electrode layer, 589: spherical particle, 594: cavity, 595: filler, 900: portion, 901: initial characteristics, 902: −BT, 911: initial characteristics, 912: −BT, 1000: mobile phone, 1001: housing, 1002: display portion, 1003: operation button, 1004: external connection port, 1005: speaker, 1006: microphone, 105a: source electrode layer, 105b: drain electrode layer, 112a: conductive layer, 113a: conductive layer, 114a: conductive layer, 2600: substrate, 2601: counter substrate, 2602: sealant, 2603: pixel portion, 2604: display element, 2605: coloring layer, 2606: polarizing plate, 2607: polarizing plate, 2608: wiring circuit portion, 2609: flexible wiring board, 2610: cold cathode tube, 2611: reflective plate, 2612: circuit board, 2613: diffusion plate, 2631: poster, 2632: advertisement in vehicle, 2700: e-book reader, 2701: housing, 2703: housing, 2705: display portion, 2707: display portion, 2711: hinge, 2721: power switch, 2723: operation key, 2725: speaker, 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4019: anisotropic conductive film, 4020: insulating layer, 4021: insulating layer, 4030: pixel electrode layer, 4031: counter electrode layer, 4032: insulating layer, 4040: conductive layer, 4044: insulating layer, 4501: substrate, 4502: pixel portion, 4505: sealant, 4506: substrate, 4507: filler, 4509: transistor, 4510: transistor, 4511: light-emitting element, 4512: electroluminescent layer, 4513: electrode layer, 4515: connection terminal electrode, 4516: terminal electrode, 4517: electrode layer, 4519: anisotropic conductive film, 4520: partition, 4540: conductive layer, 4544: insulating layer, 5300: substrate, 5301: pixel portion, 5302: scan line driver circuit, 5303: scan line driver circuit, 5304: signal line driver circuit, 5305: timing control circuit, 5601: shift register, 5602: switching circuit, 5603: transistor, 5604: wiring, 5605: wiring, 590a: black region, 590b: white region, 6400: pixel, 6401: switching transistor, 6402: driver transistor, 6403: capacitor, 6404: light-emitting element, 6405: signal line, 6406: scan line, 6407: power supply line, 6408: common electrode, 7001: transistor, 7002: light-emitting element, 7003: electrode, 7004: EL layer, 7005: electrode, 7009: partition, 7010: substrate, 7011: transistor, 7012: light-emitting element, 7013: electrode, 7014: EL layer, 7015: electrode, 7016: light-blocking film, 7017: light-transmitting conductive layer, 7019: partition, 7020: substrate, 7021: transistor, 7022: light-emitting element, 7023: electrode, 7024: EL layer, 7025: electrode, 7026: electrode, 7027: light-transmitting conductive layer, 7029: partition, 7030: gate insulating layer, 7031: oxide insulating layer, 7032: insulating layer, 7033: color filter layer, 7034: overcoat layer, 7035: protective insulating layer, 7040: gate insulating layer, 7041: oxide insulating layer, 7042: insulating layer, 7043: color filter layer, 7044: overcoat layer, 7045: protective insulating layer, 7051: oxide insulating layer, 7052: protective insulating layer, 7053: planarizing insulating layer, 7055: insulating layer, 9400: communication device, 9401: housing, 9402: operation button, 9403: external input terminal, 9404: microphone, 9405: speaker, 9406: light-emitting portion, 9410: display device, 9411: housing, 9412: display portion, 9413: operation button, 9600: television device, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insert portion, 9887: connection terminal, 9888: sensor, 9889: microphone, 9890: LED lamp, 9891: housing, 9893: joint portion, 9900: slot machine, 9901: housing, 9903: display portion, 4503a: signal line driver circuit, 4503b: signal line driver circuit, 4504a: scan line driver circuit, 4504b: scan line driver circuit, 4518a: FPC, and 4518b: FPC.

What is claimed is:

1. A transistor comprising:
a gate electrode layer;
a gate insulating layer adjacent to the gate electrode layer;
an oxide semiconductor layer adjacent to the gate electrode layer with the gate insulating layer therebetween, the oxide semiconductor layer including a channel region; and
an oxide insulating layer in contact with the oxide semiconductor layer, wherein the oxide semiconductor layer is located between the gate insulating layer and the oxide insulating layer,
wherein the oxide semiconductor layer includes a first metal, a second metal, and a third metal,
wherein the first metal is indium, the second metal is zinc, and the third metal is a different metal from indium and zinc, and
wherein at least part of the channel region includes crystals which are c-axis-oriented in a direction perpendicular to a surface of the oxide semiconductor layer.

2. The transistor according to claim 1, wherein the oxide semiconductor layer is formed over the gate electrode layer.

3. The transistor according to claim 1, wherein the part of the channel region includes a superficial portion of the oxide semiconductor layer.

4. The transistor according to claim 1, wherein a size of the crystals is 20 nm or less in a direction along a short axis direction.

5. The transistor according to claim 1, wherein the crystals are microcrystals.

6. The transistor according to claim 1, wherein the gate insulating layer is a laminate film of silicon nitride and silicon oxynitride.

7. The transistor according to claim 1, wherein the oxide semiconductor layer is a laminate layer.

8. The transistor according to claim 1, further comprising a source electrode and a drain electrode each adjacent to the oxide semiconductor layer,
wherein each of the source electrode and the drain electrode has a three-layer structure in which aluminum is sandwiched by titanium.

9. The transistor according to claim 1, wherein the third metal is gallium.

10. The transistor according to claim 1, wherein the third metal is selected from gallium, aluminum, manganese, cobalt, and tin.

11. A transistor comprising:
a gate electrode layer;
a gate insulating layer over the gate electrode layer;
an oxide semiconductor layer over the gate electrode layer with the gate insulating layer therebetween, the oxide semiconductor layer including a channel region;
a source electrode over the oxide semiconductor layer;
a drain electrode over the oxide semiconductor layer;
an oxide insulating layer in contact with the oxide semiconductor layer, wherein the oxide semiconductor layer is located between the gate insulating layer and the oxide insulating layer, wherein the oxide semiconductor layer includes a first metal, a second metal, and a third metal, wherein the first metal is indium, the second metal is zinc, and the third metal is a different metal from indium and zinc, and wherein at least part of the channel region includes crystals which are c-axis-oriented in a direction perpendicular to a surface of the oxide semiconductor layer.

12. The transistor according to claim 11, wherein the part of the channel region includes a superficial portion of the oxide semiconductor layer.

13. The transistor according to claim 11, wherein a size of the crystals is 20 nm or less in a direction along a short axis direction.

14. The transistor according to claim 11, wherein the crystals are microcrystals.

15. The transistor according to claim 11, wherein the gate insulating layer is a laminate film of silicon nitride and silicon oxynitride.

16. The transistor according to claim 11, wherein the oxide semiconductor layer is a laminate layer.

17. The transistor according to claim 11, wherein each of the source electrode and the drain electrode has a three-layer structure in which aluminum is sandwiched by titanium.

18. The transistor according to claim 11, wherein the third metal is gallium.

19. The transistor according to claim 11, wherein the third metal is selected from gallium, aluminum, manganese, cobalt, and tin.

20. A transistor comprising:
a gate electrode layer;
a gate insulating layer over the gate electrode layer;
an oxide semiconductor layer over the gate electrode layer with the gate insulating layer therebetween, the oxide semiconductor layer including a channel region;
a source electrode over the oxide semiconductor layer;
a drain electrode over the oxide semiconductor layer;
an oxide insulating layer in contact with the oxide semiconductor layer, wherein the oxide semiconductor layer is located between the gate insulating layer and the oxide insulating layer, wherein the oxide semiconductor layer includes a first metal, a second metal, and a third metal, wherein the first metal is indium, the second metal is zinc, and the third metal is a different metal from indium and zinc, and wherein at least part of the channel region includes crystals which are c-axis-oriented in a direction perpendicular to a surface of the oxide semiconductor layer, wherein an entirety of the oxide semiconductor layer overlaps with the gate electrode layer.

21. The transistor according to claim 20, wherein the gate electrode layer extends beyond an outer edge of the oxide semiconductor layer.

22. The transistor according to claim 20, wherein the part of the channel region includes a superficial portion of the oxide semiconductor layer.

23. The transistor according to claim 20, wherein a size of the crystals is 20 nm or less in a direction along a short axis direction.

24. The transistor according to claim 20, wherein the crystals are microcrystals.

25. The transistor according to claim 20, wherein the gate insulating layer is a laminate film of silicon nitride and silicon oxynitride.

26. The transistor according to claim 20, wherein the oxide semiconductor layer is a laminate layer.

27. The transistor according to claim 20, wherein each of the source electrode and the drain electrode has a three-layer structure in which aluminum is sandwiched by titanium.

28. The transistor according to claim 20, wherein the third metal is gallium.

29. The transistor according to claim 20, wherein the third metal is selected from gallium, aluminum, manganese, cobalt, and tin.

* * * * *